(12) United States Patent
Krupyshev et al.

(10) Patent No.: US 12,142,511 B2
(45) Date of Patent: Nov. 12, 2024

(54) SUBSTRATE PROCESSING APPARATUS

(71) Applicant: Brooks Automation, Inc., Chelmsford, MA (US)

(72) Inventors: Alexander Krupyshev, Chelmsford, MA (US); Ulysses Gilchrist, Reading, MA (US); Robert T. Caveney, Windham, NH (US); Daniel Babbs, Austin, TX (US)

(73) Assignee: Brooks Automation US, LLC, Chelmsford, MA (US)

( * ) Notice: Subject to any disclaimer, the term of this patent is extended or adjusted under 35 U.S.C. 154(b) by 987 days.

(21) Appl. No.: 14/377,987

(22) PCT Filed: Feb. 11, 2013

(86) PCT No.: PCT/US2013/025513
§ 371 (c)(1),
(2) Date: Aug. 11, 2014

(87) PCT Pub. No.: WO2013/120054
PCT Pub. Date: Aug. 15, 2013

(65) Prior Publication Data
US 2015/0013910 A1   Jan. 15, 2015

Related U.S. Application Data

(60) Provisional application No. 61/597,507, filed on Feb. 10, 2012, provisional application No. 61/660,900, (Continued)

(51) Int. Cl.
*H01L 21/677* (2006.01)
*B25J 9/04* (2006.01)
(Continued)

(52) U.S. Cl.
CPC ........ *H01L 21/68707* (2013.01); *B25J 9/042* (2013.01); *B25J 11/0095* (2013.01);
(Continued)

(58) Field of Classification Search
CPC ........ H01L 21/67167; H01L 21/68707; G05B 2219/40242; Y10S 414/135; Y10S 901/30
See application file for complete search history.

(56) References Cited

U.S. PATENT DOCUMENTS 5,720,590 A * 2/1998 Hofmeister .............. B25J 9/107
414/744.2
5,765,444 A * 6/1998 Bacchi ..................... B25J 9/042
414/744.5
(Continued)

FOREIGN PATENT DOCUMENTS

CN       1332667      1/2002
JP       1994302671   10/1994
(Continued)

OTHER PUBLICATIONS

Asano, JP 2008-135630 (Machine Translation).*
International Search Report, International Application No. PCT/US2013/025513, dated Apr. 16, 2013.

Primary Examiner — Karla A Moore
Assistant Examiner — Nathan K Ford
(74) Attorney, Agent, or Firm — Perman & Green, LLP

(57) ABSTRACT

A transfer apparatus for transporting substrates in a transfer chamber having a first and second ends and two sides extending between the ends. The transfer apparatus includes a drive section, at least one base arm fixed at one end with respect to the transfer chamber and including at least one arm link rotatably coupled to the drive section and at least one transfer arm rotatably coupled to a common end of the base arm, the at least one transfer arm has two end effectors. The drive section has motors with three independent axes of
(Continued)

rotation defining three degrees of freedom. One degree of freedom moves the at least one base arm horizontally for transporting the at least one transfer arm and two degrees of freedom drives the at least one transfer arm to extend and retract the at least one transfer arm and swap the two end effectors.

34 Claims, 49 Drawing Sheets

Related U.S. Application Data filed on Jun. 18, 2012, provisional application No. 61/662,690, filed on Jun. 21, 2012.

(51) Int. Cl.
- B25J 11/00 (2006.01)
- B25J 18/00 (2006.01)
- H01L 21/67 (2006.01)
- H01L 21/687 (2006.01)

(52) U.S. Cl.
CPC ........ B25J 18/00 (2013.01); H01L 21/67161 (2013.01); H01L 21/67184 (2013.01); H01L 21/67196 (2013.01); H01L 21/67742 (2013.01)

(56) References Cited

U.S. PATENT DOCUMENTS

| | | | |
|---|---|---|---|
| 5,789,890 A | 8/1998 | Genov et al. | |
| 6,234,738 B1 | 5/2001 | Kimata et al. | |
| 6,275,748 B1 | 8/2001 | Bacchi et al. | |
| 6,297,611 B1 | 10/2001 | Todorov et al. | |
| 6,440,261 B1 | 8/2002 | Tepman et al. | |
| 6,485,250 B2 | 11/2002 | Hofmeister | |
| 6,634,851 B1* | 10/2003 | Bonora | B25J 9/042 414/744.3 |
| 6,737,826 B2 | 5/2004 | Gilchrist | |
| 7,891,935 B2 | 2/2011 | Kremerman | |
| 8,371,795 B2 | 2/2013 | Kitahara et al. | |
| 8,380,337 B2 | 2/2013 | Hiroki | |
| 2001/0036398 A1* | 11/2001 | Hofmeister | B25J 9/06 414/744.1 |
| 2002/0066330 A1 | 6/2002 | Namba et al. | |
| 2003/0011338 A1* | 1/2003 | Gilchrist | B25J 9/042 318/568.21 |
| 2003/0073323 A1 | 4/2003 | Kim et al. | |
| 2003/0085681 A1 | 5/2003 | Sakamoto et al. | |
| 2003/0223853 A1* | 12/2003 | Caveney | B25J 9/042 414/744.5 |
| 2004/0261710 A1 | 12/2004 | Matsushita et al. | |
| 2005/0194549 A1 | 9/2005 | Ota et al. | |
| 2005/0220576 A1* | 10/2005 | Kim | H01L 21/68707 414/217 |
| 2006/0099063 A1 | 5/2006 | Pietrantonio et al. | |
| 2008/0008569 A1 | 1/2008 | Seol | |
| 2008/0041183 A1 | 2/2008 | Todorov | |
| 2009/0129897 A1 | 5/2009 | Babbs et al. | |
| 2009/0259335 A1 | 10/2009 | Ikeda et al. | |
| 2009/0269171 A1 | 10/2009 | Iijima et al. | |
| 2010/0178147 A1 | 7/2010 | Kremerman et al. | |
| 2011/0135437 A1* | 6/2011 | Takeshita | B25J 9/042 414/744.5 |
| 2012/0213615 A1 | 8/2012 | Sakaue | |
| 2013/0036851 A1 | 2/2013 | Kitahara et al. | |
| 2013/0039726 A1* | 2/2013 | Brodine | H01L 21/67742 414/226.05 |
| 2013/0071218 A1 | 3/2013 | Hosek et al. | |

FOREIGN PATENT DOCUMENTS

| | | |
|---|---|---|
| JP | 1998027837 | 1/1998 |
| JP | 11330199 | 11/1999 |
| JP | 1999300663 | 11/1999 |
| JP | 2000072248 | 3/2000 |
| JP | 2000308984 | 11/2000 |
| JP | 2001135705 | 5/2001 |
| JP | 2002158272 | 5/2002 |
| JP | 2004502558 | 1/2004 |
| JP | 2004207750 | 7/2004 |
| JP | 3755744 | 3/2006 |
| JP | 2006205264 | 8/2006 |
| JP | 2007149973 | 6/2007 |
| JP | 2008016815 | 1/2008 |
| JP | 2008502498 | 1/2008 |
| JP | 2008034858 | 2/2008 |
| JP | 2008135630 | 6/2008 |
| JP | 2011020188 | 2/2011 |
| JP | 2011077399 | 4/2011 |
| JP | 2011119556 | 6/2011 |
| JP | 2011230256 | 11/2011 |
| KR | 20070021310 | 2/2007 |
| KR | 1020090047116 | 5/2009 |
| KR | 1020100089107 | 8/2010 |
| TW | 200702264 | 1/2007 |
| TW | 200805550 | 1/2008 |
| WO | 0204176 | 1/2002 |
| WO | 2008065747 | 6/2008 |
| WO | 2010080983 | 7/2010 |

\* cited by examiner

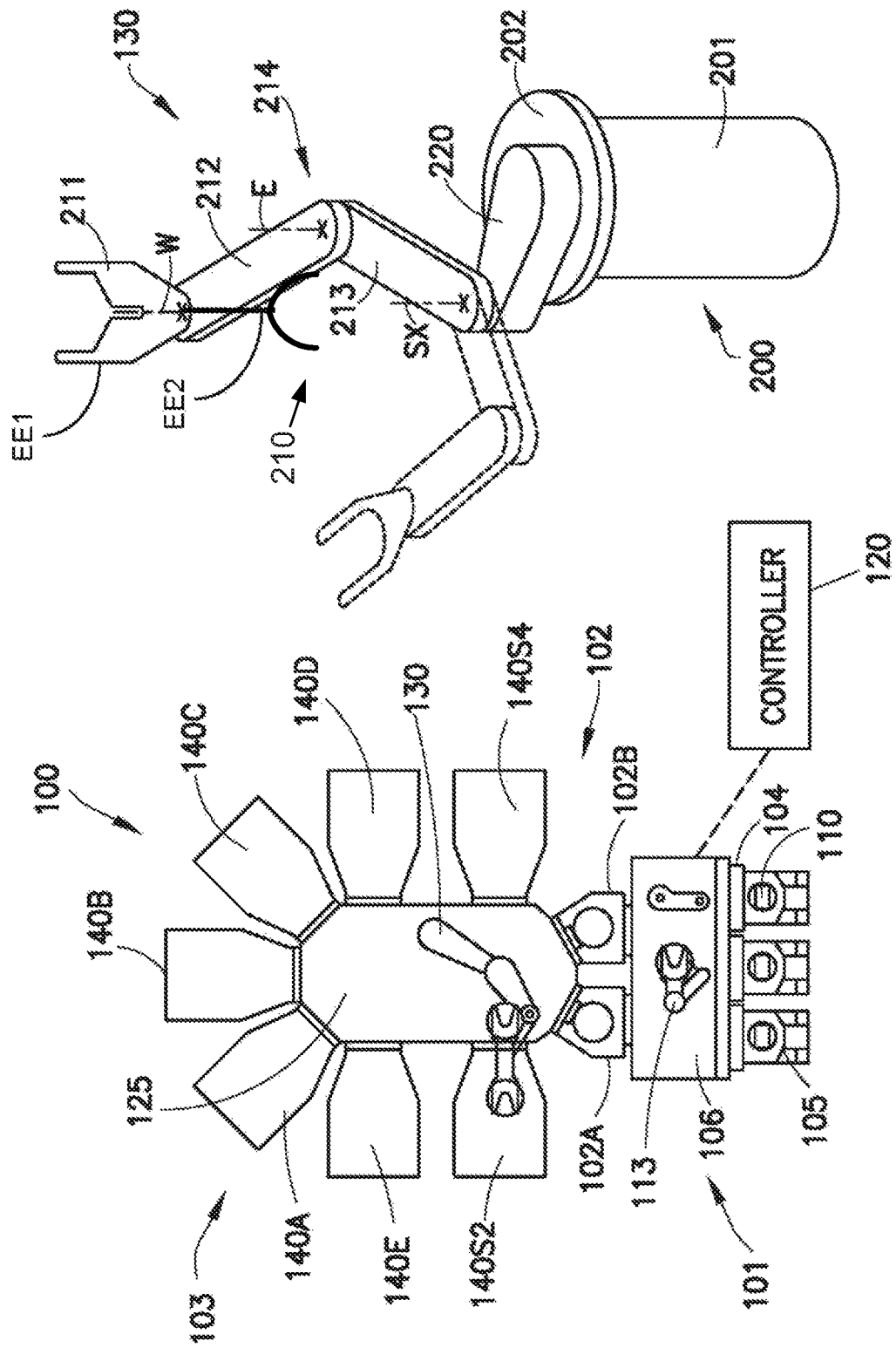

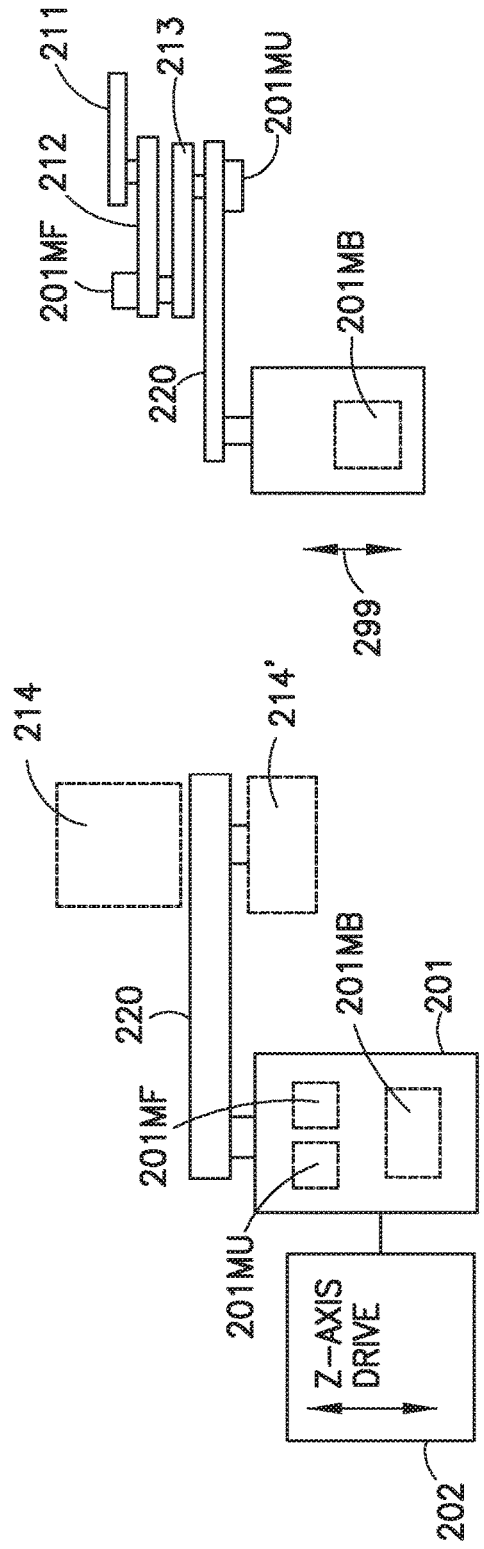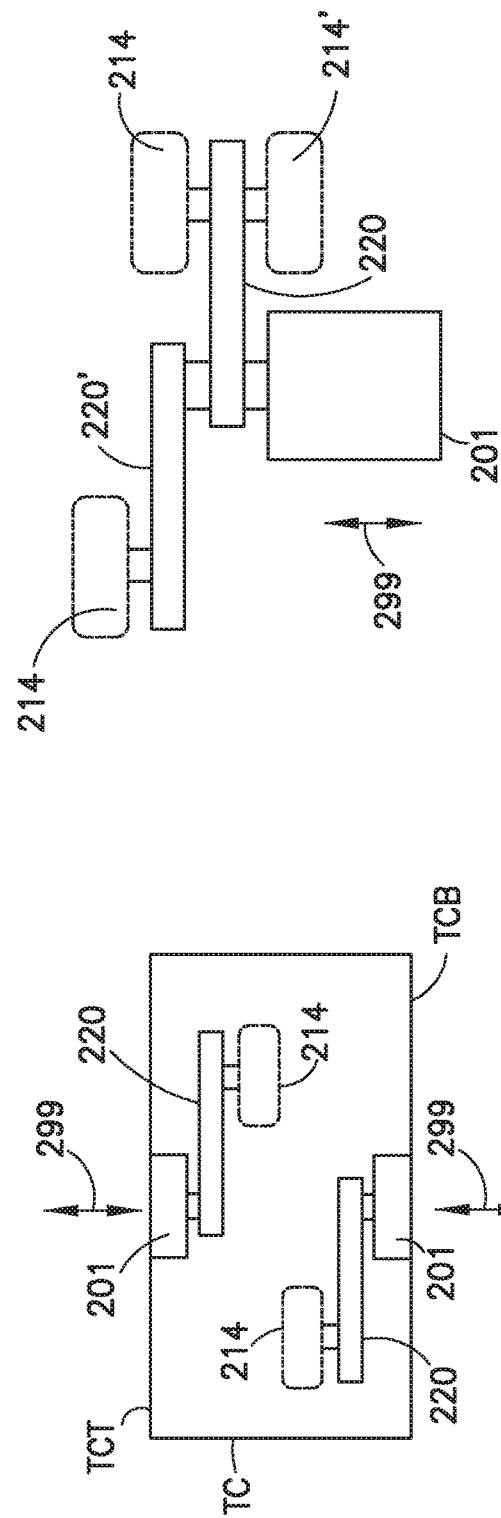

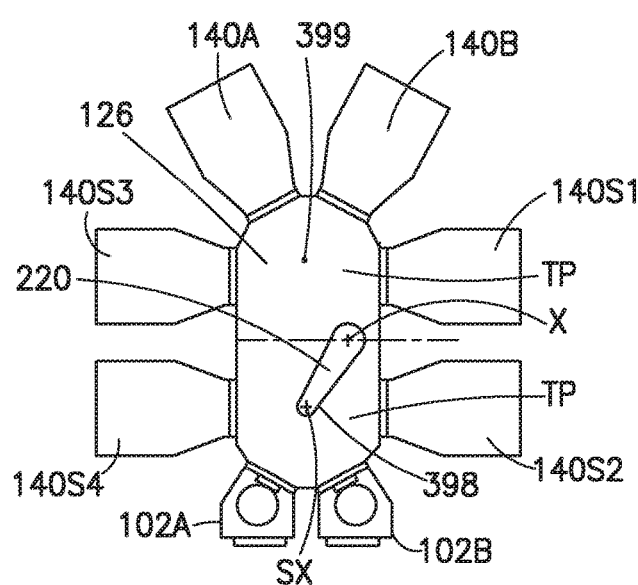 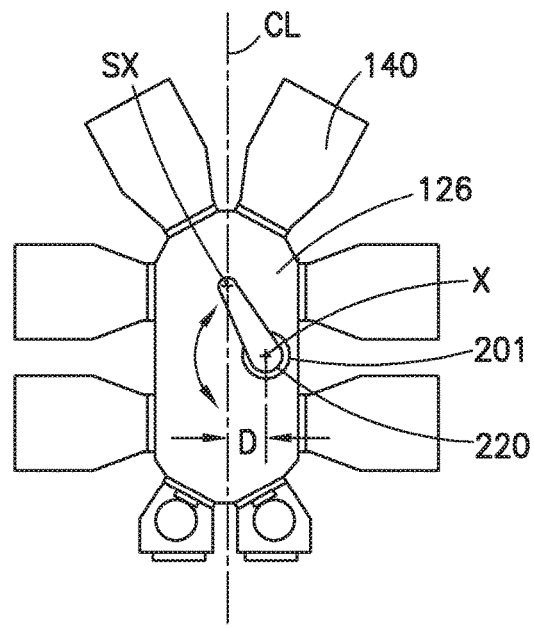
FIG.3A  FIG.3B
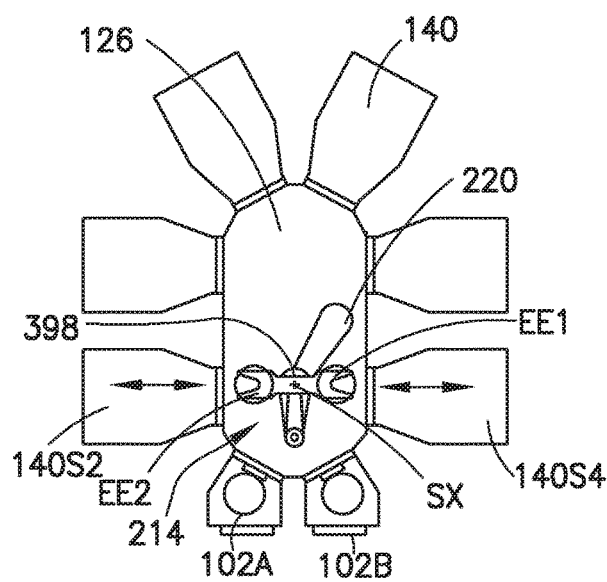 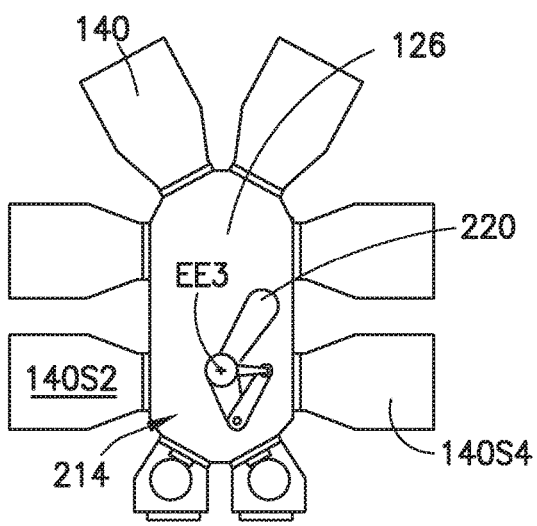
FIG.4A  FIG.4B

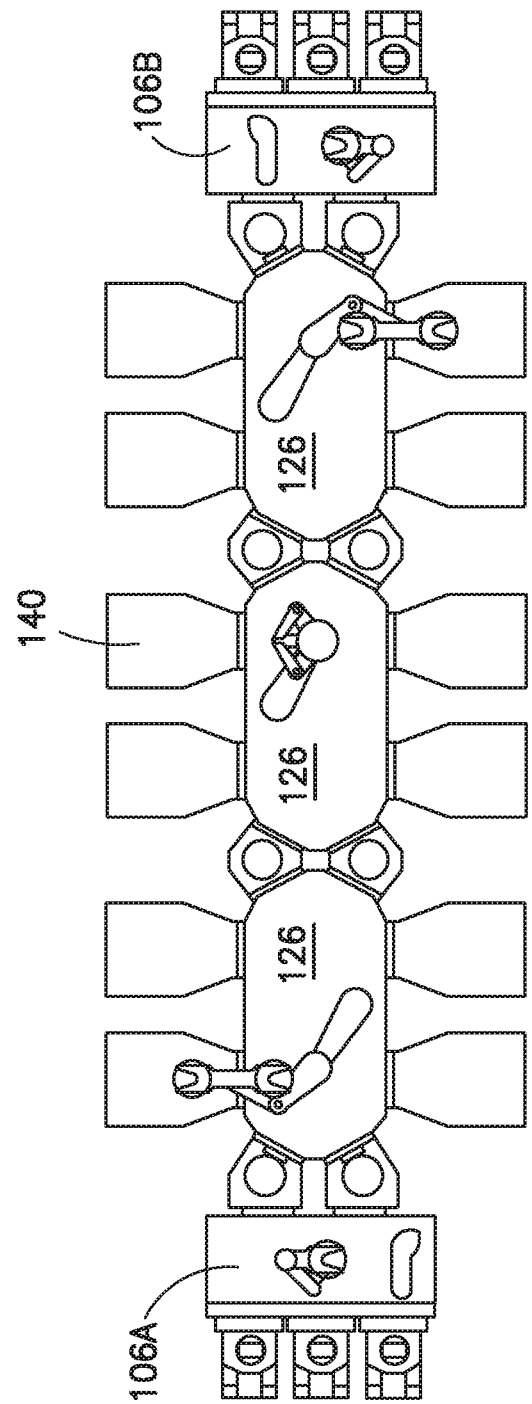

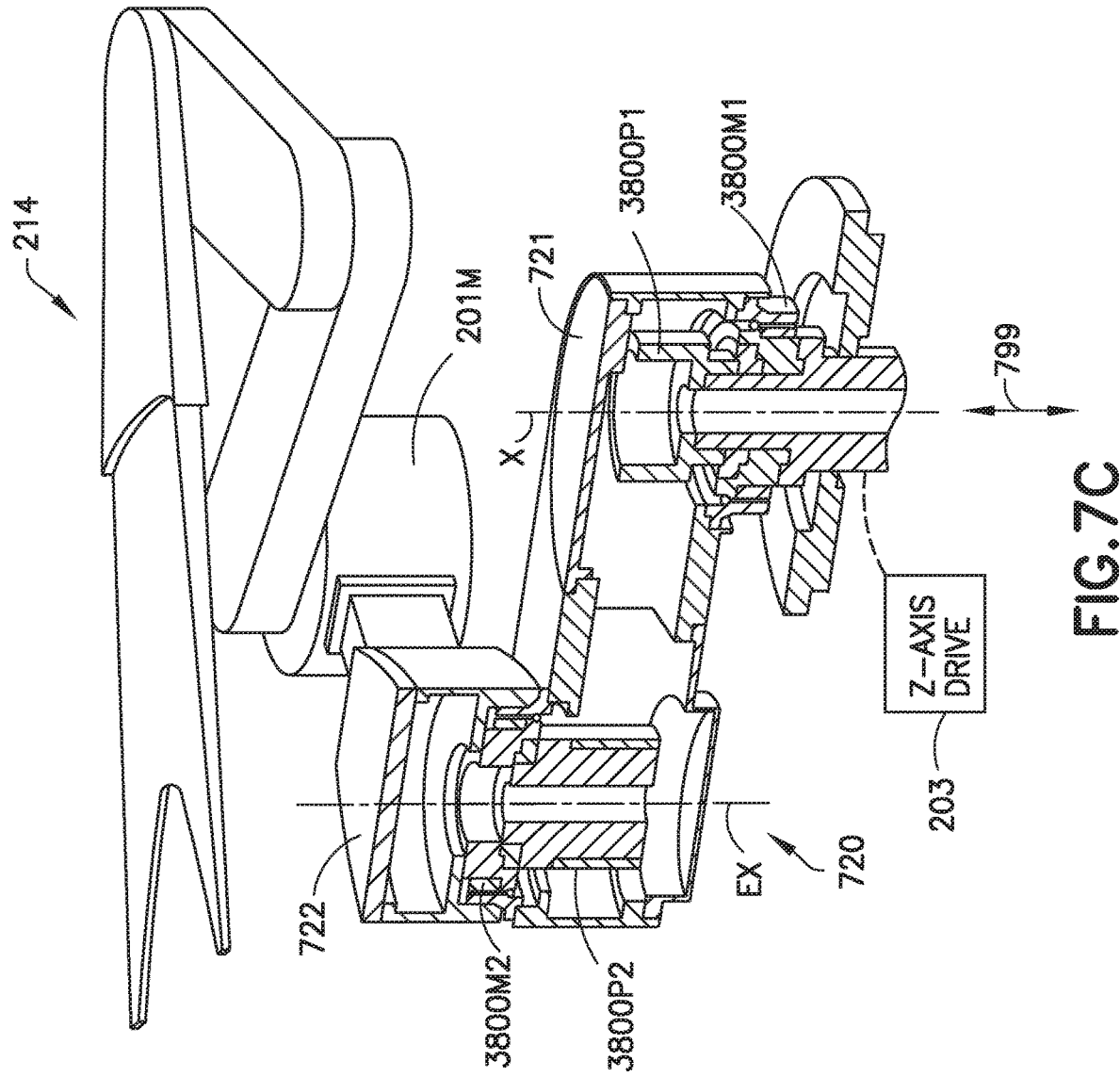

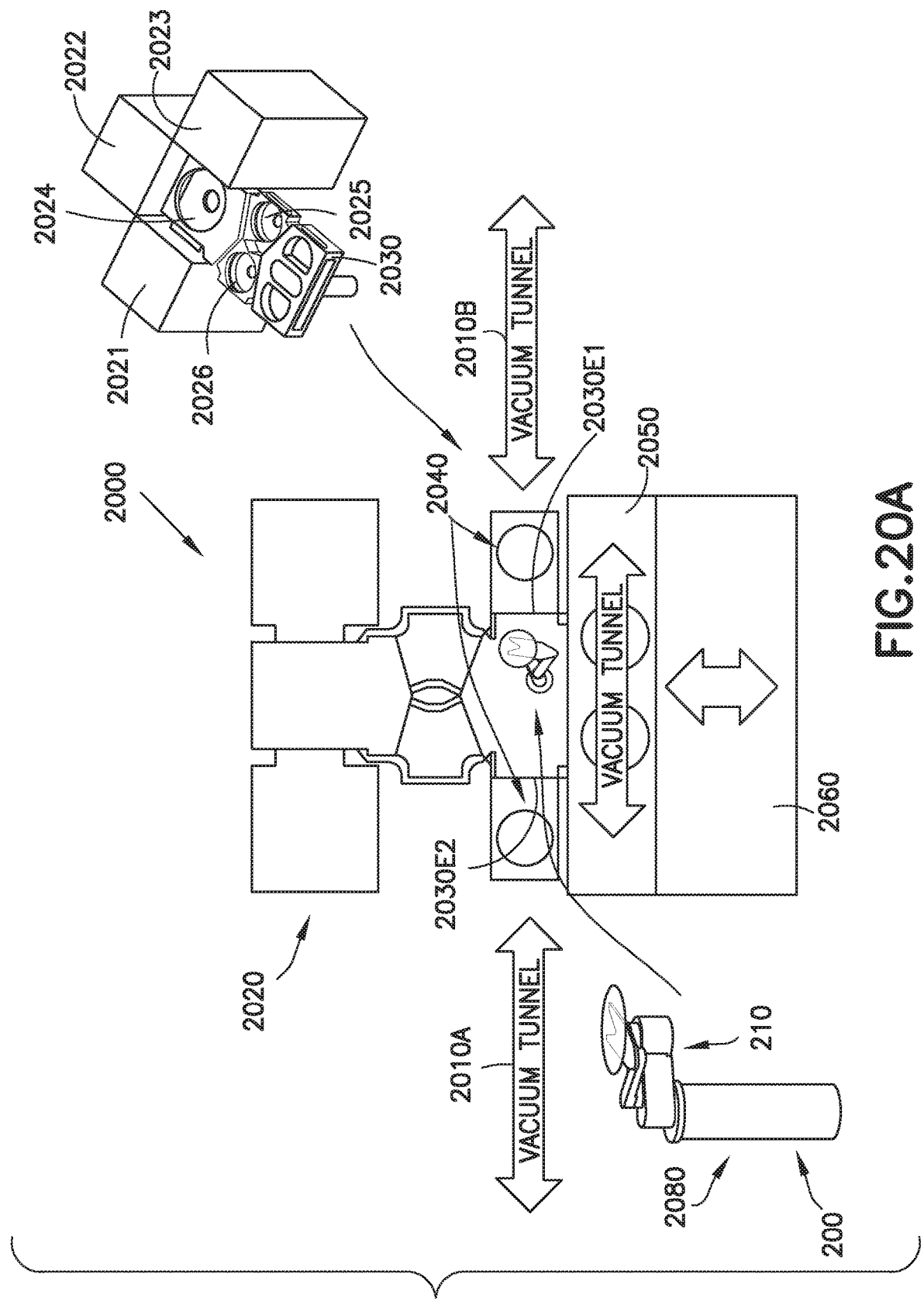

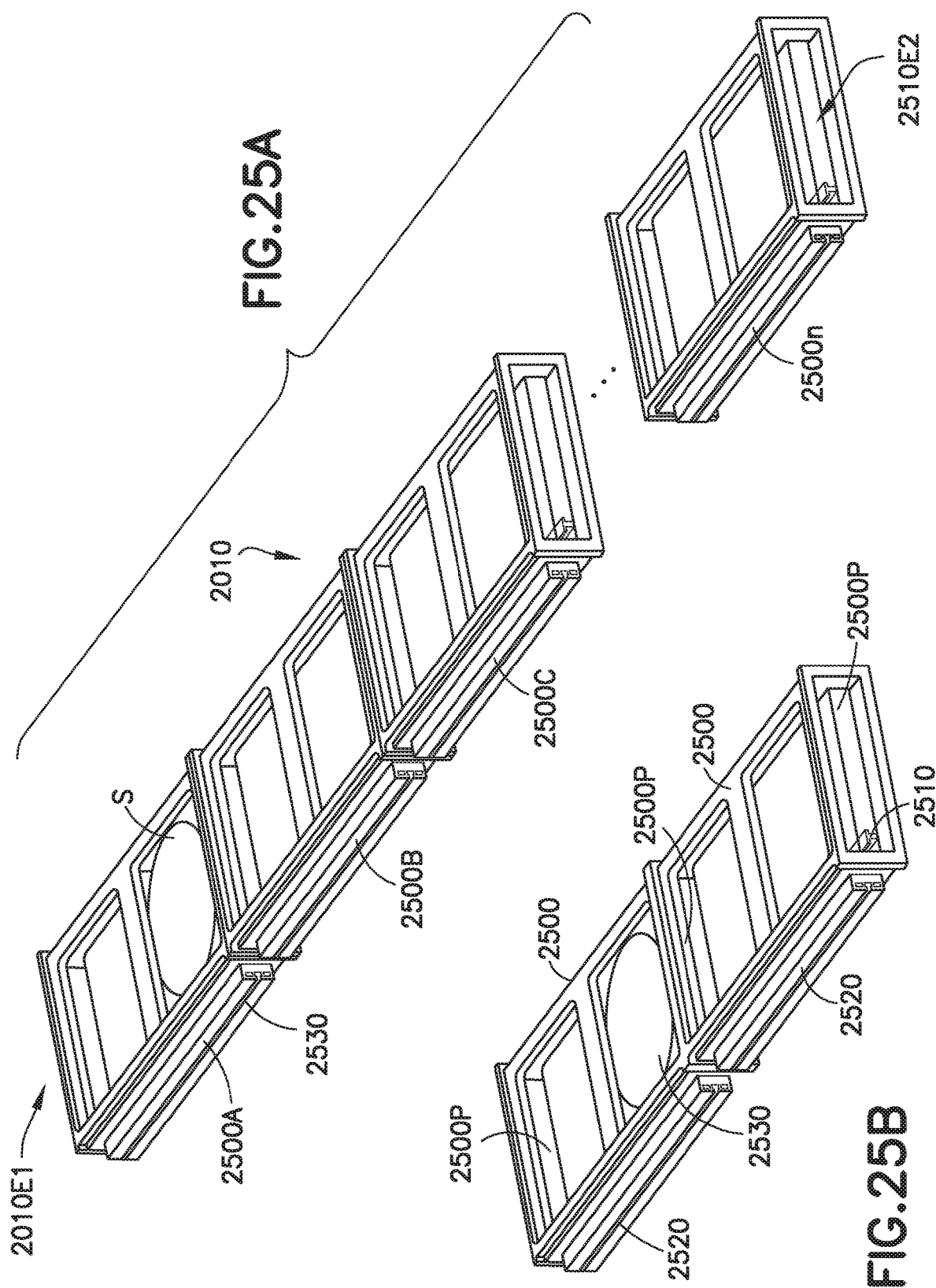

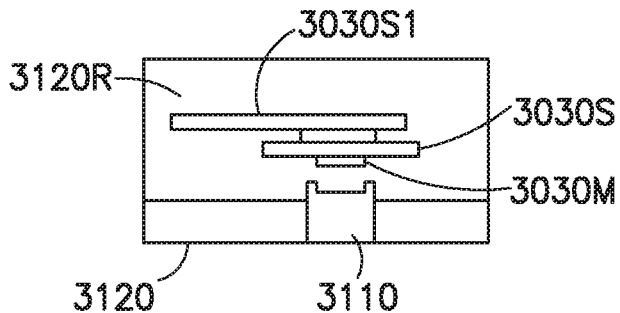
FIG.31B
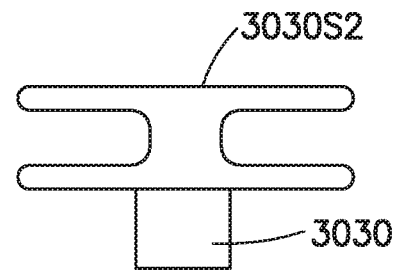
FIF.31C
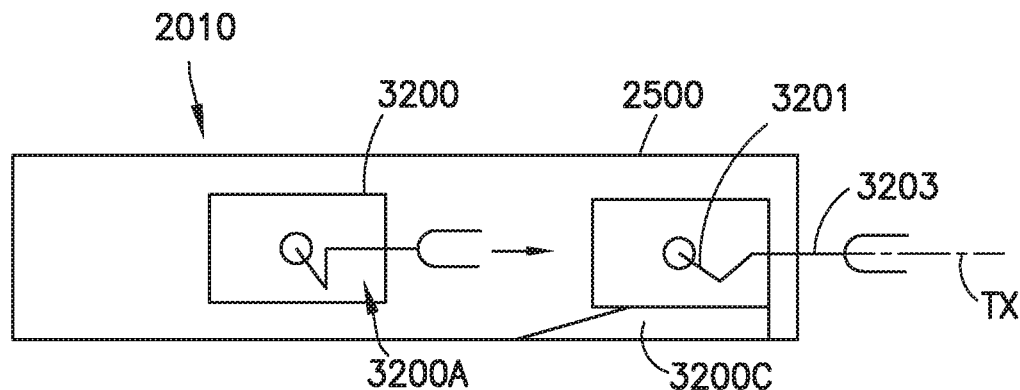
FIG.32
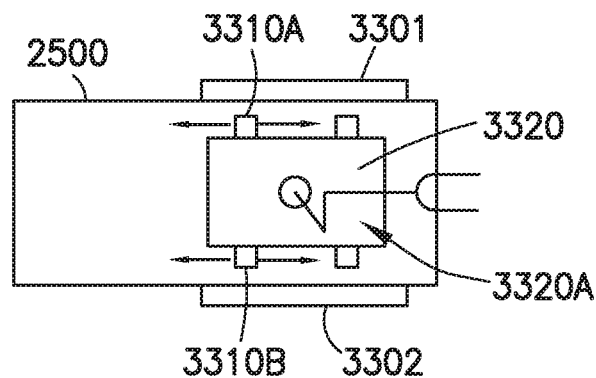
FIG.33

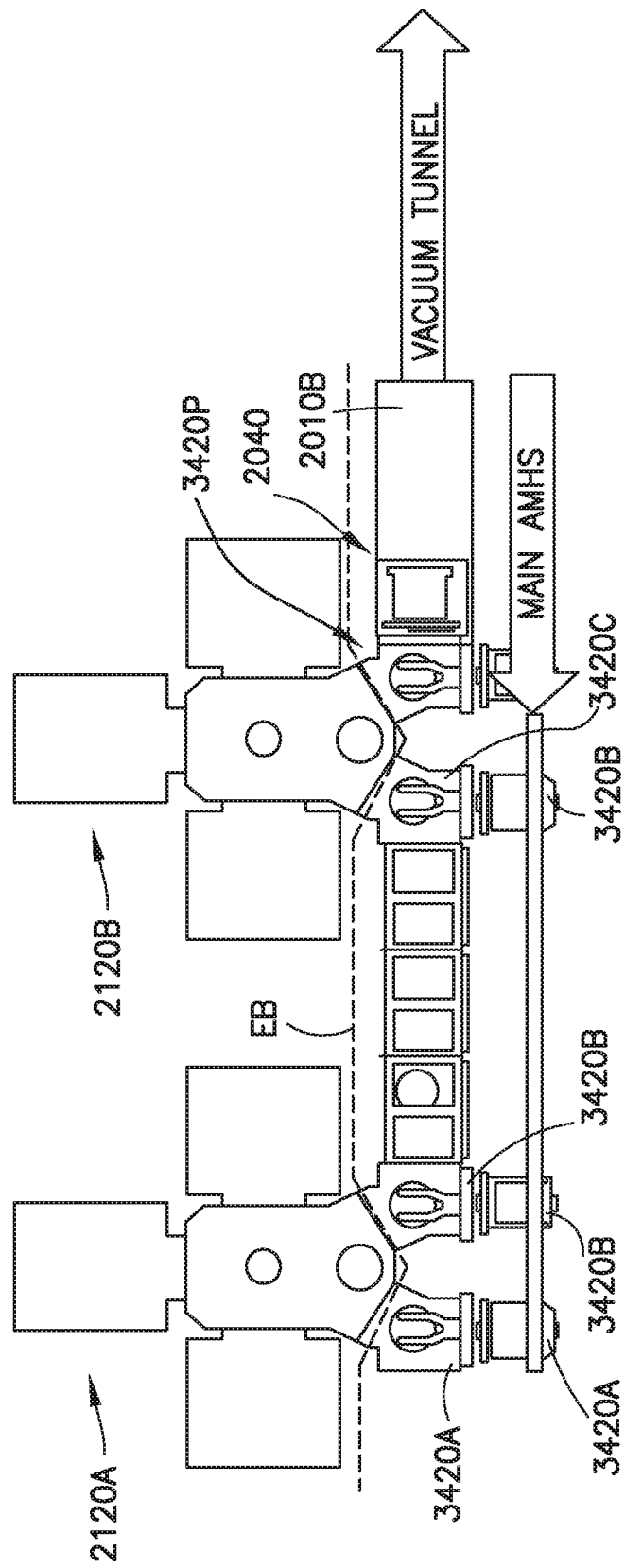

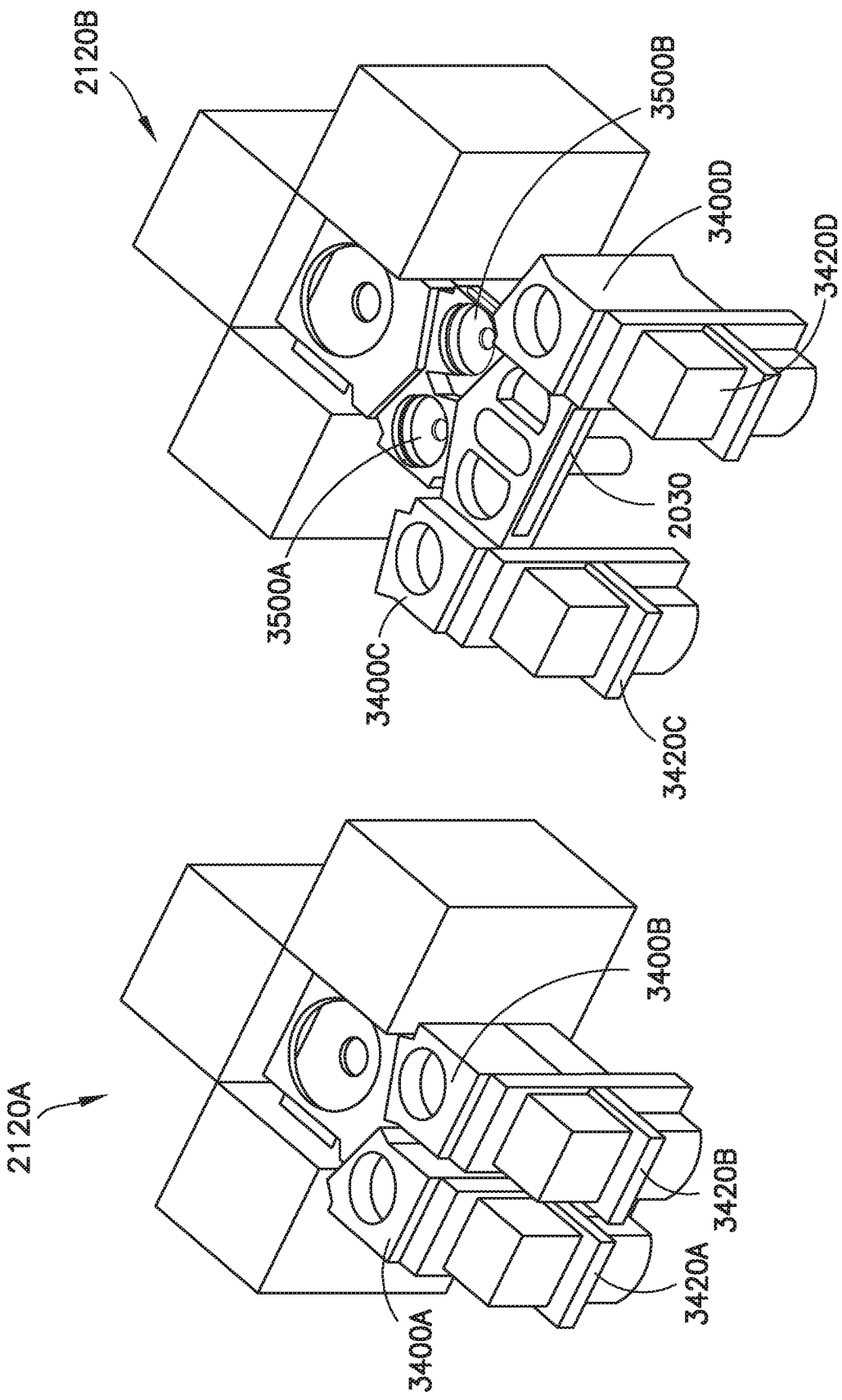

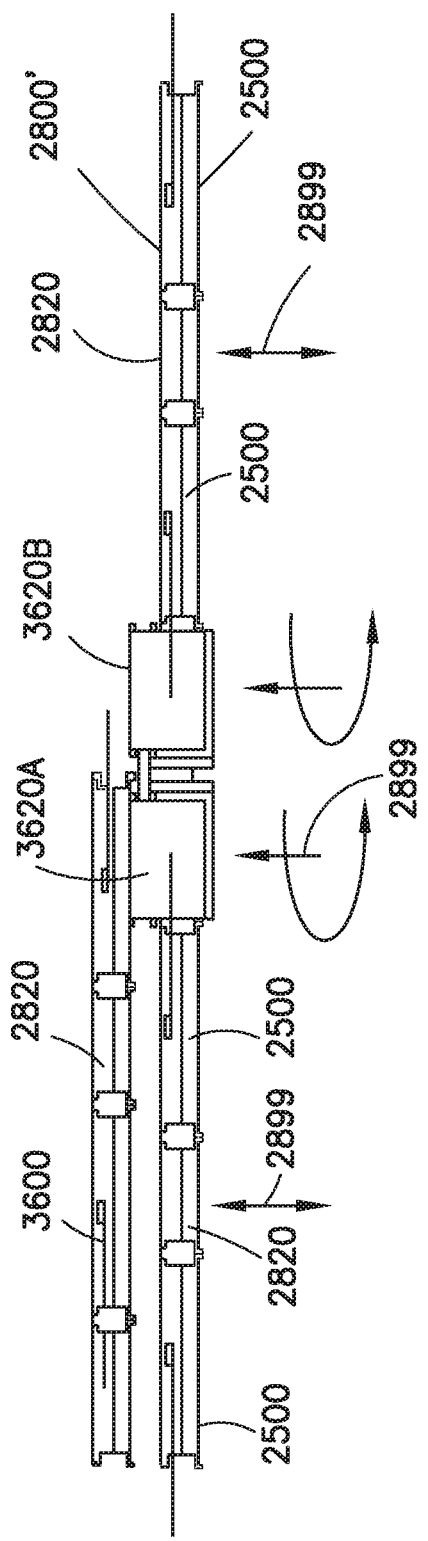

SUBSTRATE PROCESSING APPARATUS

CROSS-REFERENCE TO RELATED APPLICATIONS

This application is the National Stage of International Application No. PCT/US2013/025513 having an International Filing Date of 11 Feb. 2013, which designated the United States of America, and which International Application was published under PCT Article 21 (s) as WO Publication 2013/120054 A1 and which claims priority from, and the benefit of United States provisional patent application Nos. 61/597,507 filed on Feb. 10, 2012; 61/660,900 filed on Jun. 18, 2012; and 61/662,690 filed on Jun. 21, 2012, the disclosures of which are incorporated by reference herein in their entireties.

BACKGROUND

1. Field

The exemplary embodiments generally relate to robotic transport apparatus and, more particularly, to robotic transport apparatus for transporting substrates to multiple substrate holding locations.

2. Brief Description of Related Developments

Generally in robotic transport systems that transport substrates to multiple substrate holding locations arranged side by side such as, for example, in a linearly elongated transfer chamber more than one transfer robot is used such that the substrate is handed off from one robot to another along the length of the linearly elongated transfer chamber. In another aspect a single robotic transport that is mounted to a linear slide is used to transport substrates through the linearly elongated transfer chamber.

It would be advantageous to be able to transport substrates between multiple linearly arranged and/or side by side substrate holding locations without handing off substrates between transfer robots and without the use of a linear slide reducing the interfaces to the sealed environment within the transfer chamber.

Further, generally with cluster type tool arrangements the substrate holding locations are communicably coupled to a common main transfer chamber.

It would also be advantageous to be able to seal portions of the transfer chamber for the cluster tool from other portions of the transfer chamber. The advantages thereof are of special significance in view of tool architecture for processing 450 mm semiconductor wafers and the dimensional increases associated therewith throughout the tool configuration.

In addition, generally original equipment manufacturers/process suppliers link vacuum cluster tools with atmospheric equipment front end module (EFEM) loaders to provide a way to maintain a clean environment for transporting the wafers from mobile storage carriers to the process modules. During each wafer's cycle into the process chamber it transfers from atmosphere to vacuum and then back to atmosphere. In some cases, after processed wafers are exposed to atmosphere, they react with humid air and may become acidic and promote damage to wafers and handling equipment.

It would further be advantageous to connect existing process modules and/or cluster tools to maintain a controlled environment during substrate transport between adjacent tools. It would also be advantageous to remotely locate the EFEM from the processing chambers/cluster tools.

BRIEF DESCRIPTION OF THE DRAWINGS

The foregoing aspects and other features of the disclosed embodiments are explained in the following description, taken in connection with the accompanying drawings, wherein:

FIG. 1 is a schematic illustration of a processing apparatus in accordance with an aspect of the disclosed embodiment;

FIG. 2A is a schematic illustration of a transport apparatus in accordance with an aspect of the disclosed embodiment;

FIGS. 2B-2D are schematic illustrations of portions of the transport apparatus of FIG. 2A in accordance with an aspect of the disclosed embodiment;

FIGS. 2E and 2F are schematic illustrations of transport apparatus in accordance with an aspect of the disclosed embodiment;

FIG. 2G is a schematic illustration of a portion of a processing apparatus in accordance with an aspect of the disclosed embodiment;

FIGS. 3A and 3B are schematic illustrations of a portion of a processing apparatus in accordance with an aspect of the disclosed embodiment;

FIGS. 4A and 4B are schematic illustrations of a portion of a processing apparatus in accordance with an aspect of the disclosed embodiment;

FIGS. 5A, 5B, 5C and 5D are schematic illustrations of different processing apparatus configurations in accordance with aspects of the disclosed embodiment;

FIGS. 7C-7E are schematic illustrations of a portion of a transport apparatus in accordance with an aspect of the disclosed embodiment;

FIGS. 20A, 20B, 20C, 20D and 20E are schematic illustrations of portions of a processing apparatus in accordance with aspects of the disclosed embodiment;

FIGS. 25A and 25B are schematic illustrations of a transport tunnel in accordance with aspects of the disclosed embodiment;

FIGS. 31A, 31B and 31C are schematic illustrations of portions of a processing apparatus in accordance with aspects of the disclosed embodiment;

FIG. 32 is a schematic illustration of a portion of a processing apparatus in accordance with aspects of the disclosed embodiment;

FIG. 33 is a schematic illustration of a portion of a processing apparatus in accordance with aspects of the disclosed embodiment;

FIGS. 34A and 34B are schematic illustrations of a portion of a processing apparatus in accordance with aspects of the disclosed embodiment;

FIGS. 35A, 35B and 35C are schematic illustrations of a portion of a processing apparatus in accordance with aspects of the disclosed embodiment;

FIGS. 36A, 36B, 36C and 36D are schematic illustrations of a portion of a processing apparatus in accordance with aspects of the disclosed embodiment.

DETAILED DESCRIPTION

Figure 2B:
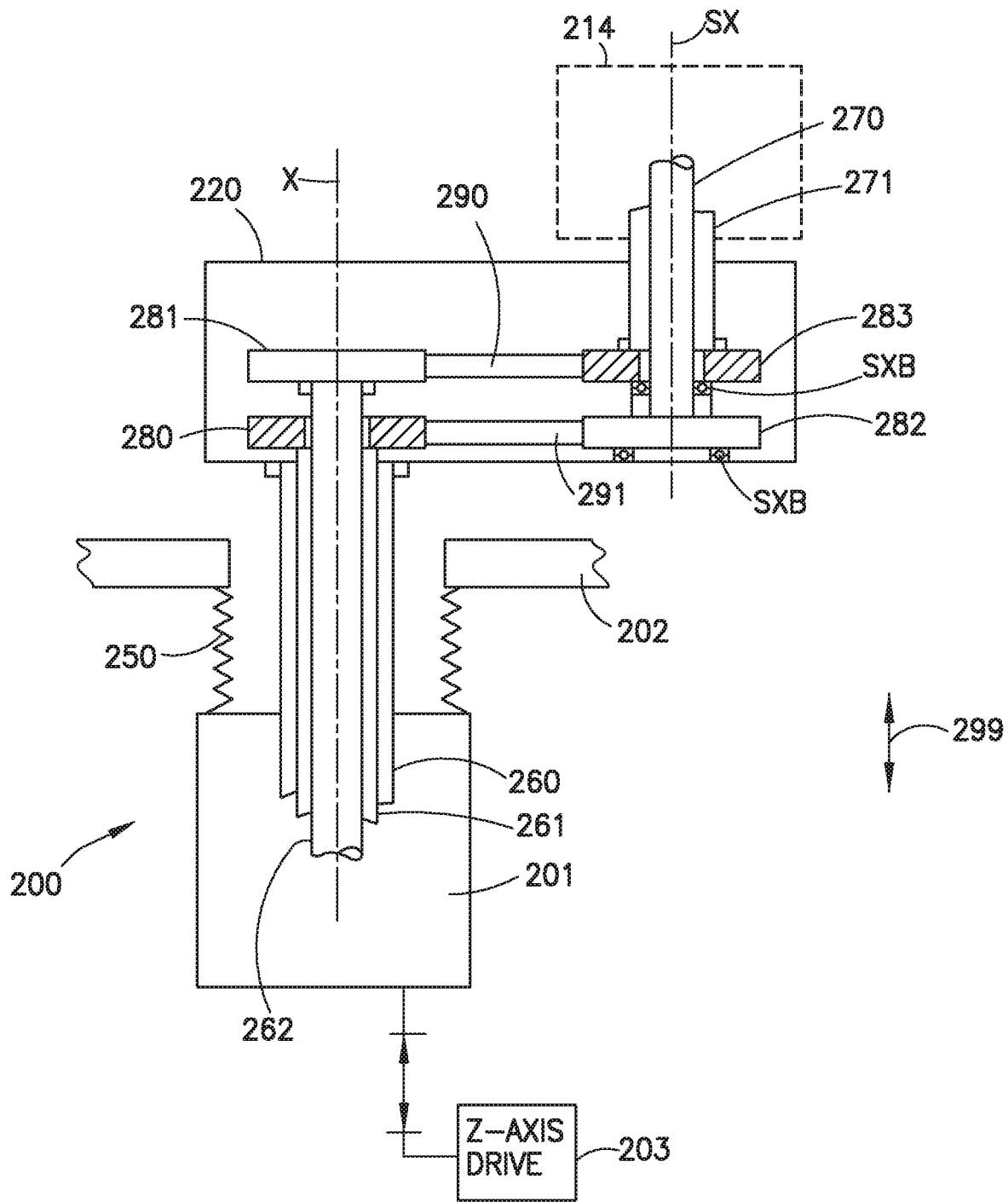

The processing apparatus described herein in accordance with the aspects of the disclosed embodiment include one or more transfer robots that allow the transport of substrates to at least two processing stations in a sequential linear arrangement using a stationary drive section. The aspects of the disclosed embodiment allow for a linear robot architecture without using linear bearings or linear motors while allowing the use of a static vacuum seal (when the robot is used in a vacuum environment) for the rotary axes which are all maintained in a common base or drive section of the transfer robot. The aspects of the disclosed embodiment also allow for the transfer of substrates between rectilinearly arranged or clustered processing stations and load locks (generally referred to herein as substrate holding stations) using one or more transfer robots having a stationary base. Although the aspects of the disclosed embodiment will be described with reference to the drawings, it should be understood that the aspects of the disclosed embodiment can be embodied in many alternate forms. In addition, any suitable size, shape or type of elements or materials could be used.

Referring to FIG. 1, the processing apparatus, such as for example a semiconductor tool station 100 is shown in accordance with an aspect of the disclosed embodiment. Although a semiconductor tool is shown in the drawings, the aspects of the disclosed embodiment described herein can be applied to any tool station or application employing robotic manipulators. In this aspect the tool 100 is shown as what may be referred to for purposes of description as a cluster type tool having a linearly elongated transfer chamber (illustrated as an elongated dual cluster transfer chamber), however the aspects of the disclosed embodiments may be applied to any suitable tool station such as, for example, a linear tool station such as those described U.S. patent application Ser. No. 11/442,511, entitled "Linearly Distributed Semiconductor Workpiece Processing Tool," filed May 26, 2006, the disclosure of which is incorporated by reference herein in its entirety. The tool station 100 generally includes an atmospheric front end 101, one or more vacuum load locks 102 and a vacuum back end 103. In other aspects, the tool station 100 may have any suitable configuration. The components of each of the front end 101, load lock(s) 102 and back end 103 may be connected to a controller 120 which may be part of any suitable control architecture such as, for example, a clustered architecture control. The control system may be a closed loop controller having a master controller, cluster controllers and autonomous remote controllers such as those disclosed in U.S. patent application Ser. No. 11/178,615, entitled "Scalable Motion Control System," filed Jul. 11, 2005, the disclosure of which is incorporated by reference herein in its entirety. In other aspects, any suitable controller and/or control system may be utilized.

In the aspects of the disclosed embodiment, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm, 300 mm or 450 mm wafer interfaces or any other suitable substrate interfaces such as, for example, larger or smaller wafers or flat panels for flat panel displays, light emitting diodes, organic light emitting diodes or solar arrays. Accordingly, the other components and associated features, as will be described in greater detail below, may be respectively configured for interfacing or operating on or with the corresponding wafers or workpieces. Although three load port modules are shown in FIG. 1, in other aspects any suitable number of load port modules may be incorporated into the front end 101. The load port modules 105 may be configured to receive substrate carriers or cassettes 110 from an overhead transport system, automatic guided vehicles, person guided vehicles, rail guided vehicles or from any other suitable transport method. The load port modules 105 may interface with the mini-environment 106 through load ports 104. The load ports 104 may allow the passage of substrates between the substrate cassettes 110 and the mini-environment 106.

The mini-environment 106 generally includes any suitable transfer robot 113. In one aspect of the disclosed embodiment the robot 113 may be a track mounted robot such as that described in, for example, U.S. Pat. No. 6,002,840, the disclosure of which is incorporated by reference herein in its entirety. In other aspects the transfer robot may be substantially similar to the transfer robot 130 within the vacuum back end 103 which will be described in greater detail below. The mini-environment 106 may provide, for example, a controlled, clean zone for substrate transfer between multiple load port modules.

The vacuum load lock 102 may be located between and connected to the mini-environment 106 and the back end 103. The load lock 102 generally includes atmospheric and vacuum slot valves. The slot valves may provide the environmental isolation employed to evacuate the load lock after loading a substrate from the atmospheric front end and to maintain the vacuum in the transfer chamber when venting the lock with an inert gas such as nitrogen. The load lock 102 may also include an aligner for aligning a fiducial of the substrate to a desired position for processing and/or any other suitable substrate processing features such as heating, cooling, etc. In other aspects, the vacuum load lock may be located in any suitable location of the processing apparatus and have any suitable configuration. It is noted that the load lock(s) may be stacked above one another in a substantially vertical row or arranged in a two dimensional array as will be described in greater detail below with respect to FIGS. 11A-11C so that the number of load locks can be increased substantially without increasing a footprint of the tool 100.

The vacuum back end 103 generally includes a transfer chamber 125, one or more processing station(s), generally referred to as processing station(s) 140, and one or more transfer robot(s) 130. It is noted that the processing stations may also be stacked above one another in a substantially vertical row or arranged in a two dimensional array as will be described in greater detail below with respect to FIGS. 11A-11C. The transfer robot 130 will be described below and may be located within the transfer chamber 125 to transport substrates between the load lock 102 and the various processing stations 140. The processing stations 140 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), metal organic chemical vapor deposition (MOCVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 140 are connected to the transfer chamber 125 to allow substrates to be passed from the transfer chamber 125 to the processing stations 140 and vice versa.

Referring now to FIGS. 2A, 2B, 2C and 2D the transfer robot 130 generally includes a drive section 200, a mounting flange 202 configured for mounting the transfer robot 130 in one of the atmospheric front end 101 or vacuum back end 103, and a transfer arm section 210.

The transfer arm section 210 may include a base arm link or boom 220 and a transfer arm 214 mounted to the base arm link 220. The base arm link 220 is shown as a single link with a pivot axis X at a proximal end and a pivot axis SX on a distal end (the terms "proximal" and "distal" are relative terms with respect to the noted reference frame). The base arm link 220 is substantially rigid, without articulating joints, in between the pivot axes and shall be referred to herein as being a monolink for description purposes. It is noted that the other arm "links" described herein are substantially similar to the base arm link 220 in that they too may be considered monolinks. The base arm link 220 may have any suitable length L and configuration. In one aspect a substrate aligner 230 (e.g. for positioning an alignment feature of the substrate in a predetermined position) may be mounted to the base arm link 220 at any suitable location for allowing the transfer arm 214 to transfer substrates to and from the aligner 230.

The transfer arm 214 may be rotatably mounted to the base arm link 220 at a shoulder axis SX. As may be realized, and as shown in FIG. 2D, the transfer arm may be mounted on either horizontal surface of the base arm link 220 (e.g. top and/or bottom where the terms "top" and "bottom" are relative terms that depend on whether the transfer arm is mounted to the top TCT or bottom TCB of the transfer chamber TC, see FIG. 2G). For exemplary purposes only, in FIG. 2D transfer arm 214 is shown mounted to a top of the base arm link 220 while transfer arm 214' is shown mounted to bottom of the base arm link. It is noted that either of transfer arms 214, 214' or both transfer arms 214, 214' may be mounted to the base arm link 220. As may be realized, where two transfer arms are mounted to the same base arm link, the drive section 200 may include a single drive axis for rotating the base arm link 220 and two drive axes for each of the two transfer arms where the transfer arm links of the respective transfer arms are connected to the respective drive axes in a manner substantially similar to that described below (e.g. where a suitable number of drive shafts and transmissions are added to the coaxial drive shaft arrangement to drive the two transfer arms on one base arm link). In other aspects the transfer arms may be driven by any suitable number of drive axes. Multiple transfer robots may also be provided within a single transfer chamber in a manner substantially similar to that described below. As may also be realized, where two or more transfer arms (and/or two or more transfer robots—see FIGS. 2G, 2F, 13, 14 and 15-18) are located in a transfer chamber the controller for the transfer arms/robots, such as controller 120, may be configured to operate the transfer arms/robots so that the operation of one arm/robot does not interfere with the operation of another one of the arms/robots.

The transfer arm 214 may be any suitable transfer arm including, but not limited to, selective compliant articulated robot arms (SCARA arms), frog leg arms, leapfrog arms, bi-symmetric arms, lost motion mechanical switch type arms or any other suitable arm having one or more end effectors where the arm may be driven using a two degree of freedom drive. The end effectors may be configured to hold a single substrate or multiple substrates in a horizontally side-by-side arrangement and/or a vertically stacked arrangement or any combination thereof when multiple transfer arms are provided. Suitable examples of transfer arms that can be used or adapted for use with the aspects of the disclosed embodiment include those described in U.S. patent application Ser. No. 11/179,762 (previously incorporated by reference herein) and Ser. No. 12/117,415 filed on May 8, 2008 as well as U.S. Pat. Nos. 5,899,658; 5,720,590; 5,180,276; 5,743,704; 6,299,404; 5,647,724; 6,485,250; and 7,946,800 the disclosures of which are incorporated by reference herein in their entireties. In other aspects the transfer arm may be driven by a drive having any suitable number of degrees of freedom. It is noted that the transfer arm section will be referred to generally herein as transfer arm section 210 and illustrated in the various figures as having different transfer arm configurations. For example, in FIG. 2A the transfer arm 214 is illustrated as a SCARA type arm having an upper arm link 213, a forearm link 212 rotatably coupled to the upper arm 213 about an elbow axis E and an end effector 211 rotatably coupled to the forearm link 212 about a wrist axis W, but as noted above, the transfer arm may be any suitable type arm having two degrees of freedom and one or more end effectors, e.g. where the rotation of the end effector is slaved to the upper arm link to follow a path of extension and retraction of the arm. In other aspects the transfer arm may have three degrees of freedom where each of the upper arm link, forearm link and end effector are independently rotatable.

In one aspect, the drive section 200 may include, for example, a housing 201 configured to house any suitable tri-axial drive system, or any other suitable drive system, having coaxial drive motors or horizontally offset drive motors that drive a coaxial drive shaft arrangement. In other aspects the drive motors may have any suitable spatial arrangement relative to each other. The drive section may include drive motor 1701MB for rotationally driving the base arm link 220 about axis X, a drive motor 1701MU for rotationally driving the upper arm link 213 about shoulder axis SX and a drive motor 1701MF for rotationally driving the forearm link 212 about the elbow axis E. In other aspects, the drive section 200 may include any suitable number of drive motors and any suitable number of corresponding shafts in the coaxial drive shaft arrangement.

As may be realized, one drive axis may be used to rotate and/or extend the base arm 220 while the other two drive axes may be used to extend, retract and rotate the transfer arm 214 independently of the base arm 220. In other aspects, where the transfer arm has three degrees of freedom the drive section may include four drive motors having any suitable configuration (e.g. one drive axis may be used to rotate and/or extend the base arm 220 while the other three drive axes may be used to extend, retract and rotate the transfer arm 214 independently of the base arm 220). Suitable examples of drive systems that can be used or adapted for use with the aspects of the disclosed embodiment include those described in U.S. patent application Ser. No. 11/179,762 filed on Jul. 11, 2005, Ser. No. 13/270,844 filed on Oct. 11, 2011 and Ser. No. 12/163,996 filed on Jun. 27, 2008, U.S. Pat. Nos. 7,891,935, 6,845,250, 5,899,658, 5,813,823 and 5,720,590 as well as U.S. provisional patent applications 61/391,380 filed on Oct. 8, 2010 and 61/490,864 filed on May 27, 2011, the disclosures of which are incorporated by reference herein in their entireties. In other aspects the drive section may be any suitable drive section having any suitable number of drive axes, such as for example, the drive motors may be integrated into walls of the transfer chamber, one or more drive motors may be located within the arm links and/or mounted to joints of the arm for driving the transfer arm 214 where, for example a harmonic drive (or any other suitable drive) is disposed for driving the base arm link 220, as will be described in greater detail below and in a manner substantially similar to those described in U.S. provisional patent applications 61/507,276 filed on Jul. 13, 2011 and 61/510,819 filed on Jul. 22, 2011, U.S. patent application Ser. No. 13/270,844 filed on Oct. 11, 2011 and U.S. Pat. No. 7,578,649, the disclosures of which are incorporated by reference herein in their entireties. In one aspect the drive section 200 may also include a Z-axis drive 203 for linearly moving the transfer arm section 210 in a direction substantially perpendicular to an axis of extension and retraction of the transfer arm section 210. Where the load locks and processing stations are stacked one above the other, as described herein, the Z-axis drive 203 may be configured to provide sufficient travel to transfer substrates to the different levels of stacked load locks and/or processing stations. A bellows or other suitable flexible sealing member 250 may be disposed between the drive section 200 and the mounting flange 202 to allow for Z-axis movement (see arrow 299) while maintaining the sealed or controlled atmosphere in which the transfer arm section 210 operates (e.g. the sealed environment of the transfer chamber 125 or controlled environment of the EFEM 106). In other aspects the drive section 200 may not have a Z-axis drive.

Referring to FIG. 2B, in one aspect the motors (201MB, 201MU, 201MF—see FIG. 2D) of the drive section 200 may be configured to drive a coaxial drive shaft arrangement having an inner drive shaft 262, a middle drive shaft 261 and an outer drive shaft 260. Any suitable encoders may be provided along with the motors and/or drive shafts for tracking the rotation of the drive shafts and for sending suitable signals to, e.g. controller 120 for controlling rotation of the shafts and corresponding arm links. One or more of the drive motors may be a harmonic drive motor substantially similar to that described in U.S. patent application Ser. No. 13/270,844 filed on Oct. 11, 2011, the disclosure of which is incorporated by reference herein in its entirety. As noted above where two transfer arms are mounted on a single base arm link two additional drive shafts may be added to the coaxial drive shaft arrangement for driving the additional transfer arm through transmissions substantially similar to those described below. The outer drive shaft 260 may be coupled to the base arm link 220 so that as the outer drive shaft 260 rotates the base arm link 220 rotates with it. In one aspect the base arm link 220 may be configured for substantially infinite rotation about axis X to allow substantially 360 degree placement of the shoulder axis SX relative to the axes X. The middle drive shaft may be coupled to a first drive axis pulley 280 so that as the middle drive shaft 261 rotates the first drive axis pulley 280 rotates with it. The inner drive shaft 262 may be coupled to a second drive axis pulley 281 so that as the inner drive shaft 262 rotates the second drive axis pulley rotates with it. A second coaxial shaft arrangement may be rotatably mounted at least partly within the base arm link 220 at an end of the base arm link 220 distal from an axis of rotation X of the base arm link 220. The second coaxial shaft arrangement includes an outer drive shaft 271 and an inner drive shaft 270. The inner drive shaft 270 may be coupled to a first shoulder pulley 282 so that as the pulley 282 rotates the inner drive shaft 270 rotates with it. The outer drive shaft 271 may be coupled to a second shoulder pulley 283 so that as the second shoulder pulley 283 rotates the outer drive shaft rotates with it. The inner drive shaft 270 (its pulley 282) and outer drive shaft 271 (and its pulleys 283) may be supported from the base arm link in any suitable manner, such as by one or more suitable bearings SXB, so they are rotatable independent of each other and rotatable independent of the base arm link 220. The first shoulder pulley 282 may be coupled to the first drive axis pulley 280 by any suitable transmission 291 such as, for example, belts, bands, etc. so that the inner drive shaft 270 is driven by a motor of the drive section 200 corresponding to the middle drive shaft 261. The second shoulder pulley 283 may be coupled to the second drive axis pulley 281 by any suitable transmission 290, which may be substantially similar to transmission 291, so that the outer drive shaft 271 is driven by a motor of the drive section 200 corresponding to the inner drive shaft 262. It is noted that one aspect the pulley pairs 280, 282 and 281, 283 may each have a one to one (1:1) drive ratio while in other aspects the pulley pairs may have any other suitable drive ratio. The outer drive shaft 271 and inner drive shaft 270 may be coupled to the transfer arm 214 in any suitable manner for causing the transfer arm to extend and retract or rotate as a unit about the shoulder axis SX. For example, with respect to the SCARA arm shown in FIG. 2A the outer shaft 271 may be coupled to the upper arm link 213 and the inner shaft 270 may be coupled to the forearm link 212 where the end effector is slaved to the upper arm so that it remains substantially aligned with the axis of extension and retraction of the transfer arm 214. It is noted that the combined rotation of the shafts 270, 271 may allow for substantially infinite rotation (e.g. more than about 360 degrees) or otherwise may allow rotation of the transfer arm 214 independent of rotation of the base arm link 220 so that the transfer arm 214 can extend along any desired path relative to the base arm 220.

Referring to FIG. 2E, in another aspect, the drive motors 201MB, 201MU, 201MF may be distributed along the transfer arm section 210 in a manner substantially similar to that described in U.S. Pat. No. 7,578,649, the disclosure of which is incorporated by reference herein in its entirety. For example, a single motor 201MB (which may be a harmonic drive motor) may be located about or adjacent axis X for rotatably driving the base arm link 220. The motor 201MU for driving the upper arm link 213 of the transfer arm 214 may be located on the base arm link 220 at the shoulder axis SX for substantially directly driving (or driving through any suitable transmission) the upper arm link 213. The motor 201MF for driving the forearm link 212 of the transfer arm 214 may be located on the upper arm link 213 at the elbow axis E for substantially directly driving (or driving through any suitable transmission) the forearm link 212. As may be realized in one aspect the end effector 211 may be slaved to the upper arm while in another aspect an additional drive motor may be provided at any suitable location for independently rotating the end effector 211.

Figure 2I:
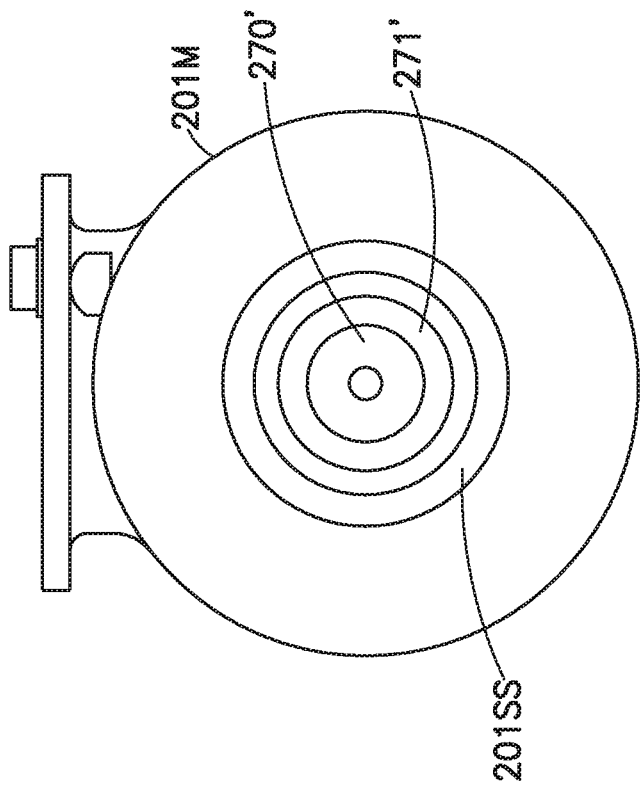
FIGS. 2H-2J are schematic illustrations of a portion of a transport apparatus in accordance with an aspect of the disclosed embodiment.
Figure 2C:
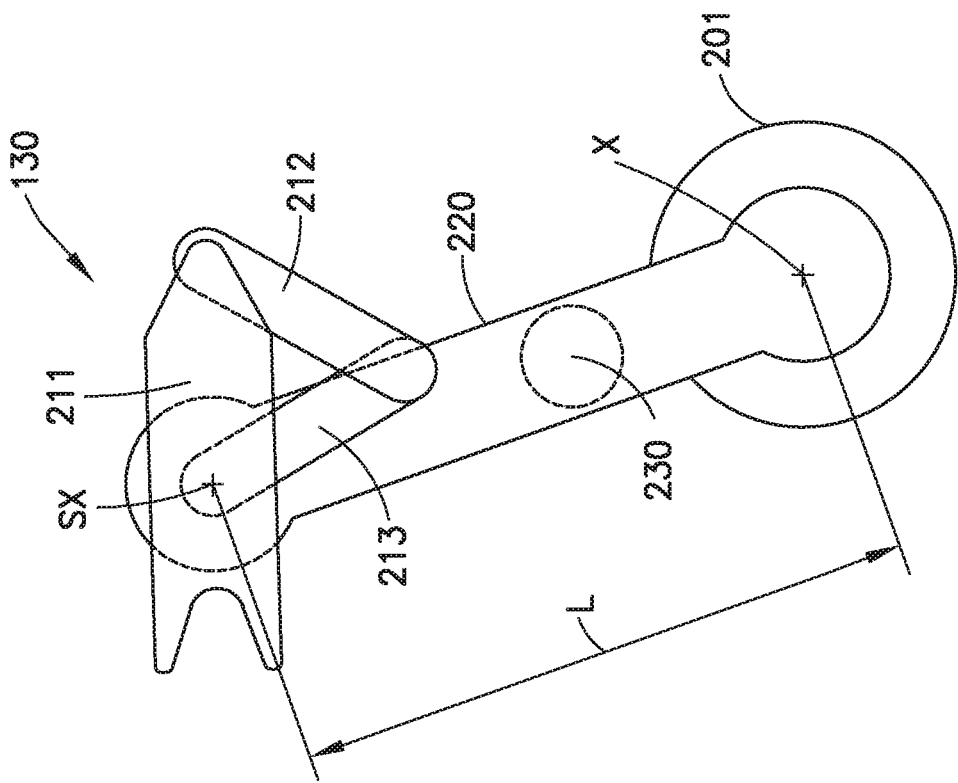
Figure 2H:
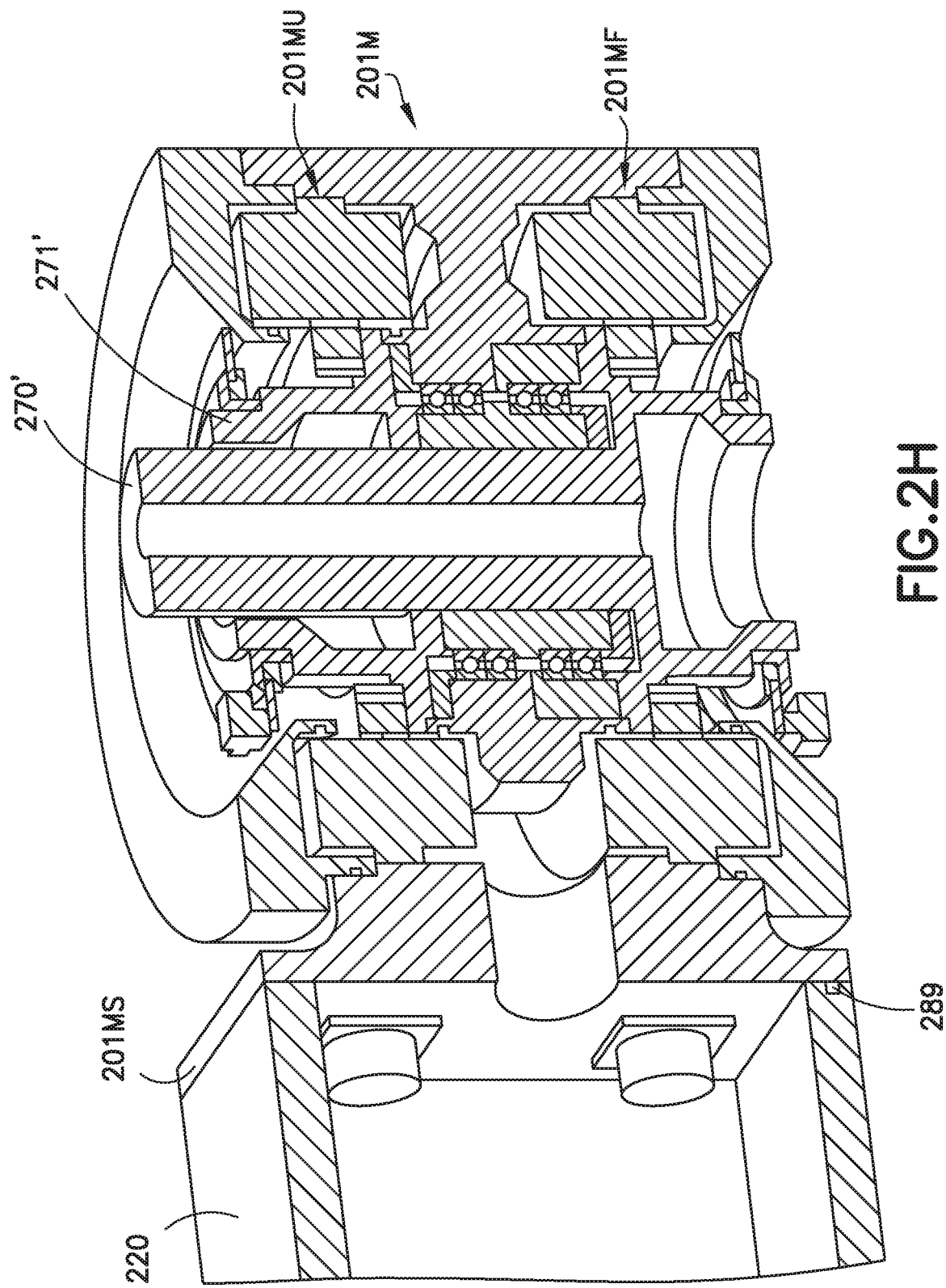
Figure 2J:
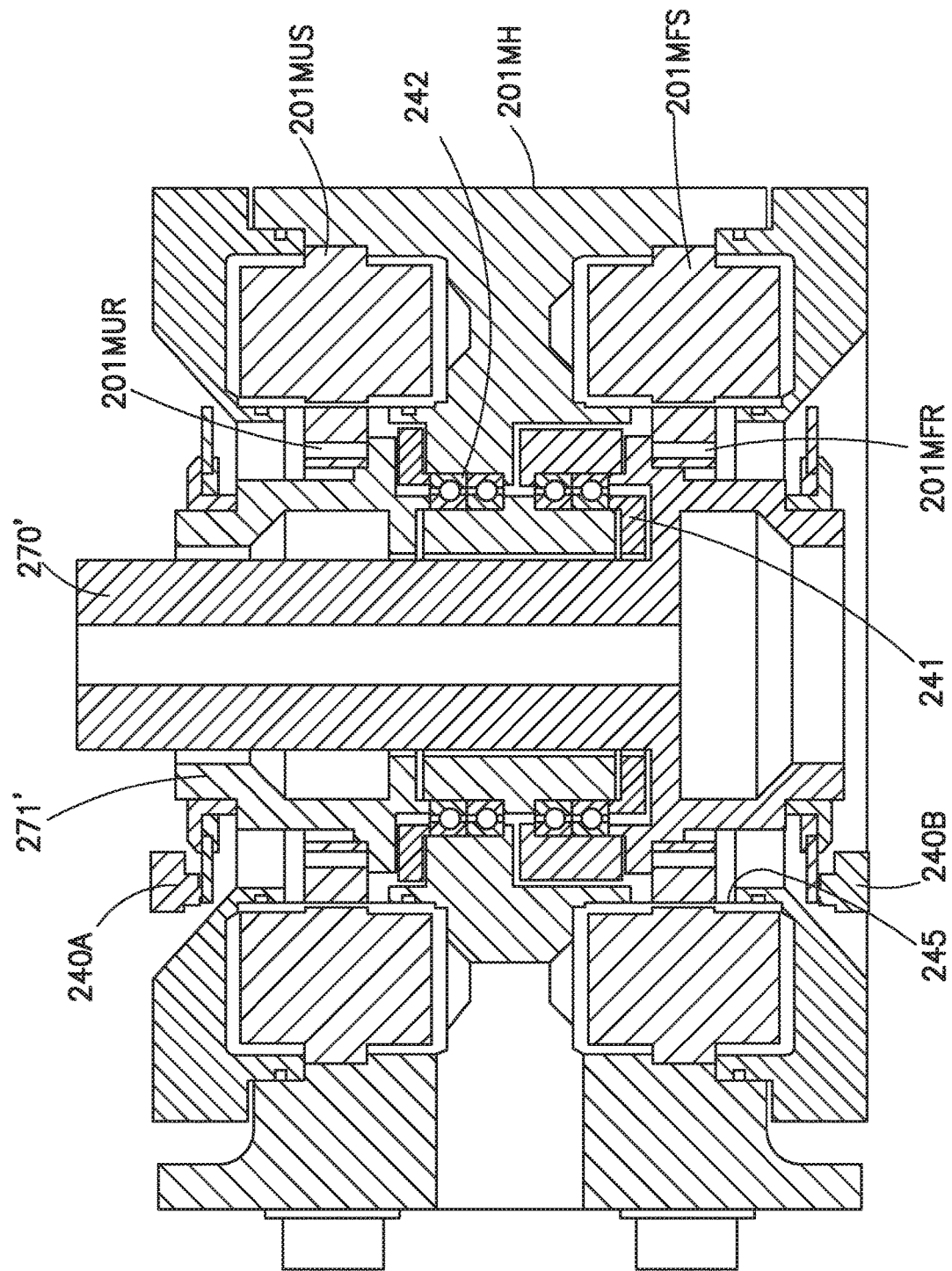

Referring to FIGS. 2H, 2I and 2J the drive motor 201MB (which may be a harmonic drive motor) for rotatably driving the base arm link 220 may be located about or adjacent the axis X as described above. The motors 201MU and 201MF for rotatably driving the upper arm link 213 and forearm link 212 of the transfer arm 214 may be included in a motor module 201M that is removably mounted to an end of the base arm link 220 (e.g. substantially in-line with the base arm link 220) so as to form part of the base arm link. The motor module 201M may include a housing 201MH having an interface section 201MS. The motor module 201M may also include any suitable covers and shields (not shown) and seals 201SS, such as for example ferro-fluidic seals, for sealing at least portions of an interior of the motor module (as described above) and for substantially preventing any particles generated by the motor module from contaminating the processing environment and substrates located therein. The interface section 201MS may be configured for removably mounting the motor module 201M to the base arm link 220 in any suitable manner. In one aspect, any suitable seal(s) 289 may be provided between the interface section 201MS and the base arm so that at least a portion of the interior of the motor module 201M may be maintained at substantially the same pressure and atmosphere as the interior of the base arm 220, as will be described below. In this aspect the motor module includes motors 201MU and 201MF arranged coaxially one above the other for driving respective shafts 270', 271' of a coaxial shaft arrangement. Motor 201MU may include a stator 201MUS mounted to the housing 201MH and rotor 201MUR mounted to the shaft 271'. Motor 201MF may include a stator 201MFS mounted to the housing 201MH and rotor 201MFR mounted to shaft 270'. Seals or sleeves 245 may be provided for each of the stators 201MUS, 201MFS for sealing an environment in which the stators are located from an environment in which the rotors are located to allow the module 201M to be used in a vacuum environment where the drive shafts and rotors are located within the vacuum environment and the stators are located outside the vacuum environment. As may be realized, where the module 201M is used in an atmospheric environment the seals 245 need not be provided.

The shaft 270' may be the inner shaft and may be rotatably supported by the housing 201MH through any suitable bearings 241. The shaft 271' may be the outer shaft and may be rotatably supported within the housing 201MH by any suitable bearings 242. It is noted that the bearings 242 of the outer shaft 271' may be supported by the bearings 241 of the inner shaft 270' (e.g. the outer shaft is coupled to the inner shaft bearings) in any suitable manner. One example, of such a support arrangement is provided in U.S. patent application Ser. No. 13/417,837 filed on Mar. 12, 2012, the disclosure of which is incorporated herein by reference in its entirety. Supporting the outer shaft 271' with the bearings of the inner shaft 270' maintains alignment of the shafts 270', 271' allowing the motor module 201M to be modular and removable substantially without having to align the shafts once the motor module 201M is mounted to the base arm link 220.

Any suitable encoders 240A, 240B may be provided and may be suitably mounted to the housing 201MH (and encoder tracks mounted to the drive shafts) for tracking rotational movement of the shafts 270', 271'. The encoders 240A, 240B may be connected to a suitable controller, such as controller 120 for sending suitable encoder signals to the controller for controlling rotation of the respective drive shafts and arm links. As may be realized, the housing 201MH may include an aperture through, for example, the interface section 201MS for allowing suitable control wires for the encoders 240A, 240B and the motors 201MU, 201MF to pass for connection to the controller 120. As noted above, the interior of the base arm link 220 may be maintained as a non-vacuum environment to allow for the passage of the wires through the base arm link 220 to the controller 120. In other aspects the encoders and motors may be connected to the controller through any suitable wireless connection.

Referring to FIGS. 3A and 3B a portion of a processing apparatus is shown in accordance with an aspect of the disclosed embodiment. Here the transfer chamber 126 is a linearly elongated transfer chamber substantially similar to transfer chamber 125, however transfer chamber 126 is configured to have a processing station 140 configuration different than transfer chamber 125. For example, both ends of the transfer chamber 126 are substantially identical such that each end is capable of interfacing with either two processing stations 140A, 140B or two load locks 102A, 102B (or a combination thereof) while the ends of the transfer chamber 125 are different from one another such that one end is capable of interfacing with either two load locks (shown in FIG. 1) or two process modules (not shown) and the other end is configured to interface with three process modules 140A, 140B, 140C or one load lock (see FIG. 5B). It should be understood that in other aspects the transfer chambers may have any suitable configuration for attaching any suitable number of process modules and/or load locks in any suitable arrangement. In the aspects of the disclosed embodiment shown in FIGS. 1, 3A and 3B the transfer chamber 125, 126 is of a sufficient length so that two process modules 140 are linearly disposed on each lateral side of the transfer chamber 125, 126. The transfer robot 130 may be disposed within the transfer chamber 125, 126 so that the drive axis of rotation X is located substantially between substrate transport paths TP into the process modules 140S1, 140S2 and 140S3, 140S4. The drive axis X may also be offset from a centerline CL of the transfer chamber 125, 126 by any suitable distance so that the shoulder axis SX is disposed at point 399 within the transfer chamber 125, 126 when the base arm link 220 is rotated in a first direction. The point 399 may be located, for example, where the transfer paths into processing stations 140A, 140B, 140S1, 140S3 intersect or in other words in a center of the cluster formed by processing stations 140A, 140B, 140S1, 140S3 with respect to chamber 126 in FIG. 3A or the cluster formed by processing stations 140A-140D with respect to chamber 125 in FIG. 1. When the base arm link is rotated in a second direction the shoulder axis SX may be located at point 398 within the transfer chamber. The point 398 may be located, for example, where the transfer paths into processing stations 140S2, 140S4 and load locks 102A, 102B intersect or in other words in a center of the cluster formed by processing stations 140S2, 140S4 and load locks 102A, 102B. In other aspects the drive section 200 may be disposed at any suitable location within the transfer chamber 125, 126.

FIGS. 4A and 4B illustrate the base arm link 220 positioned so that the shoulder axis SX is located at point 398 so that the end effector of the transfer arm 214 can access, for example, each of the processing stations 140S2, 140S4 and load locks 102A, 102B. It is noted that the transfer arm 214 is illustrated in FIG. 4A, for exemplary purposes only, as a SCARA type arm having a dual blade (double ended) end effector while in FIG. 4B the transfer arm 214 is illustrated as a SCARA type arm having a single blade end effector. In other aspects the transfer arm 214 may have any suitable configuration. It is also noted that in one aspect the independent rotation of each of the upper arm link and forearm link may allow the transfer arm to extend on opposite sides of the shoulder axis SX so that end effector EE2 can access processing station 140S2 and end effector EE1 can access processing station 140S4 without rotation of the transfer arm 214 about the shoulder axis SX as a unit. It is also noted that the independent rotation of the transfer arm 214 relative to the base arm 220 may allow for rotation of the transfer arm 214 about shoulder axis SX as a unit so that end effector EE1 can access processing station 140S2 and end effector EE2 can access processing station 140S4. As may be realized a fast swapping of substrates may also be made by inserting one end effector into one of the processing stations, rotating the transfer arm about the shoulder axis SX and then inserting the other end effector into the same processing station. Likewise, referring to FIG. 4B the independent rotation of the transfer arm 214 relative to the base arm 220 may allow for rotation of the transfer arm 214 about shoulder axis SX as a unit so that end effector EE3 of the single blade SCARA arm can access both processing stations 140S2, 140S4. As described herein, the drive section of the transfer robots includes three independent axes of rotation defining three degrees of freedom. One degree of freedom of the drive section moves the at least one base arm horizontally for transporting the at least one transfer arm within the transfer chamber and two degrees of freedom of the drive section drives the at least one transfer arm to extend the at least one transfer arm, retract the at least one transfer arm and swap the two end effectors.

Figure 5C:
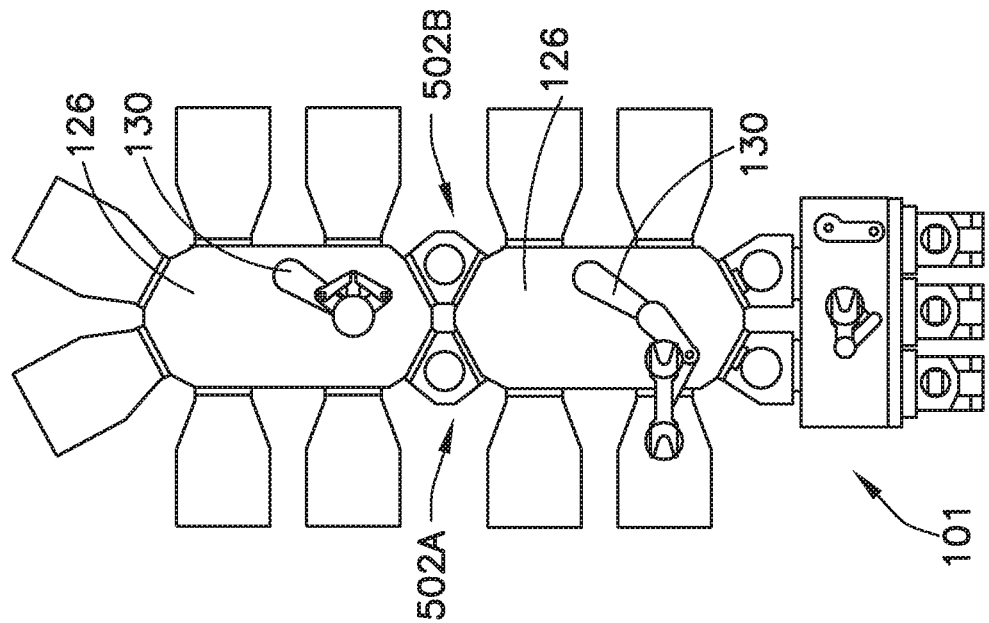
Figure 5B:
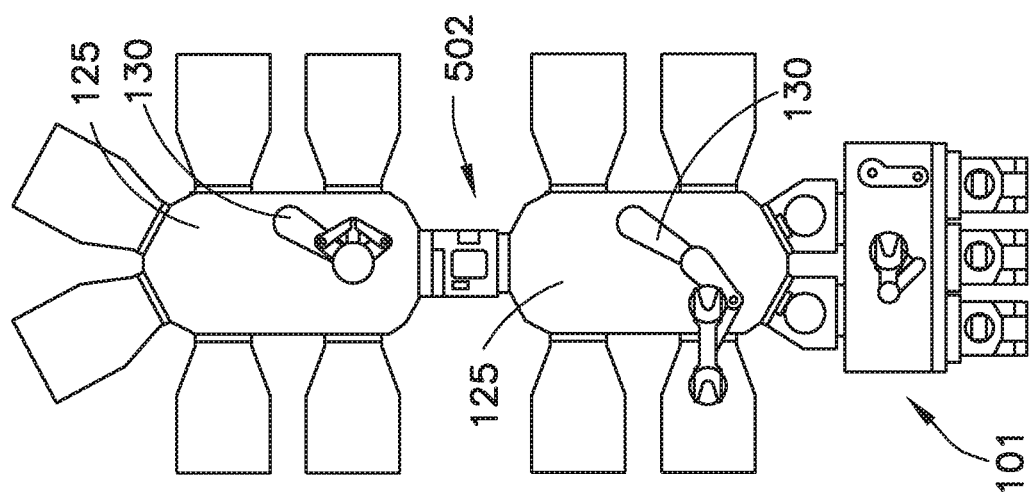

Referring to FIGS. 5B and 5C the transfer arm 214 is shown as a dual arm SCARA transfer arm. In this aspect, the dual arm SCARA transfer arm may be independently driven with two drive motors (e.g. through shafts 270, 271) using, for example, a mechanical switch or lost motion mechanism in a manner substantially similar to that described in U.S. Pat. No. 7,946,800 and U.S. patent application Ser. No. 12/117,415 filed on May 8, 2008, the disclosures of which are incorporated herein by reference in their entireties. For example, a first one of the drive shafts 270, 271 may be connected to a housing of the transport arm for rotating the dual arm SCARA transfer arm about the shoulder axis SX as a unit while a second one of the drive shafts 270, 271 is coupled to both arms through the mechanical switch so that rotation of the second drive shaft 270, 271 in one direction causes a first one of the arms to extend while the second arm remains in a substantially retracted configuration and rotation of the second drive shaft 270, 271 in the opposite direction causes the second arm to extend while the first arm remains in a substantially retracted configuration. As may be realized rotation of the dual arm SCARA transfer arm about the shoulder axis SX as a unit may be provided through substantially simultaneous rotation of the first and second drive shafts 270, 271. It is noted that the end effectors may be slaved to upper arm in any suitable manner.

In another aspect, the dual SCARA transfer arm may be driven by two motors where the upper arm of the first SCARA arm and the forearm of the second SCARA arm are drivingly coupled to shaft 270 (i.e. a common drive motor) and the upper arm of the second SCARA arm and the forearm of the first SCARA arm are drivingly coupled to shaft 271 (i.e. a common drive motor). Rotation of the shafts 270, 271 in the same direction may cause rotation of the dual arm SCARA transfer arm about the shoulder axis SX as a unit and rotation of the shafts 270, 271 in opposite directions may cause extension or retraction of the arms in a manner substantially similar to that described in U.S. patent application Ser. No. 13/293,717 filed on Nov. 10, 2011 the disclosure of which is incorporated by reference herein in its entirety. It is noted that the end effectors may be slaved to upper arm in any suitable manner.

In still another aspect, the dual arm SCARA transfer arm may be driven using three drive motors (e.g. where the drive section has four drive axes independent of any Z-axis drive axis) through shafts 270, 271 and one additional shaft (not shown) in a manner substantially similar to that described in U.S. Pat. No. 6,485,250 and U.S. patent application Ser. No. 13/417,837 filed on Mar. 12, 2012, the disclosures of which are incorporated by reference herein in their entireties.

Figure 6A:
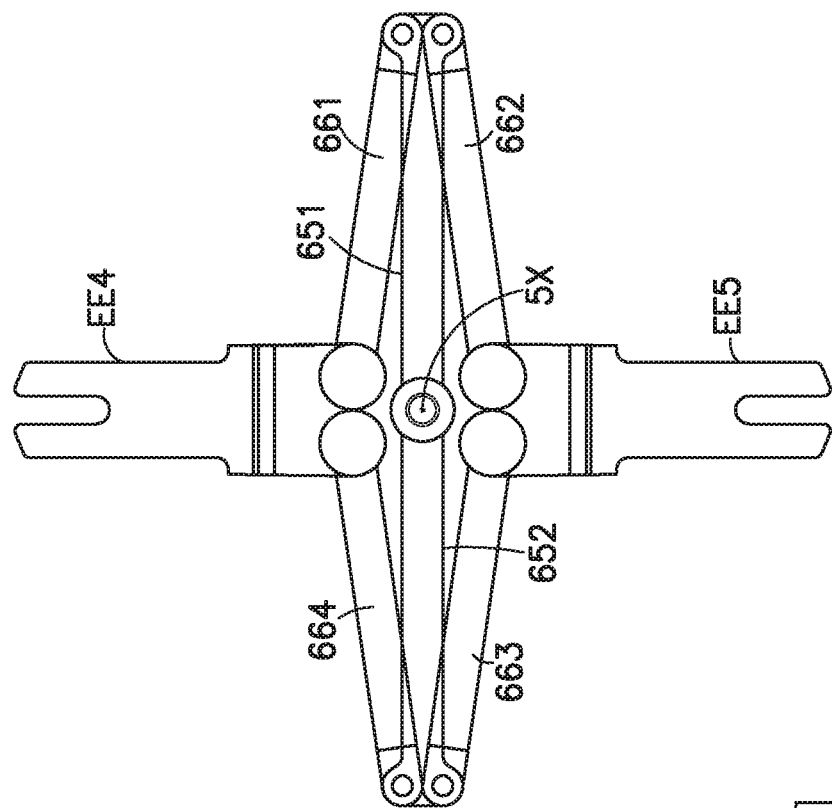
FIG. 6A is a schematic illustration of a portion of a transport apparatus in accordance with an aspect of the disclosed embodiment.
Figure 6:
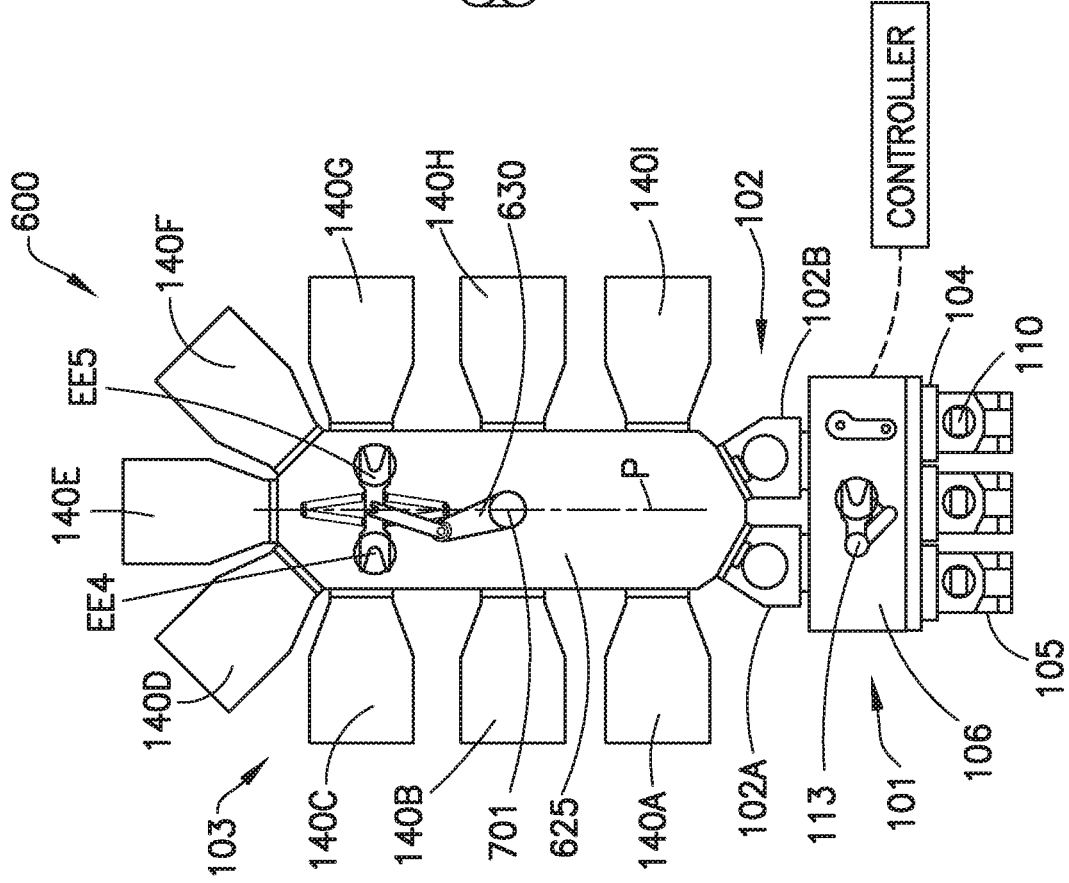
FIG. 6 is a schematic illustration of a processing apparatus in accordance with an aspect of the disclosed embodiment.

Referring to FIGS. 6 and 6A the transfer arm 214 is illustrated as a bi-symmetric frog leg transfer arm. The frog leg transfer arm may include drive arm links 651, 652 and driven arm links 661-664. The driven arm links 661, 664 connect end effector EE4 to the drive arm links 651, 652. The driven arm links 662, 663 connect end effector EE5 to the drive arm links 651, 652. Drive arm link 651 may be coupled to shaft 270 (FIG. 2B) in any suitable manner and drive arm link 652 may be coupled to shaft 271 (FIG. 2B) in any suitable manner so that rotation of the drive shafts in opposite directions causes the extension and retraction of the end effector EE4 to/from e.g. processing station 140C, and extension and retraction of end effector EE5 to/from e.g. processing station 140G in a manner substantially similar to that described in, for example, U.S. Pat. Nos. 5,899,658 and 5,720,590 the disclosures of which are incorporated by reference herein in their entireties. It is noted that rotation of the shafts 270, 271 in the same direction may cause rotation of the frog leg transfer arm about shoulder axis SX so that further rotation of the drive shafts in opposite directions causes the extension and retraction of the end effector EE5 to/from e.g. processing station 140C, and extension and retraction of end effector EE4 to/from e.g. processing station 140G in a manner substantially similar to that described in, for example, U.S. Pat. Nos. 5,899,658 and 5,720,590. As may be realized a fast swapping of substrates may also be made by inserting one end effector into one of the processing stations, rotating the transfer arm about the shoulder axis SX and then inserting the other end effector into the same processing station.

Figure 5A:
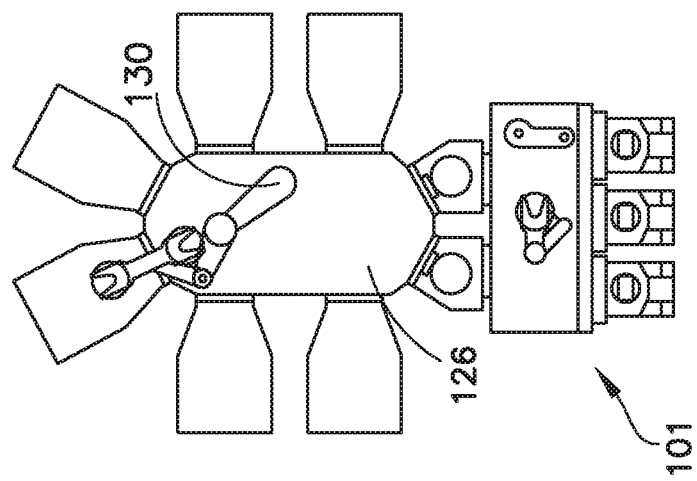

Referring now to FIGS. 5A, 5B and 5C different configurations of a processing apparatus including the elongated dual cluster transfer chambers are illustrated in accordance with aspects of the disclosed embodiment. It is again noted that in some aspects the processing apparatus may include multiple levels of processing stations and/or load locks (e.g. located one above the other) as described with respect to FIGS. 11A-11C so that the number of processing stations and/or load locks is increased substantially without increasing a footprint of the processing apparatus. FIG. 5A illustrates a single transfer chamber configuration substantially similar to that shown in FIG. 1, however in FIG. 5A transfer chamber 126 is illustrated having a different processing station arrangement than transfer chamber 125 (e.g. two processing stations are located at the end of the transfer chamber rather than the three processing stations of transfer chamber 125). FIG. 5B illustrates a tandem transfer chamber configuration where two transfer chambers 125 are coupled together by a single load lock 502 so that the environments within the joined transfer chambers may be selectively sealed from each other. In other aspects the two transfer chambers may be connected in any suitable manner so that the environments within the transfer chambers are in communication with each other. FIG. 5C illustrates yet another configuration where two transfer chambers 126 are coupled together by two load locks 502A, 502B so that the environments within the joined transfer chambers may be selectively sealed from each other. In other aspects the two transfer chambers may be connected in any suitable manner so that the environments within the transfer chambers are in communication with each other. As may be realized, any suitable number of transfer chambers 125, 126 may be coupled to each other through any suitable number of load locks in any suitable manner to form a combined transfer chamber having any suitable length and configuration of process modules, load locks and EFEMs. For example, referring to FIG. 5D three transfer chambers 126 are coupled together to form a combined linearly elongated transfer chamber such that each end of the combined linearly elongated transfer chamber has a respective mini-environment (EFEM) 106A, 106B, however it should be realized that transfer chambers 125 may be coupled together or coupled together in combination with transfer chambers 126 in a manner substantially similar to that shown in FIGS. 5B and 5C to form a combined linearly elongated transfer chamber having ends with respective mini-environments 106A, 106B. In this aspect, substrates may be introduced into the processing apparatus at one end of the processing apparatus through one of mini-environments 106A, 106B and removed from the processing apparatus at the other end through the other one of mini-environments 106A, 106B. As may be realized a mini-environment substantially similar to mini-environments 106A, 106B may replace one of the processing stations 140 so that substrates may be removed from or introduced to the processing apparatus between the ends of the combined linearly elongated transfer chamber. Similarly a processing apparatus having a single linearly elongated transfer chamber such as shown in FIGS. 1 and 5A may have a mini-environment disposed at each end of the chamber 125, 126 or between the ends of the chamber 125, 126 in a manner substantially similar to that described with respect to FIG. 5D.

Referring now to FIG. 6, in this aspect the tool 600 is shown as a cluster type tool having a linearly elongated transfer chamber 625 (illustrated as an elongated triple cluster transfer chamber, e.g. one cluster is formed by processing stations 140C-140G, one cluster is formed by processing stations 140B and 140H and one cluster is formed by processing stations 140A, 140I and load locks 102A, 102B). The tool 600 may be substantially similar to tool station 100 described above such that like features have like reference numbers. It is again noted that in some aspects the tool 600 (as well as the portions of the tool shown in FIGS. 8A-9C) may include multiple levels of processing stations and/or load locks (e.g. located one above the other) as described with respect to FIGS. 11A-11C so that the number of processing stations and/or load locks is increased substantially without increasing a footprint of the processing apparatus.

The vacuum back end 103 generally includes a transfer chamber 625 one or more processing station(s) 140A-140I, generally referred to as processing station(s) 140, and a transfer robot 630. The transfer robot 630 will be described below and may be located within the transfer chamber 625 to transport substrates between the load lock(s) 102 and the various processing stations 140. It is noted that in one aspect the transfer robot 113 of the mini-environment 106 may be substantially similar to transfer robot 630, while in other aspects the transfer robot 113 may be any suitable transfer robot.

Figure 7A:
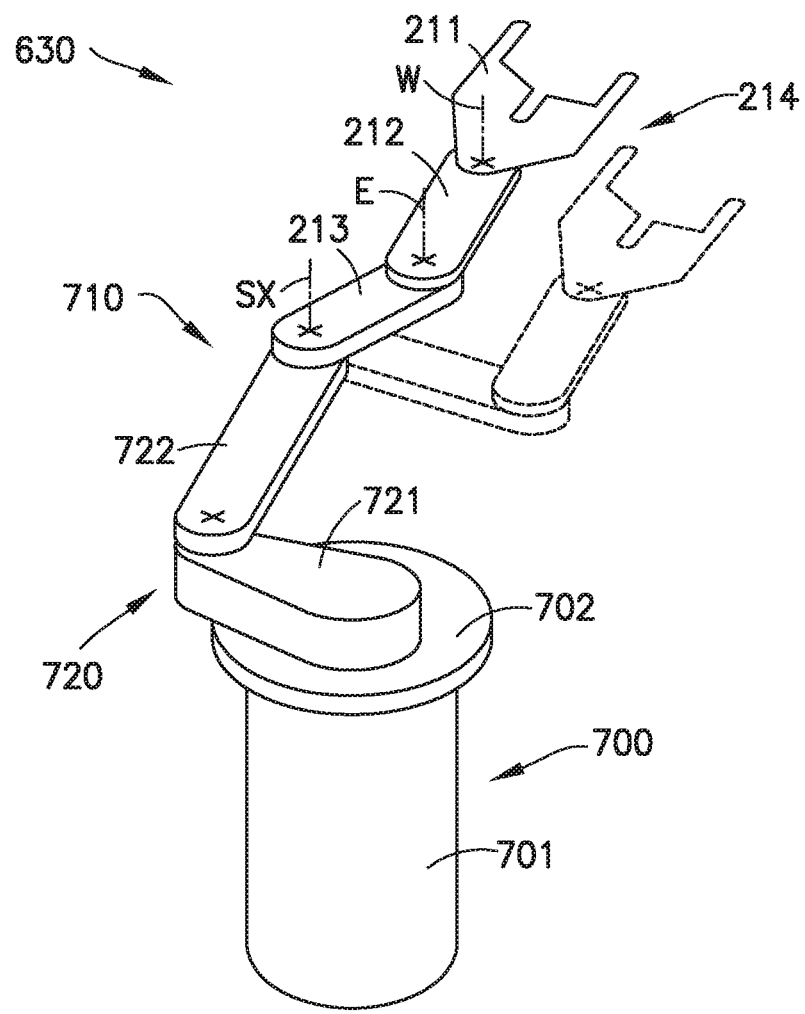
FIG. 7A is a schematic illustration of a transport apparatus in accordance with an aspect of the disclosed embodiment.
Figure 7B:
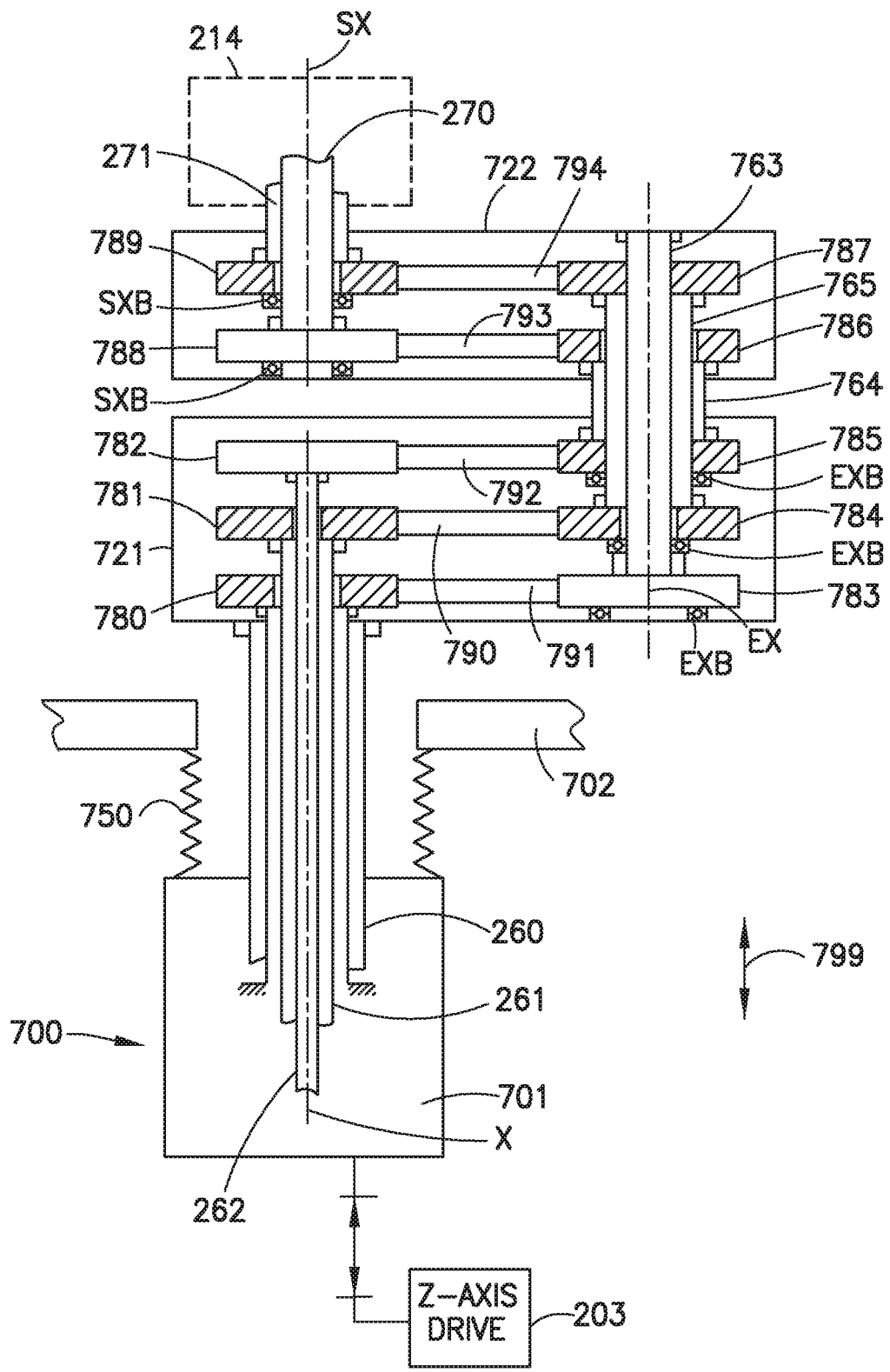
FIG. 7B is a schematic illustration of a portion of the transport apparatus of FIG. 7A in accordance with an aspect of the disclosed embodiment.

Referring now to FIGS. 7A and 7B the transfer robot 630 generally includes a drive section 700 having a housing 701, a mounting flange 702 configured for mounting the transfer robot 630 in one of the atmospheric front end 101 or vacuum back end 103, and a transfer arm section 710. The transfer arm section 710 may include a base arm or articulated boom 720 and a transfer arm 214 rotatably mounted to the base arm 720 at a shoulder axis SX. The base arm 720 may include an upper arm link 721 and a forearm link 722 rotatably coupled to the upper arm link 721. In one aspect the base arm 720 may include an aligner 230 (FIG. 2C) mounted to one of the upper arm link 721 or forearm link 721 in a manner substantially similar to that described above. It is noted that the transfer arm 214 may be substantially similar to that described above and be rotatably coupled to the forearm link 722 of the base arm 720. It is again noted that the transfer arm will be referred to generally herein as transfer arm 214 and illustrated in the various figures as having different transfer arm configurations. For example, in FIG. 7A the transfer arm 214 is illustrated as a SCARA type arm having an upper arm link 213, a forearm link 212 rotatably coupled to the upper arm 213 and an end effector 211 rotatably coupled to the forearm link 212, but as noted above, the transfer arm 214 may be any suitable type of transfer arm having two degrees of freedom and one or more end effectors.

The drive section 700 may be substantially similar to drive section 200 described above. In one aspect the drive section 700 may also include a Z-axis drive 203 substantially similar to that described above for linearly moving the transfer arm section 710 in a direction substantially perpendicular to an axis of extension and retraction of the transfer arm section 710. In other aspects the drive section 700 may not have a Z-axis drive. It is noted that the drive section 700 may be disposed within the transfer chamber at any suitable location for allowing the transfer arm 214 access to each of the processing stations and load locks coupled to the transfer chamber. For example, in FIG. 6 the drive section 700 is shown substantially aligned with a substrate transport path into processing stations 140B, 140H but in other aspects the drive section may be disposed at any suitable location.

The motors 201MB, 201MU, 201MF (FIG. 2D) of the drive section 700 may be configured to drive a coaxial drive shaft arrangement having an inner drive shaft 262, a middle drive shaft 261 and an outer drive shaft 260. The outer drive shaft 260 may be coupled to the upper arm link 721 of the base arm 720 about a drive axis of rotation X so that as the outer drive shaft 260 rotates the upper arm link 721 rotates with it. The forearm link 722 of the base arm 720 may be slaved to, for example, a housing 701 of the drive section 700 so that a shoulder axis SX of the forearm link 722 is constrained to travel along a substantially linear path as the base arm 720 is extended and retracted (e.g. a single drive motor causes the extension and retraction of the base arm 720 for moving the transfer arm along the length of the transfer chamber). For example, a drive axis pulley 780 may be mounted substantially concentrically with the drive axis of rotation X and grounded to, for example, the housing 701 of the drive section 700 (or any other suitable portion of the transfer apparatus 630) in any suitable manner so that the drive axis pulley 780 is rotationally stationary relative to the upper arm link 721. In other aspects the drive axis pulley 780 may be rotationally fixed in any suitable manner. A slaved pulley 783 may be rotatably mounted at an elbow axis EX of the base arm 720 in any suitable manner such as by any suitable bearings EXB. The slaved pulley 783 may be coupled to the forearm link 722 by, for example, shaft 763 so that as the slaved pulley 783 rotates the forearm link 722 rotates with it. The pulleys 780, 783 may be coupled to each other in any suitable manner such as by any suitable transmission 791 including, for example, bands, belts, etc. In one aspect the pulleys 780, 783 may be coupled to each other with at least two belts or cables terminated on either ends of the pulleys and then tensioned against each other to substantially eliminate slack and backlash. In other aspects any suitable transmission member may be used to couple the pulleys 780, 783. A two to one (2:1) pulley ratio may be used between pulleys 780, 783 from the drive axis of rotation X to the elbow axis of rotation EX to drive the linear motion of the shoulder axis SX of the forearm link 722. In other aspects any suitable pulley ratio may be used. As may be realized the slaved nature of the forearm link 722 allows the extension and retraction of the base arm with a single drive motor through shaft 260 while the shoulder axis SX is constrained to travel along a substantially linear path P within the transfer chamber 625.

A coaxial spindle (drive shaft arrangement) having outer shaft 271 and inner shaft 270 may be located at the shoulder axis SX of the forearm link 722 in a manner substantially similar to that described above with respect to FIG. 2B. The outer shaft 271 may be driven by, for example, the middle drive shaft 261 in any suitable manner. For example, a drive axis pulley 781 may be coupled to the middle drive shaft 261 so that as the drive shaft 261 rotates the drive axis pulley 781 rotates with it. An idler pulley 784 may be disposed within the upper arm link 721 for rotation about elbow axis EX. The idler pulley 784 may be coupled to shaft 765 so that as the idler pulley 784 rotates the shaft 765 rotates with it. The shaft 765 and pulley 784 may be supported in any suitable manner such as with any suitable bearings EXB. The idler pulley 784 may be coupled to pulley 781 in any suitable manner such as through any suitable transmission 790 substantially similar to those described above. A second idler pulley 787 may also be coupled to the shaft 765 within the forearm link 722 so that the pulleys 784 and 787 rotate in unison. A shoulder pulley 789 may be coupled to the shaft 271 so that the shaft 271 and shoulder pulley 789 rotate in unison. The second idler pulley 787 may be coupled to the shoulder pulley 789 in any suitable manner, such as through any suitable transmission 794 substantially similar to those described above.

The inner shaft 270 of the coaxial spindle may be driven by, for example, the inner drive shaft 262 in any suitable manner. For example, a drive axis pulley 782 may be coupled to the inner drive shaft 262 so that as the drive shaft 262 rotates the drive axis pulley 782 rotates with it. An idler pulley 785 may be disposed within the upper arm link 721 for rotation about elbow axis EX. The idler pulley 785 may be coupled to shaft 764 so that as the idler pulley 785 rotates the shaft 764 rotates with it. The shaft 764 and pulley 785 may be supported in any suitable manner such as with any suitable bearings EXB. The idler pulley 785 may be coupled to pulley 782 in any suitable manner such as through any suitable transmission 792 substantially similar to those described above. A second idler pulley 786 may also be coupled to the shaft 764 within the forearm link 722 so that the pulleys 785 and 786 rotate in unison. A shoulder pulley 788 may be coupled to the inner shaft 270 so that the shaft 270 and shoulder pulley 788 rotate in unison. The second idler pulley 786 may be coupled to the shoulder pulley 788 in any suitable manner, such as through any suitable transmission 793 substantially similar to those described above. It is noted that the pulleys 781, 784, 782, 785, 786, 788, 787, 789 may have respective one to one (1:1) drive ratios but in other aspects any suitable drive ratios may be used. In other aspects, the drive motors 201MU and 201MF may be distributed along the transfer arm 214 in a manner substantially similar to that described above with respect to FIG. 2E. In still other aspects the drive motors 201MU and 201MF may be disposed in a motor module in a manner substantially similar to that described above with respect to FIGS. 2H-2J. As may also be realized, a transfer arm 214 may be located on the top and/or bottom of the base arm 720 in a manner substantially similar to that described above with respect to FIGS. 2D and 2G.

The outer drive shaft 271 and inner drive shaft 270 may be coupled to the transfer arm 214 in any suitable manner, such as those described above, for causing the transfer arm to extend and retract or rotate as a unit about the shoulder axis SX.

Figure 7D:
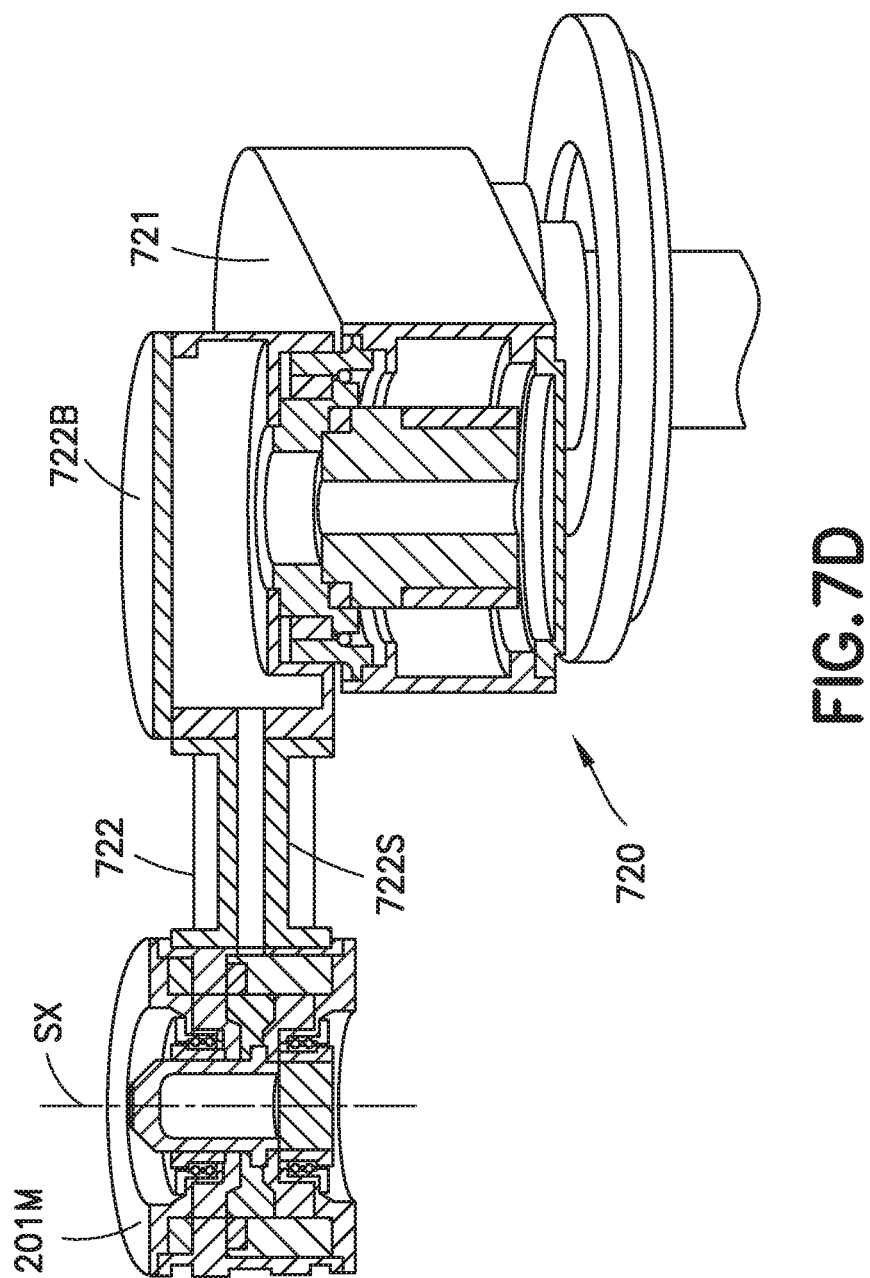
Figure 7E:
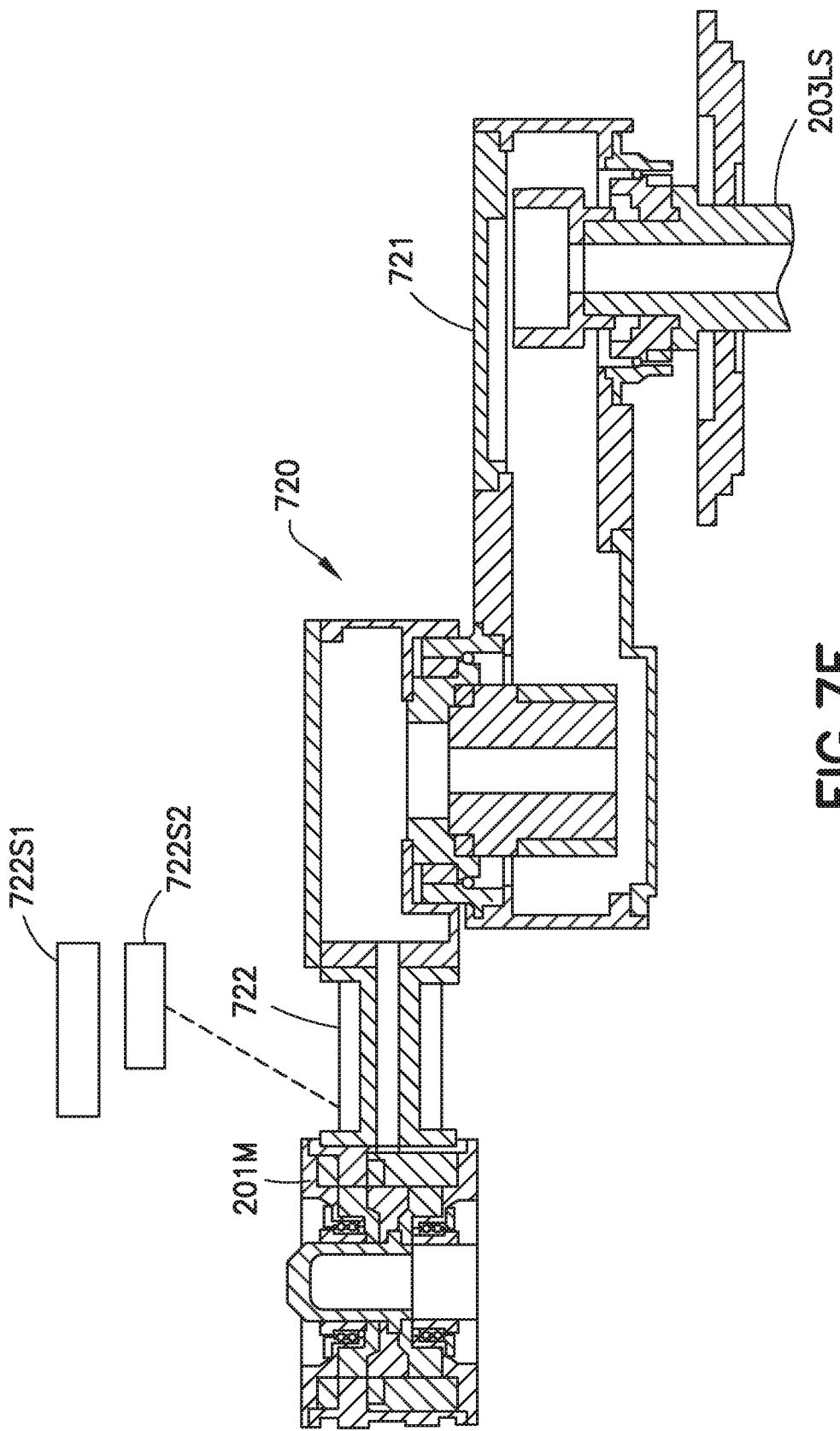

Referring to FIGS. 7C-7E in another aspect of the disclosed embodiment the motor(s) for driving, for example, the base arm 720 may be located at any one or more suitable positions of the base arm 720. For example, in one aspect a linear or Z-axis drive 203 may be located at or proximate to the shoulder axis X of the base arm 720 for driving a lift shaft 203LS to provide the base arm with linear Z-axis movement in the direction of arrow 799. A first motor 3800M1 may be provided on, for example, the lift shaft 203LS in any suitable manner for driving rotation of the upper arm link 721. The motor 3800M1 may be located at least partly within the upper arm link 721 while in other aspects the motor 3800M1 may be mounted on an outside surface of the upper arm link. In one aspect the motor 3800M1 may drive the upper arm link directly while in other aspects the motor 3800M1 may drive a pulley 3800P1. The pulley 3800P1 may be coupled to a pulley 3800P2 in any suitable manner such as with one or more bands, belts, chains, etc. The pulley 3800P2 may be fixed to the upper arm link 721 so that as the motor 3800M1 rotates pulley 3800P1 the upper arm link is caused to rotate about the shoulder axis X of the base arm 720. A second motor 3800M2 may be located at the elbow axis EX of the base arm 720. The motor 3800M2 may be disposed at least partly within one or more of the upper arm link 721 and the forearm link 722. In one aspect the motor 3800M2 may be coupled to the forearm link 722 in any suitable manner. The motors 3800M1, 3800M2 may be driven by any suitable controller and in any suitable manner so that as the upper arm link 721 and forearm link 722 rotate the shoulder axis SX of the transfer arm 214 travels along a substantially straight line path in a manner substantially similar to that described below. In this aspect the forearm link 722 may include a forearm base section 722B and a interchangeable forearm spacer section 722S. One end of the forearm spacer section 722S may be fixed or otherwise coupled to the forearm base section 722B while the other end of the forearm spacer section 722S may be fixed or otherwise coupled to the motor module 201M. As may be realized any suitable number of interchangeable forearm spacer sections 722S1, 722S2 may be provided where each forearm spacer sections has a length that is different from the other forearm spacer sections allowing for the scaling of forearm link 722 length. As may also be realized, a spacer link may also be provided in the upper arm link 721 in a manner substantially similar to that described above so that the length of the upper arm link 721 may also be scaled to any suitable length.

Figure 8C:
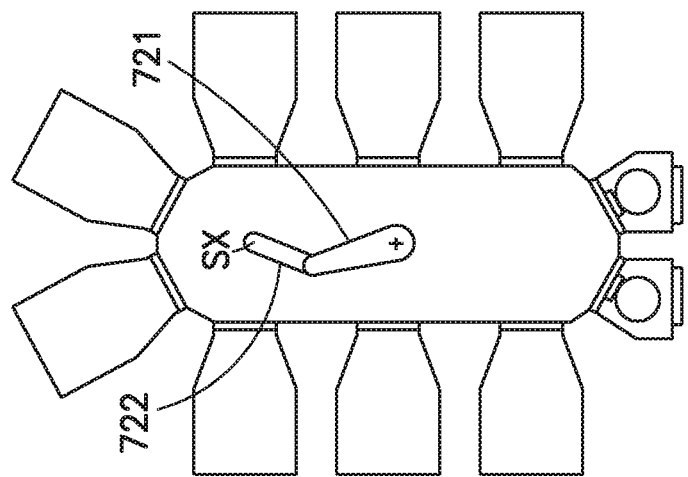
FIGS. 8A, 8B and 8C are schematic illustrations of a portion of a processing apparatus in accordance with an aspect of the disclosed embodiment.
Figure 8B:
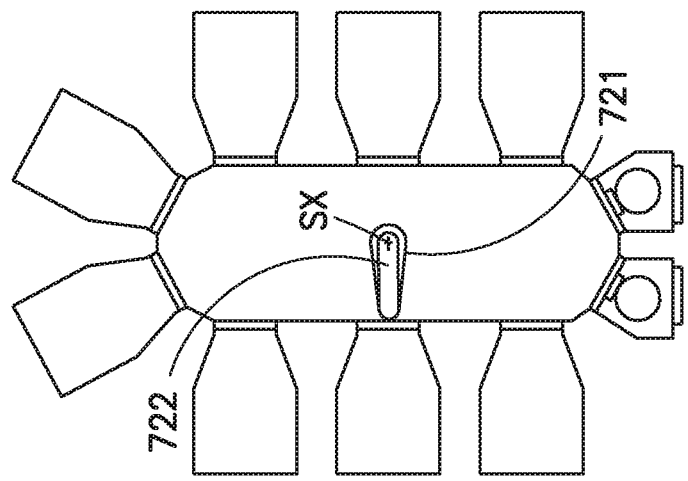
Figure 8A:
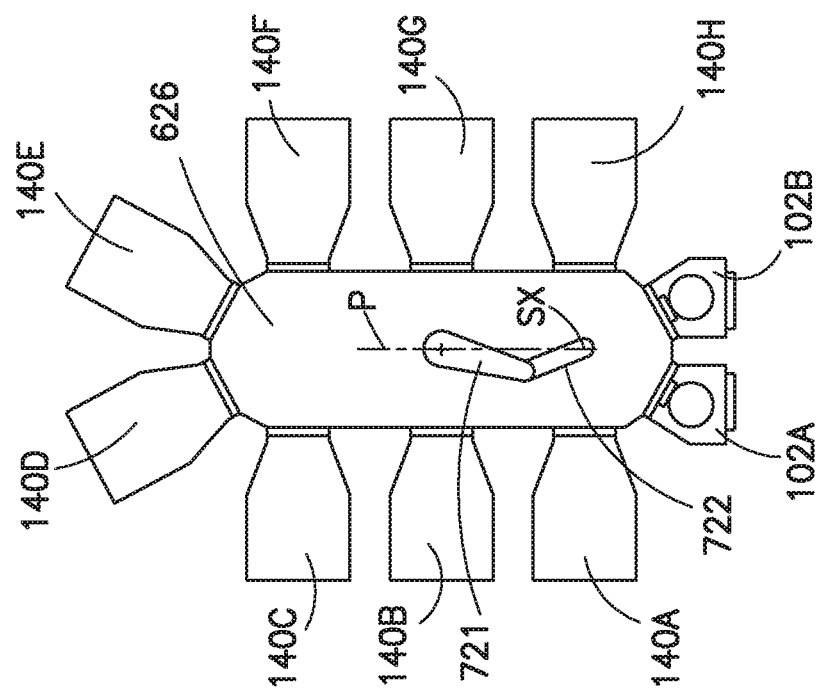
Figure 9C:
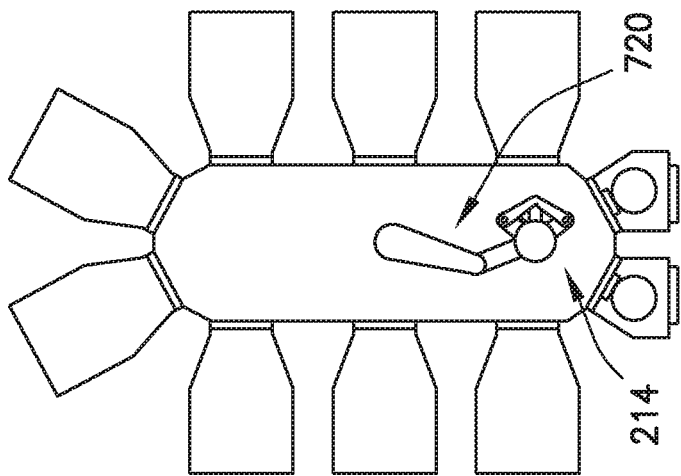
FIGS. 9A, 9B and 9C are schematic illustrations of a portion of a processing apparatus in accordance with an aspect of the disclosed embodiment.
Figure 9B:
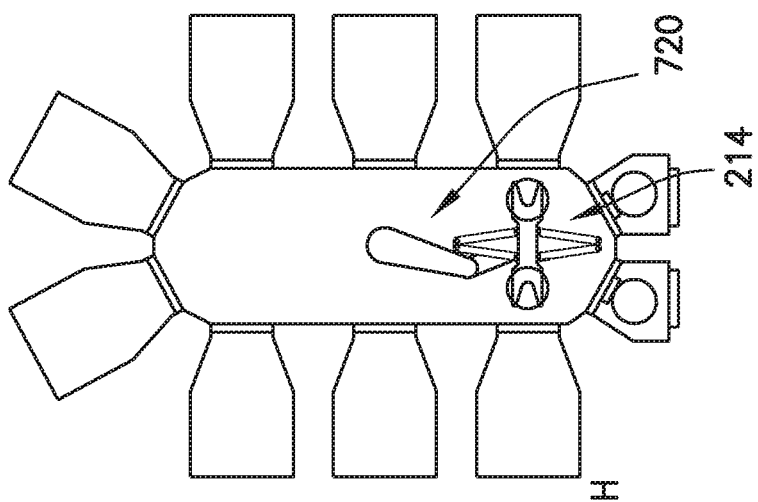
Figure 9A:
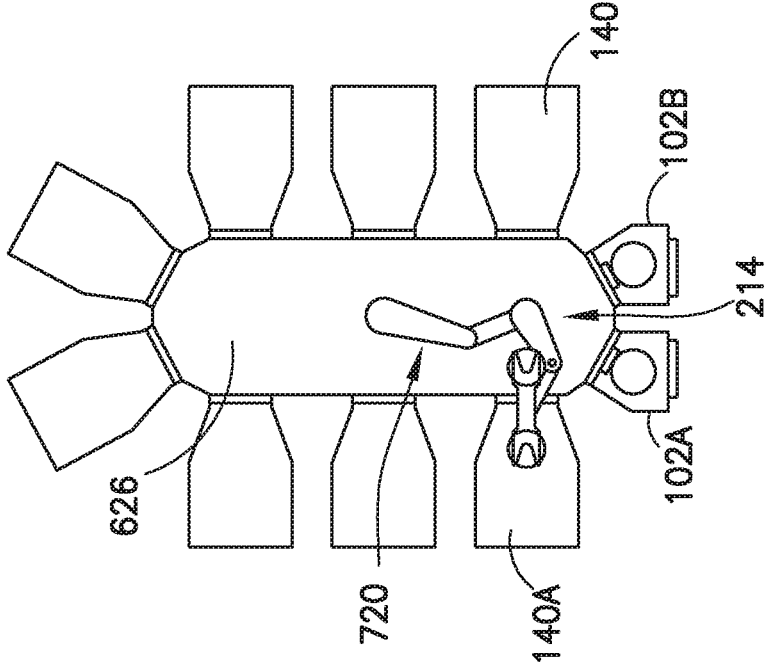

Referring to FIGS. 8A-8C another transfer chamber 626, substantially similar to transfer chamber 625 is illustrated. However, the transfer chamber 626 includes, for example, eight processing stations 140A-140H where the one of the clusters includes processing stations 140C, 140D, 140E, 140F, another of the chambers includes processing stations 140B and 140G while the remaining cluster includes processing stations 140A, 140H and load locks 102A, 102B. The base arm 720 in FIGS. 8A-8B is shown in, for example, three positions where the three positions align the shoulder axis SX transfer arm 214 in a central portion of a respective cluster so that the transfer arm 214 can pick and place substrates to each processing station/load lock of the respective cluster in a manner substantially similar to that described above. FIGS. 9A-9C illustrate a transfer arm 214 disposed on the base arm 720 in a position within the transfer chamber 626 for accessing processing stations 140A, 140H and load locks 102A, 102B. It is also noted that the transfer arm is illustrated, for exemplary purposes only, as a SCARA arm having a dual bladed end effector (FIG. 9A), as a bi-symmetric frog leg transfer arm (FIG. 9B) and as a dual arm SCARA arm (FIG. 9C) but is should be understood, as described above, that any suitable transfer arm, such as a two degree of freedom transfer arm, may be mounted to the base arm 720 in any suitable manner.

Figures 10A, 10B, 10C:
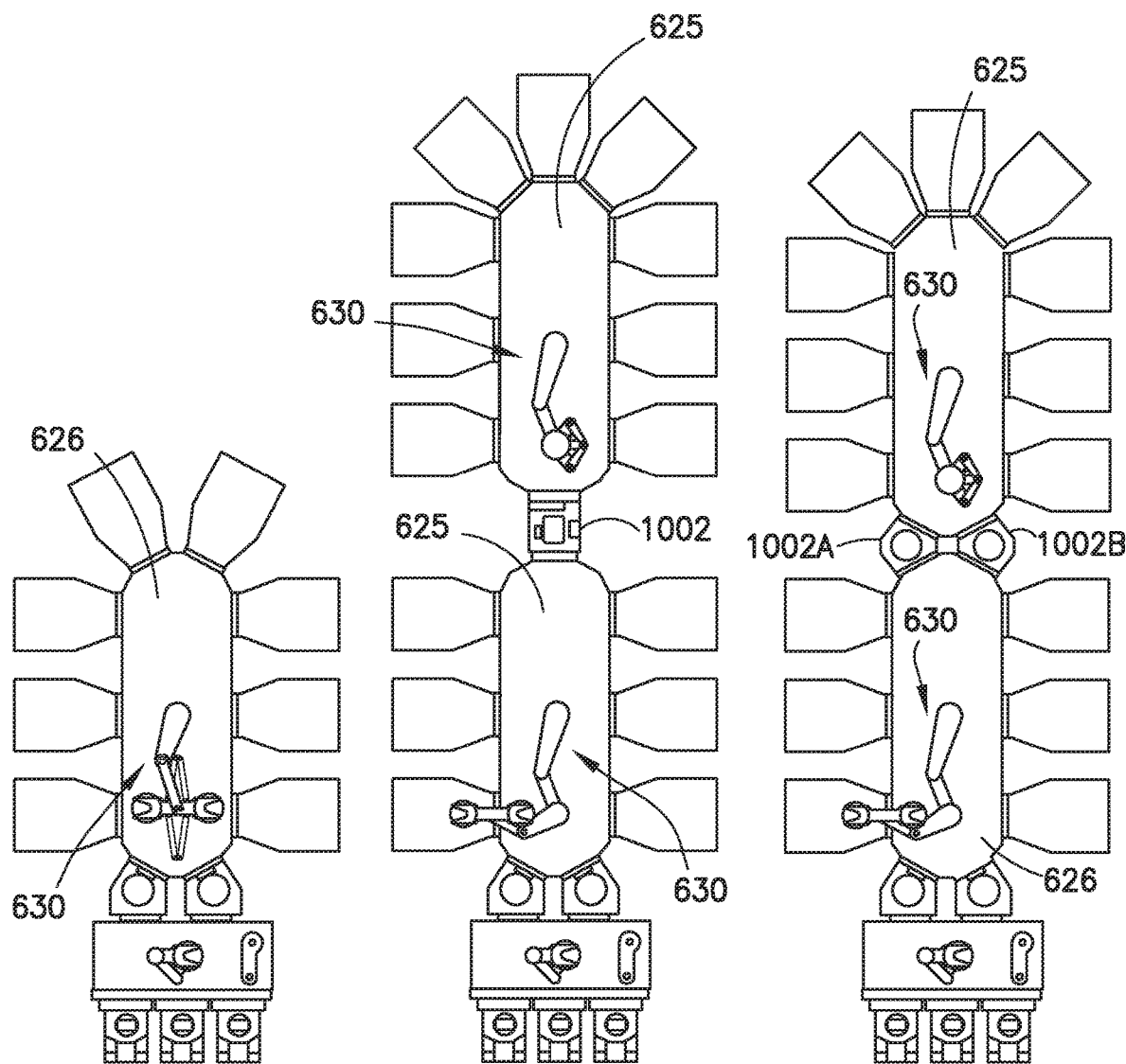
FIGS. 10A, 10B, 10C and 10D are schematic illustrations of different processing apparatus configurations in accordance with aspects of the disclosed embodiment.

FIGS. 10A, 10B and 10C illustrate different configurations of a processing apparatus including the elongated triple cluster transfer chambers in accordance with aspects of the disclosed embodiment.

Figure 10D:
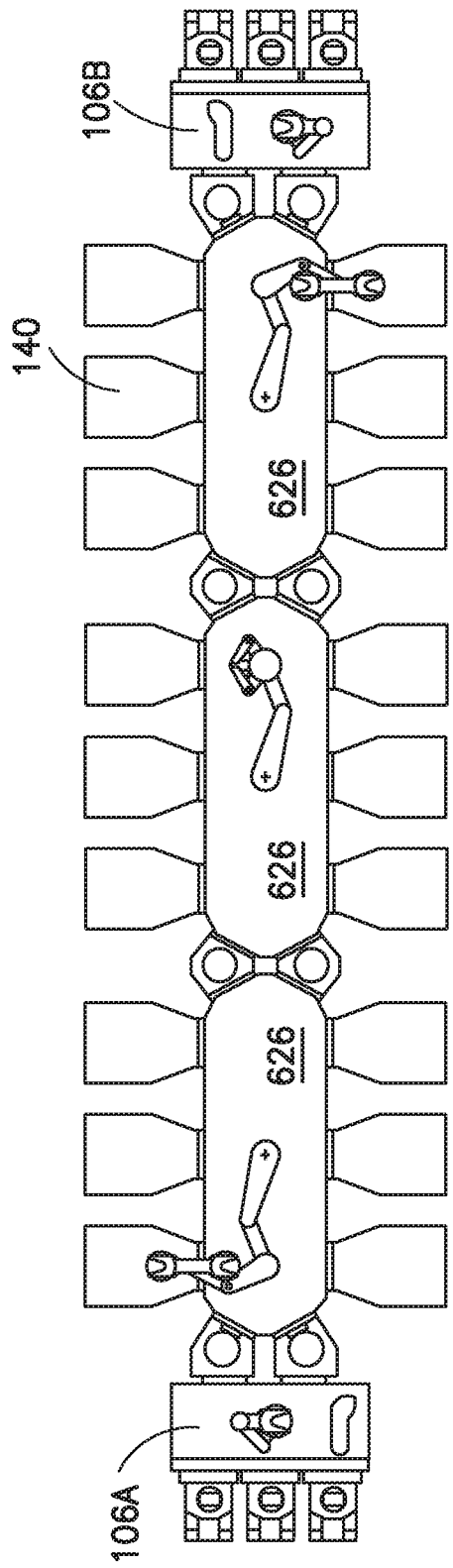

FIG. 10A illustrates a single transfer chamber configuration substantially similar to that shown in FIG. 6, however in FIG. 10A transfer chamber 626 is illustrated. FIG. 10B illustrates a tandem transfer chamber configuration where two transfer chambers 625 are coupled together by a single load lock 1002. FIG. 10C illustrates yet another configuration where two transfer chambers 625, 626 are coupled together by two load locks 1002A, 1002B. As may be realized, any suitable number of transfer chambers 625, 626 may be coupled to each other in any suitable manner to form a combined transfer chamber having any suitable length and configuration of process modules, load locks and EFEM. For example, referring to FIG. 10D three transfer chambers 626 are coupled together to form a combined linearly elongated transfer chamber such that each end of the combined linearly elongated transfer chamber has a respective mini-environment 106A, 106B, however it should be realized that transfer chambers 625 may be coupled to together or in combination with transfer chambers 626 in a manner substantially similar to that shown in FIGS. 10B and 10C to form a combined linearly elongated transfer chamber having ends with respective mini-environments 106A, 106B. In this aspect, substrates may be introduced into the processing apparatus at one end of the processing apparatus through one of mini-environment 106A, 106B and removed from the processing apparatus at the other end through the other one of mini-environment 106A, 106B. As may be realized a mini-environment substantially similar to mini-environments 106A, 106B may replace one of the processing stations 140 so that substrates may be removed from or introduced to the processing apparatus between the ends of the combined linearly elongated transfer chamber. Similarly a processing apparatus having a single linearly elongated transfer chamber such as shown in FIGS. 6 and 10A may have a mini-environment disposed at each end of the chamber 625, 626 or between the ends of the chamber 625, 626 in a manner substantially similar to that described with respect to FIG. 10D.

Figure 37:
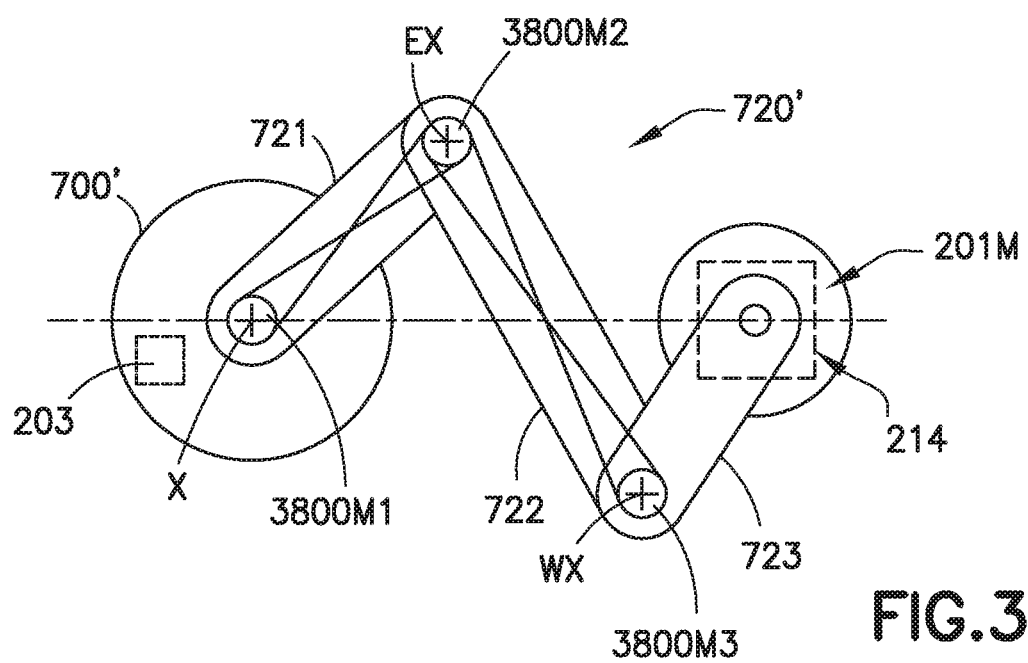
FIG. 37 is a schematic illustration of a transport apparatus in accordance with an aspect of the disclosed embodiment.

Referring now to FIG. 37, in one aspect of the disclosed embodiment the base arm may include more than two arm links 721, 722. For example, the base arm 720' may be substantially similar to that described above with respect to FIG. 7A and include drive section 700, an upper arm link 721 rotatably coupled to the drive section 700' and forearm link 722 rotatably coupled the upper arm link 721. In this aspect the base arm further includes a wrist link 723 rotatably coupled to the forearm link 722. The motor module 201M, to which the transfer arm 214 is mounted, may be coupled to an end of the wrist link 723. As noted above with respect to FIGS. 7C-7E the shoulder axis X of the base arm 720' may be mounted to a Z-drive lift shaft 203LS. The lift shaft 203LS may be drivingly coupled to a Z-axis drive 203 disposed in the drive section 700'. In a manner substantially similar to that described above with respect to FIGS. 7C-7E, motor 3800M1 may be disposed at the shoulder axis X of the base arm 720' for rotating the upper arm link 721 in a manner substantially similar to that described above. The motor 3800M2 may be disposed at the elbow axis EX of the base arm 720' where the motor may be disposed at least partly within one or more of the upper arm link 721 and the forearm link 722. The motor 3800M2 may be drivingly coupled to a drive pulley, substantially similar to pulley 3800P1, also located at the elbow axis (in a manner substantially similar to motor 3800M1 in FIGS. 7C-7E). A driven pulley, substantially similar to pulley 3800P2, may be located at the wrist axis WX of the base arm 720' and coupled to the drive pulley in any suitable manner, such as those described above. A third motor 3800M3, which may be substantially similar to motor 3800M2 may be located at the wrist axis WX of the base arm 720' such that the motor 3800M2 is disposed at least partly within one or more of the forearm link 722 and the wrist link 723. The motor 3800M3 may be coupled to the wrist link 723 in any suitable manner, such as that described above with respect to motor 3800M2 and forearm link 722 (see FIGS. 7C-7E) for rotating the wrist link 723 about the wrist axis WX. As may be realized the motors 3800M1, 3800M2, 3800M3 may be controlled in any suitable manner by any suitable controller such that the transfer arm 214 is transferred along a substantially straight line path by the base arm 720' in a manner substantially similar to that described above with respect to base arm 720.

Figure 11C:
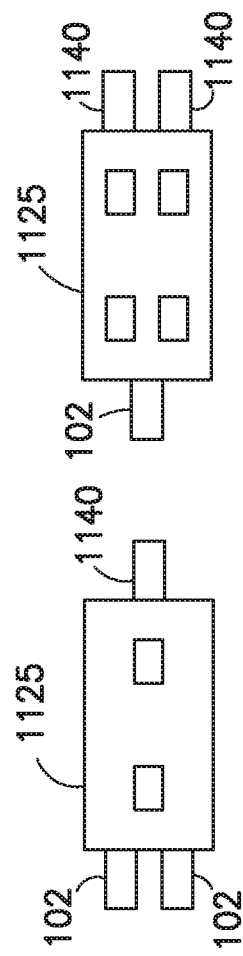
FIGS. 11A-11C are schematic illustrations of a portion of a processing apparatus in accordance with aspects of the disclosed embodiment.
Figure 11B:
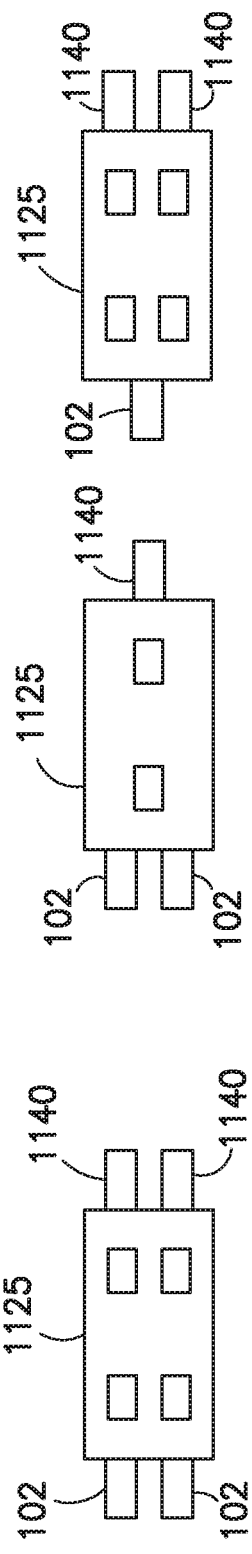
Figure 11A:
Figure 11:
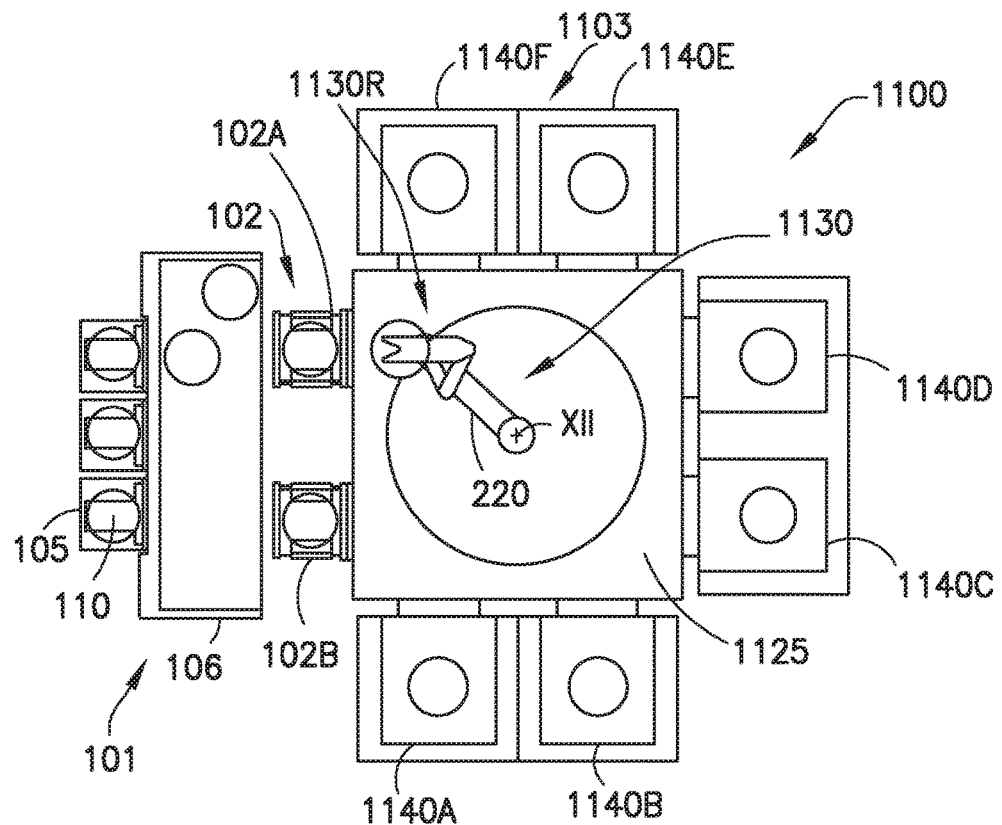
FIG. 11 is a schematic illustration of a process apparatus in accordance with aspects of the disclosed embodiment.
Figure 12:
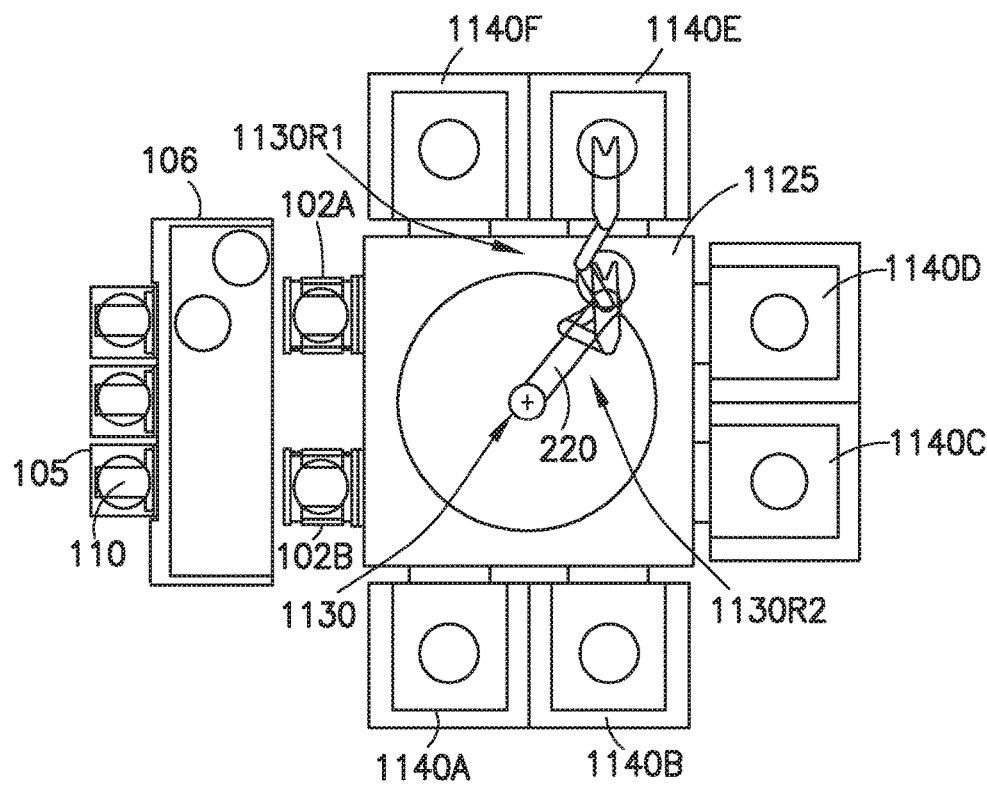
FIG. 12 is a schematic illustration of a process apparatus in accordance with aspects of the disclosed embodiment.
Figure 13:
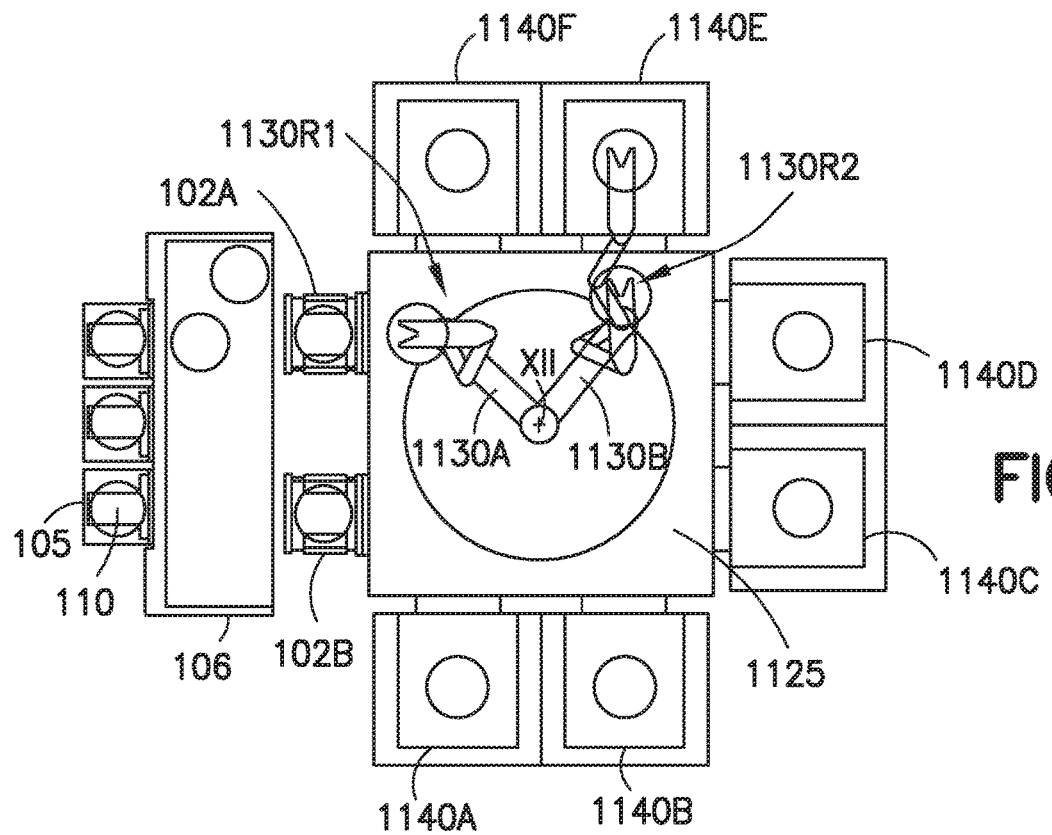
FIG. 13 is a schematic illustration of a process apparatus in accordance with aspects of the disclosed embodiment.

Referring to FIGS. 11, 12 and 13, in accordance with an aspect of the disclosed embodiment a semiconductor tool station 1100 is shown. In this aspect the tool station 1100 includes a front end 101 including, for example, load port modules 105 and a mini-environment 106 substantially similar to those described above. The tool station also includes a vacuum back end 1103 connected to the front end 101 through one or more load locks 102A, 102B. The back end 1103 may be substantially similar to back end 103 described above, but in this aspect the back end 1103 includes a substantially rectangular transfer chamber 1125. One side of the transfer chamber 1125 is connected to the front end 101 through the load locks 102A, 102B and the other sides of the transfer chamber 1125 are connected to any suitable number of processing stations 1140A-1140F. In this aspect there are two processing stations connected to respective sides of the transfer chamber 1125 but in other aspects any suitable number of processing stations may be connected to each of the respective sides. In still other aspects load locks or buffer stations may be disposed in place of one or more of the processing stations to connect two or more substantially rectangular transfer chambers 1125 together in a manner substantially similar to that described above with respect to, for example, FIGS. 5B-5D and 10B-10D. It is noted that the processing stations 1140A-1140F may be substantially similar to the processing stations described above.

Referring to FIGS. 11A-11C, as may be realized, the transfer chamber 1125 may be configured so that the processing stations 1140 and load locks 102 may be connected to the transfer chamber 1125 in a stacked configuration (e.g. located one above the other) or in a two dimensional array (e.g. one above the other and side by side). For example, referring to FIG. 11A in one aspect the load locks 102 may be located one above the other (and side by side to form an array of load locks) and the processing stations 1140 may be located one above the other (and side by side to form an array of processing stations). Referring to FIG. 11B, in another aspect, the load locks 102 may be located one above the other (and side by side to form an array of load locks) and the processing stations 1140 may be located in a single horizontal row. Referring to FIG. 11C, in yet another aspect, the load locks 102 may be located in a single horizontal row and the processing stations 1140 may be located one above the other (and side by side to form an array of processing stations). In still other aspects the load locks 102 and processing stations 1140 may be connected to the transfer chamber 1125 in any suitable manner. It is noted that the load locks and/or processing stations of one or more of FIGS. 1, 3A-6, and 8A-10D may also be disposed in any combination of single rows and stacks in a manner substantially similar to that described above with respect to FIGS. 11A-11C.

The transfer robot 1130 may be substantially similar to transfer robot 130 or 630 described above and disposed within the transfer chamber 1125 so as to be rotatable about an axis of rotation X11. For exemplary purposes, the transfer robot 1130 is shown as being substantially similar to transfer robot 130. While the axis of rotation X11 is shown as being substantially centrally located within the transfer chamber 1125, it is noted that in other aspects the axis of rotation may be disposed at any suitable location within the transfer chamber 1125. It is noted that the transfer arm 1130R in FIG. 11 is illustrated as a single SCARA arm, in FIG. 12 the transfer arm 1130R1 is illustrated as a dual SCARA arm and in FIG. 13 the transfer arms 1130R1, 1130R1 are respectively illustrated as a single SCARA arm and a double SCARA all of which are substantially similar to the respective arm types described above with respect to transfer arm 214, 214'. However, in other aspects any suitable combination of transfer arm types (as described above, e.g., each robot includes a single SCARA, each robot includes a double SCARA, one robot includes a single SCARA and the other includes a double SCARA, each arm includes a frog leg arm, etc.) may be disposed on the base arm 220 of the respective transfer robots 1130A, 1130B. It is also noted that the independent rotation of the transfer arm 214 relative to the base arm 220 allows an axis of extension and retraction of a respective transfer arm to be aligned with a path extending into and out of each of the processing stations 1140A-1140F and each of the load locks 102 so that any of the transfer arms can transfer substrates to and from any of the processing stations and load locks.

Referring to FIGS. 2G, 2F and 13 more than one transfer robot may be located within any of the transfer chambers described herein. For example, in one aspect two transfer robots 1130A, 1130B are located within transfer chamber 1125 but in other aspects any suitable number of transfer robots may be located within the transfer chamber 1125. In one aspect, one transfer robot 1130A may be mounted to a top TCT (FIG. 2G) of the transfer chamber 1125 while the other transfer robot 1130B is mounted to a bottom TCB (FIG. 2G) of the transfer chamber 1125. While the axis X11 of each of the transfer robots 1130A, 1130B is illustrated as being substantially in line with each other in other aspects the axes X11 of each of the transfer robots may be horizontally spaced from one another so that the axes X11 are located on substantially opposite ends of the transfer chamber or have any suitable spatial relationship relative to each other. In another aspect, each of the transfer arms 1130A, 1130B may be coaxially arranged and connected to a common drive section 200 as shown in FIG. 2F. In this aspect the drive section would include a suitable coaxial drive shaft arrangement (and the corresponding motors) for driving at least the base arms 220, 220' where the motors for the transfer arms 214, 214' are located as described above for driving the transfer arm 214, 214'.

Figure 13A:
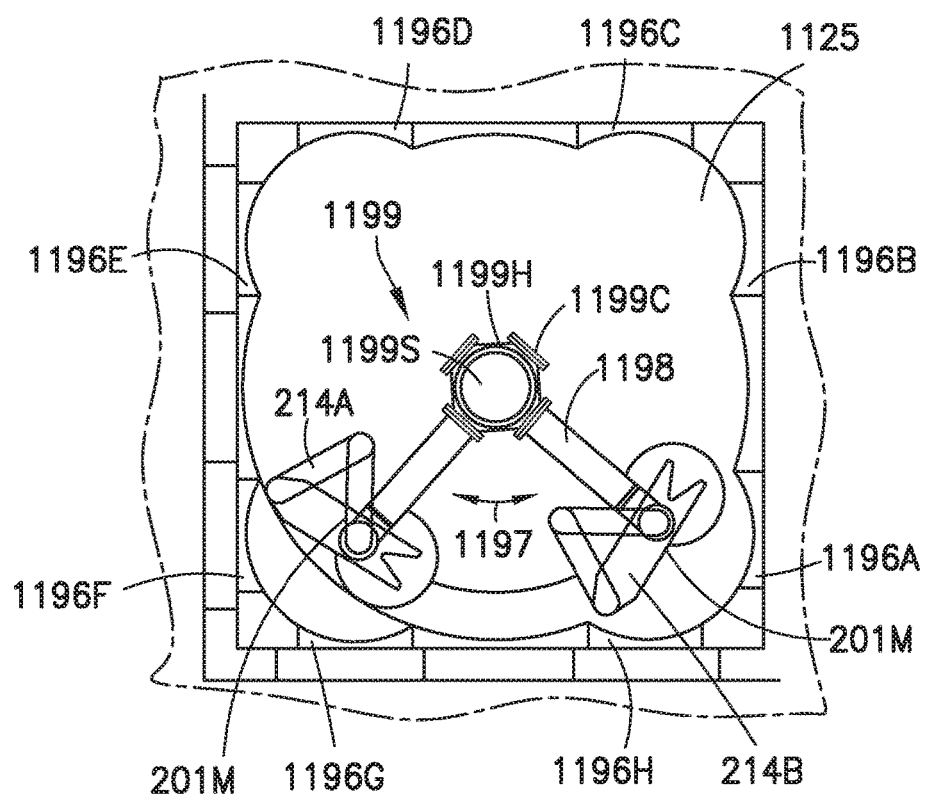
FIG. 13A is a schematic illustration of a portion of a process apparatus in accordance with aspects of the disclosed embodiment.

Referring now to FIG. 13A, a portion of a processing apparatus is shown. As can be seen in the figure, the transfer chamber 1125 has closable ports 1196A-1196H for coupling the process modules, load locks or any other suitable substrate processing equipment to the transfer chamber 1125. In this aspect the transfer apparatus 1199 within the transfer chamber 1125 may be a hub type transfer apparatus. For example, a rotating hub 1199H may be disposed at any suitable location within the transfer chamber 1125. The hub 199H may be rotatably driven in any suitable manner by any suitable drive. In this aspect the hub 1199H is shown as having four hub couplings 1199C but in other aspects the hub may have any suitable number of hub couplings. Hub spacer links 1198 (which may be substantially similar to spacer link 722S described above) may be coupled a respective one of the hub couplings 1199C. One end of the hub spacer link 1198 is coupled to the hub coupling 1199C and the other end of the hub spacer link 1198 may be coupled to a motor module 201M to which any suitable transfer arm 214A, 214B (which may be substantially similar to the transfer arms described herein) is mounted. The hub 1199H may be rotatably indexed in the direction of arrow 1197 to move the transfer arms 214A, 214B from one pair of ports to another pair of ports where, in this aspect, the pairs of ports are disposed at the corners of the transfer chamber 1125. A transfer arm 214A, 214B located at a desired port may be extended and retracted by the motor module 201M for transferring substrates to and from the transfer chamber 1125. In other aspects the transfer arms 214A, 214B may be positioned to access a single port. In one aspect a substrate holding station 1199S may be disposed on the hub 1199H. The substrate holding station 1199S may be a buffer, an aligner or any other suitable wafer holding station. The substrate holding station may allow for wafer transfer between the transfer arms 214A, 214B.

Figure 17:
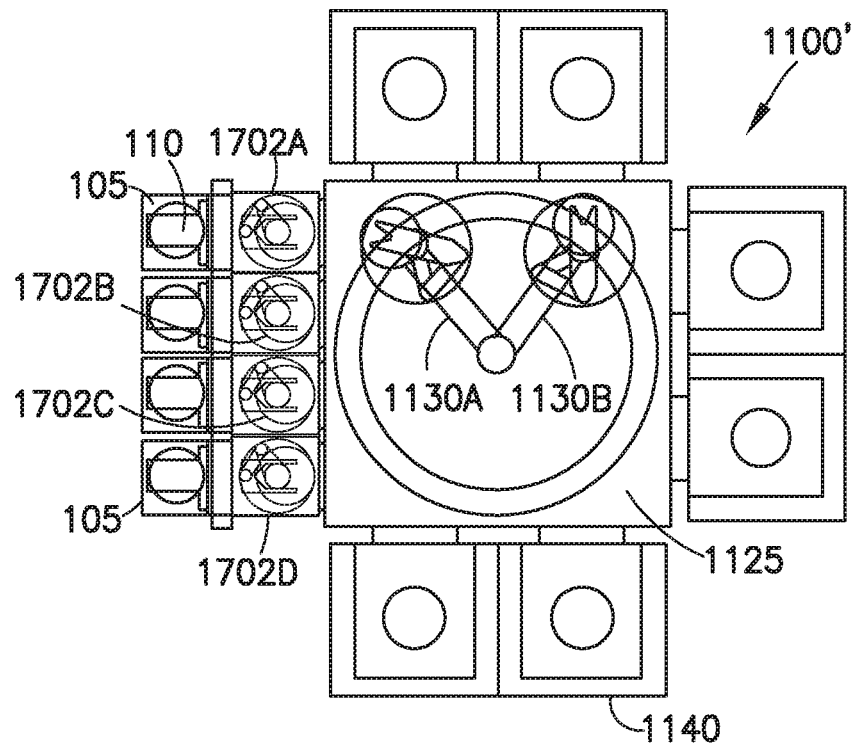
FIG. 17 is a schematic illustration of a process apparatus in accordance with aspects of the disclosed embodiment.

Referring also to FIG. 17 a semiconductor tool station 1100' substantially similar to a semiconductor tool station 1100 is shown. However, in this aspect there are four load locks 1702A-1702D coupled to the transfer chamber 1125. In other aspects any suitable number of load locks may be coupled to the transfer chamber 1125. As can be seen in FIG. 17, each of the load locks 1702A-1702D may include a transfer robot and may be coupled substantially directly to a respective substrate cassette 110 disposed on a respective load port 105. It is noted that the substrate cassette 110 may be configured so that an interior of the substrate cassette 110 is maintained at a vacuum when coupled to the load lock 1702A-1702D or the load lock may be configured to cycles its internal environment each time a substrate is transferred between the cassette 110 and the transfer chamber 1125.

Figure 14:
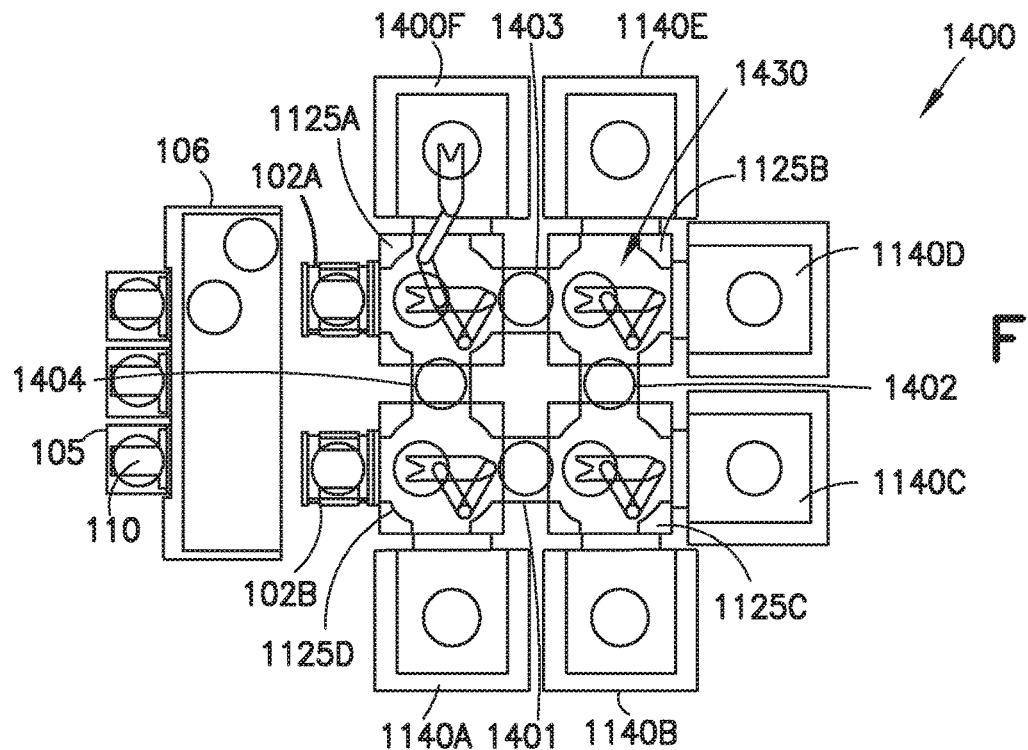
FIG. 14 is a schematic illustration of a process apparatus in accordance with aspects of the disclosed embodiment.

Referring now to FIG. 14 a semiconductor tool station 1400 is shown. The tool station 1400 may be substantially similar to tool station 1100 described above, however in this aspect the transfer chamber is formed by individual transfer chambers 1125A-1125D that are rectilinear arranged for transporting substrates between the load locks 102A, 102B and the processing stations 1140A-1140F. In this aspect there are four transfer chambers 1125A-1125D communicably coupled to each other through load locks and/or buffer stations 1401-1404 to form a two-by-two array or grid of transfer chambers. In other aspects any suitable number of transfer chambers may be provided and coupled to each other to collectively form the rectilinear transfer chamber of any suitable size (e.g. an N×M grid of transfer chambers where N and M are whole numbers). As may be realized, the tool station 1400 (as well as the other tool stations described herein) may include multiple levels of substrate holding stations, as described with respect to FIGS. 11A-11C, so that the grid is a three dimensional grid (e.g. an N×M grid of transfer chambers having Y vertically spaced levels of substrate holding stations). Each transfer chamber may be modular in a manner substantially similar to that described in U.S. patent application Ser. No. 11/442,511 filed May 26, 2006 and Ser. No. 11/679,829 filed Feb. 27, 2007 and U.S. Pat. No. 7,458,763, the disclosure of which are incorporated by reference herein in their entireties. It is noted that where load locks communicably couple the transfer chambers 1125A-1125D the internal environment of each transfer chamber can be selectively sealed from the internal environments of the other transfer chambers. As may be realized, each transfer chamber 1125A-1125D may include a transfer arm 1430 substantially similar to arm 214 described above. The transfer arms may be configured to transfer substrates between the transfer chambers through the load locks and/or buffer stations 1401-1404 or directly between the robots (e.g. robot to robot transfer). In other aspects the transfer chambers 1125A-1125D may have any suitable transfer arm for transporting substrates through the respective transfer chambers to the processing stations and/or load locks coupled thereto.

Figure 14A:
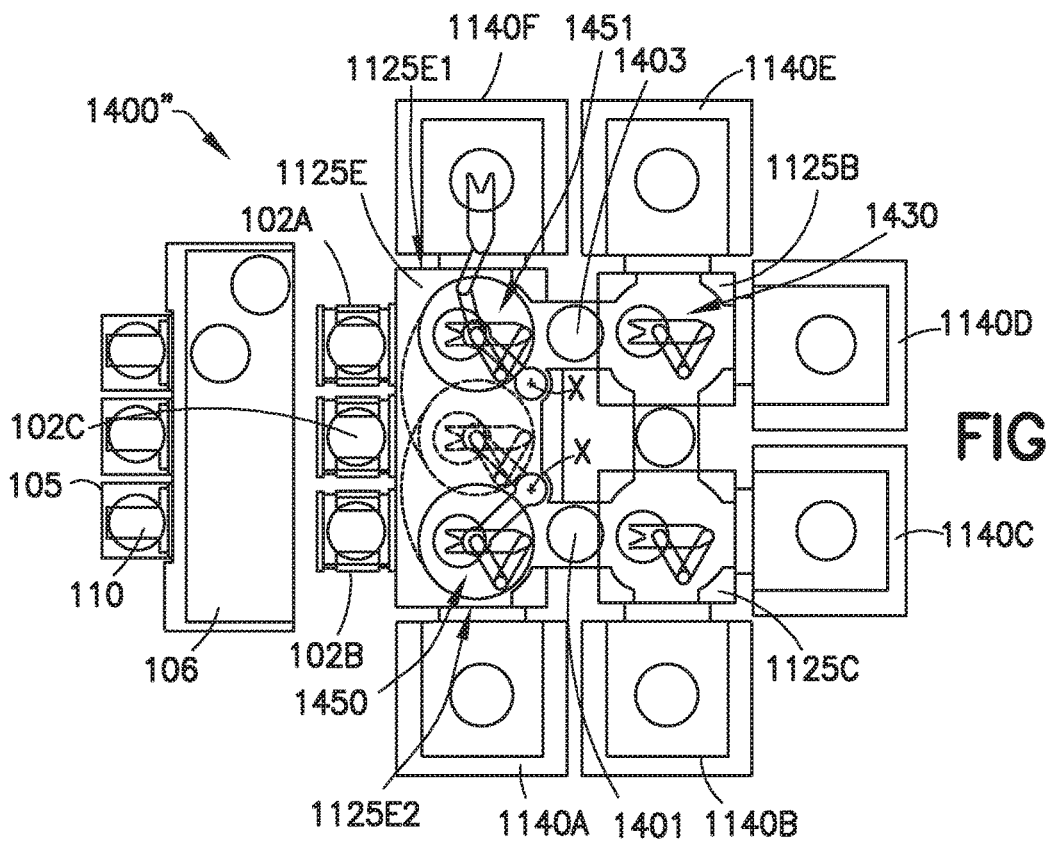
FIG. 14A is a schematic illustration of a process apparatus in accordance with aspects of the disclosed embodiment.

Referring to FIG. 14A a semiconductor tool station 1400" substantially similar to semiconductor tool station 1400 is shown. In this aspect two of the transfer chambers 1125A, 1125D are substituted with transfer chamber 1125E. Transfer chamber 1125E includes two transfer robots 1450, 1451 in a single chamber. The transfer robots 1450, 1451 may be substantially similar to those described above. In one aspect the transfer arm on one or more of the transfer robots 1450, 1451 (or any other one(s) of the transfer arm(s) described herein) may have unequal length arm links (e.g. the upper arm is shorter than the forearm or vice versa) in a manner substantially similar to that described in U.S. patent application Ser. No. 11/179,762 filed on Jul. 11, 2005, the disclosure of which is incorporated by reference herein in its entirety. Here the transfer chamber 1125E includes two ends 1125E1, 1125E2 and sides extending between the ends 1125E1, 1125E2. The transfer chamber 1125E is communicably coupled to three load locks 102A-102C on one side and is communicably coupled to the two transfer chambers 1125B, 1125C on the other side. In other aspects, there may be more or less than three load locks communicably coupled to the side of the transfer chamber and more or less than two transfer chambers communicably coupled to the other side of the transfer chamber. The transfer chambers 1125B, 1125C may be coupled to the transfer chamber 1125E in any suitable manner such as through load locks 1401, 1403 or through any suitable buffer module. As may be realized the transfer robots 1450, 1451, 1430 may be configured to transfer substrates directly between robots (e.g. a robot to robot handoff) or through the use of any suitable substrate holding station such as a loadlock or buffer station. One or more processing stations 1140A, 1140F may be located on each of the ends 1125E1, 1125E2 of the transfer chamber 1125E. The two robots 1450, 1451 may be disposed in the transfer chamber 1125E so that their respective drive axes X are horizontally spaced from one another so that one arm 1451 serves a first portion of the transfer chamber (e.g. load locks 102A, 102C, 1403 (e.g. transfer chamber 1125B) and processing station 1140F) while the other arm 1450 serves a second portion of the transfer chamber (e.g. load locks 102C, 102B, 1401 (e.g. transfer chamber 1125C) and processing station 1140A). As may be realized the first and second portion of the transfer chamber 1125E may overlap but in other aspects the first and second portions may not overlap. In still other aspects the transfer chamber 1125E may include a single transfer robot, similar to transfer robot 630 that is configured so that the transfer arm traverses the length of the transfer chamber 1125E for accessing the substrate holding stations and/or other transfer chambers communicably coupled to the transfer chamber 1125E.

Figure 19:
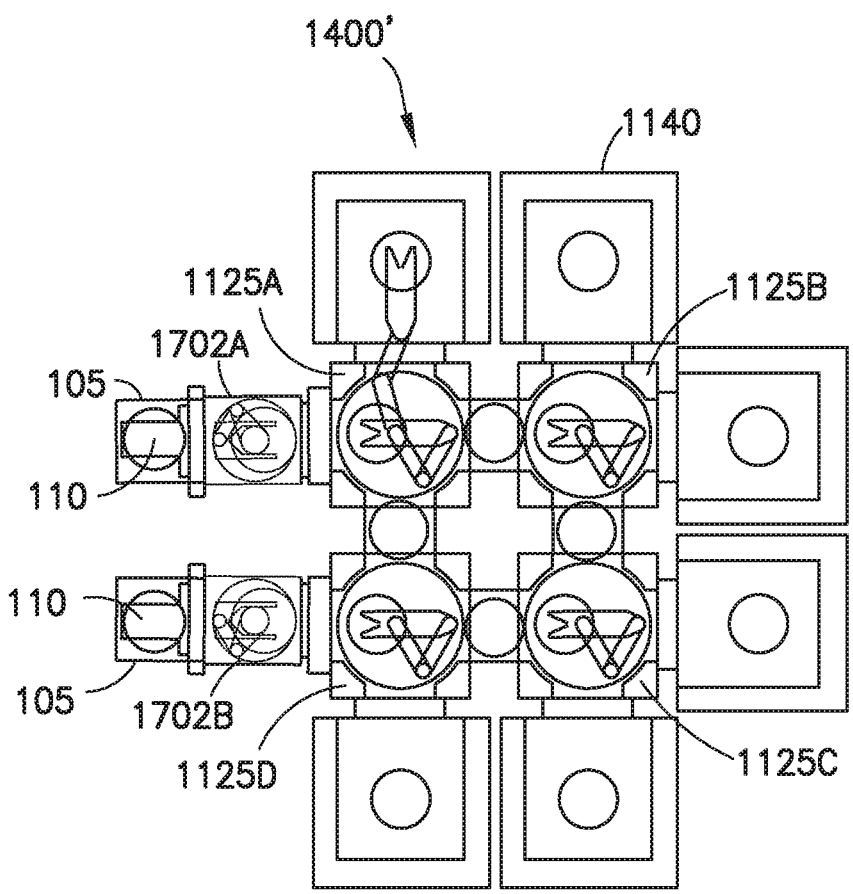
FIG. 19 is a schematic illustration of a process apparatus in accordance with aspects of the disclosed embodiment.
Figure 19A:
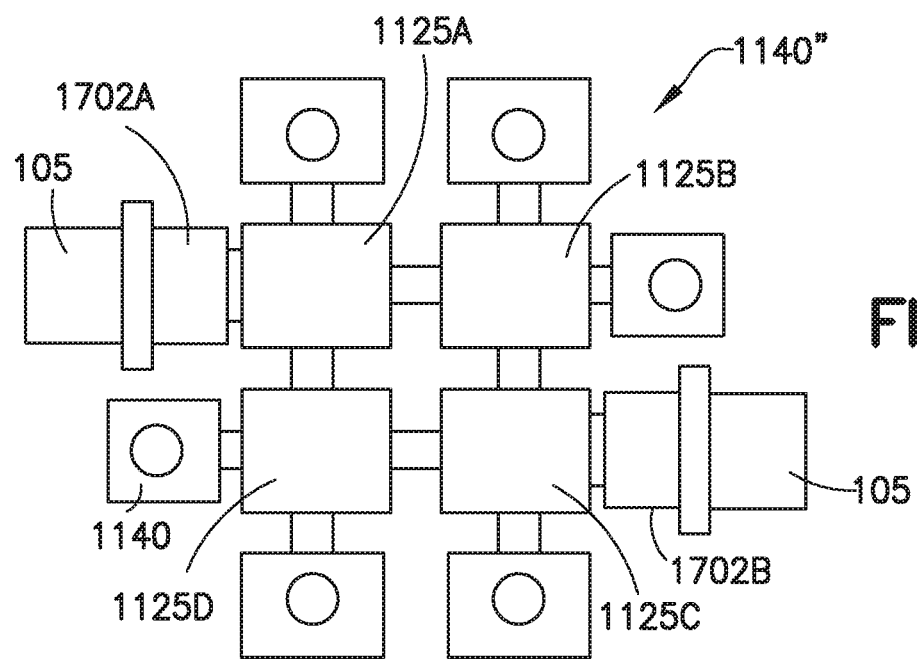
FIG. 19A is a schematic illustration of a process apparatus in accordance with aspects of the disclosed embodiment.

Referring also to FIG. 19 a semiconductor tool station 1400' substantially similar to semiconductor tool station 1400 is shown. However, in this aspect there are two load locks 1702A, 1702B communicably coupling the rectilinear transfer chamber to substrate cassettes 110 located at a respective load port 105 in a manner substantially similar to that described above with respect to FIG. 17. As can be seen in FIG. 19, each of the load locks 1702A, 1702B may include a transfer robot, also in a manner substantially similar to that described above with respect to FIG. 17. It is noted that additional load locks may be substituted for processing stations, and vice versa, so that substrates can be inserted and/or removed from the tool station 1400' on any side or sides of the tool station 1400'. For example, referring to FIG. 19A, the processing stations 1140 and load locks 1702A, 1702B are arranged so that the load locks 1702A, 1702B are disposed on opposite sides of the tool station 1140". In other aspects the load locks and processing stations may have any suitable arrangement.

Figure 15:
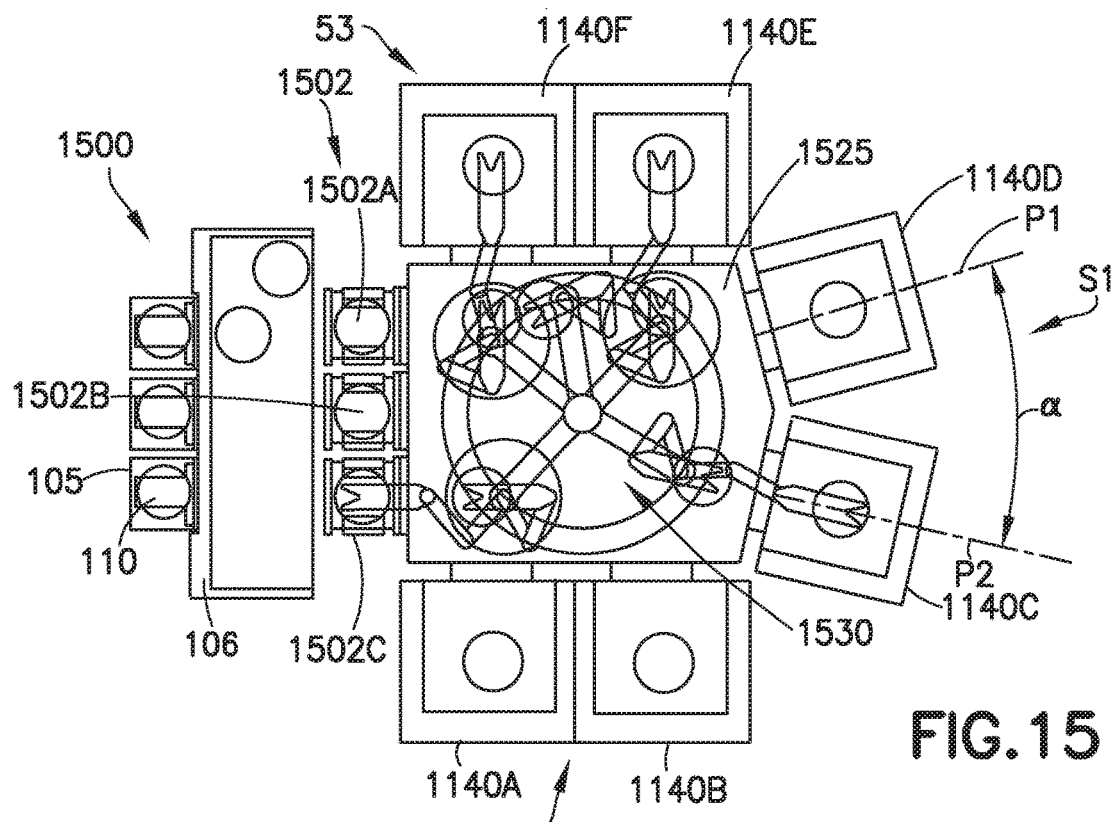
FIG. 15 is a schematic illustration of a process apparatus in accordance with aspects of the disclosed embodiment.
Figure 18:
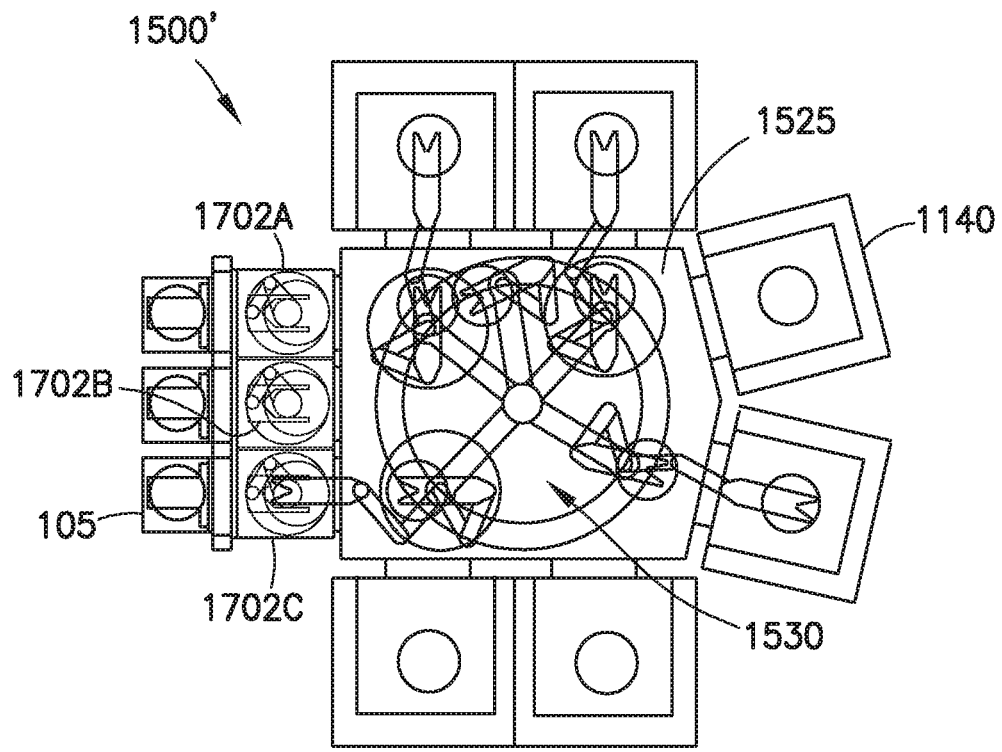
FIG. 18 is a schematic illustration of a process apparatus in accordance with aspects of the disclosed embodiment.

Referring now to FIG. 15 a semiconductor tool station 1500 is illustrated in accordance with an aspect of the disclosed embodiment. The tool station 1500 may be substantially similar to tool station 1100 however one side S1 of the transfer chamber 1525 includes angled surfaces configured so that substrate transfer paths P1, P2 into and out of the respective processing stations the processing stations 1140C, 1140D are angled relative to each other by any suitable angle α. As may be realized more than one side S1-S3 may include angled surfaces substantially similar to those on side S1 to form a multifaceted transfer chamber. One or more transfer robots 1530 substantially similar to those described above may be disposed within the transfer chamber 1525 for transporting substrates through the transfer chamber and between the processing stations and load locks. As noted above, the ability of the transfer arm(s) 214 of the one or more robots 1530 to rotate independently as a unit relative to base arm 220 allows an axis of extension and retraction of the transfer arm to be aligned with the transfer path into and out of any one of the processing stations and load locks regardless of the shape of each wall of the transfer chamber. FIG. 18 illustrates a semiconductor tool station 1500' substantially similar to tool station 1500. However, in this aspect shown in FIG. 18 the tool station 1500' includes three load locks 1702A-1702C that are substantially similar to those described above with respect to FIGS. 17 and 19. In other aspects the tool station 1500' may include any suitable number of load locks.

Figure 16:
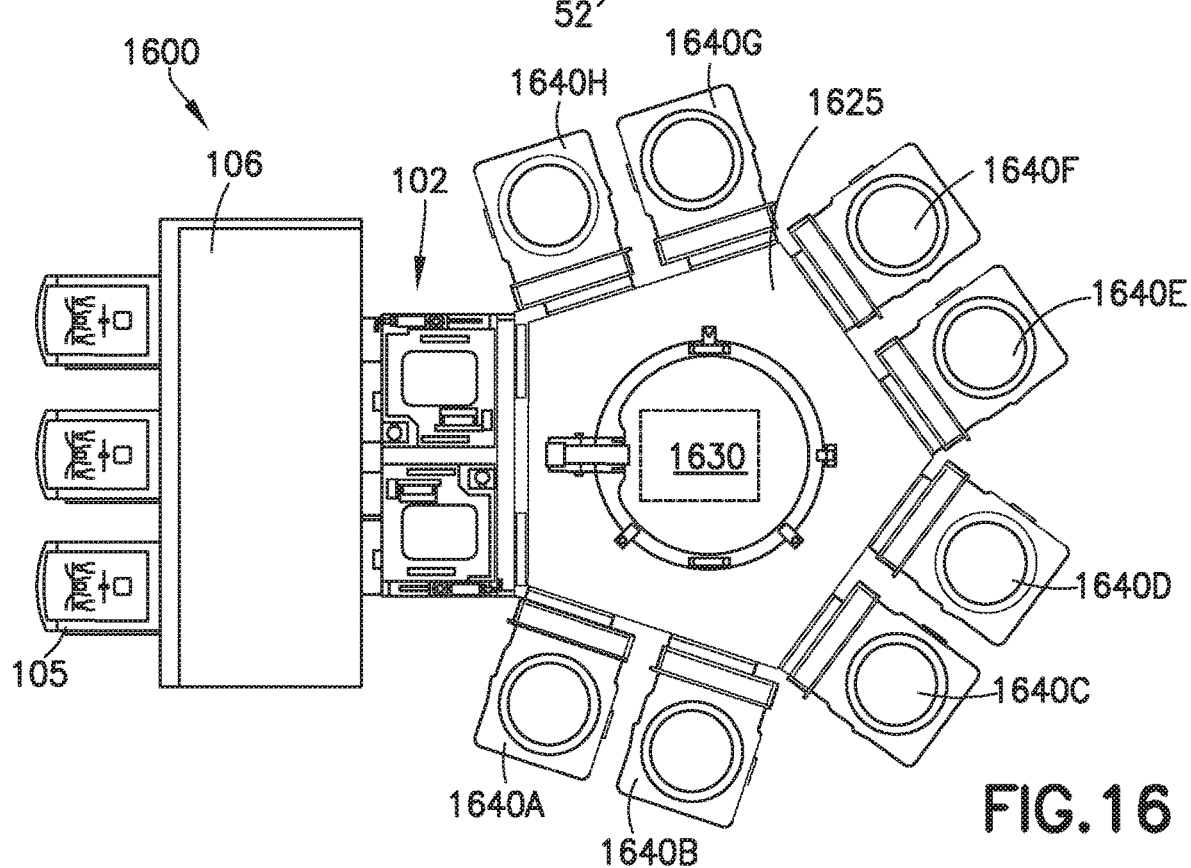
FIG. 16 is a schematic illustration of a process apparatus in accordance with aspects of the disclosed embodiment.

FIG. 16 illustrates a tool station 1600 in accordance with an aspect of the disclosed embodiment. In this aspect the tool station may be substantially similar to tool station 1100 however, the transfer chamber 1625 may have a pentagonal shape so that an increased number of processing stations 1640A-1640H may be communicably coupled to the transfer chamber 1625. As with the tool stations described above, in some aspects tool station 1600 may include multiple levels of processing stations and/or load locks (e.g. located one above the other) as described with respect to FIGS. 11A-11C so that the number of processing stations and/or load locks is further increased substantially without increasing a footprint of the tool station. One or more transfer robots 1630 substantially similar to those described above may be disposed within the transfer chamber 1625 for transporting substrates through the transfer chamber and between the processing stations and load locks. Again, as noted above, the ability of the transfer arm(s) 214 of the one or more robots 1630 to rotate independently as a unit relative to base arm 220 allows an axis of extension and retraction of the transfer arm to be aligned with the transfer path into and out of any one of the processing stations and load locks regardless of the shape of the transfer chamber.

It should be understood that while the aspects of the disclosed embodiment are illustrated with one or multiple cluster transfer chambers, in other aspects the transfer chambers may have any suitable numbers of processing station/load lock clusters. Further, while the base arm of the aspects of the disclosed embodiment are illustrated with one base link (FIGS. 2A and 17) and two base links (FIG. 7A), in other aspects the base arm may have any suitable number of links for allowing a shoulder axis SX of the base arm (about which the transfer arm 214 is mounted) to extend any suitable distance for transporting the transfer arm 214 along a length of the linearly elongated transfer chambers 125, 126, 625, 626 and/or for transporting the transfer arm(s) 1130R, 1130R1, 1130R2, 1130R3 around an axis of rotation in a substantially rectangular transfer chamber 1125, 1525 and/or a substantially pentagonal transfer chamber 1625 (or other suitable multi-sided transfer chamber).

Figure 20B:
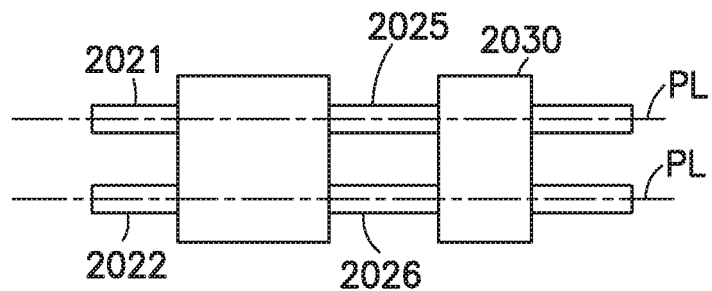
Figure 20C:
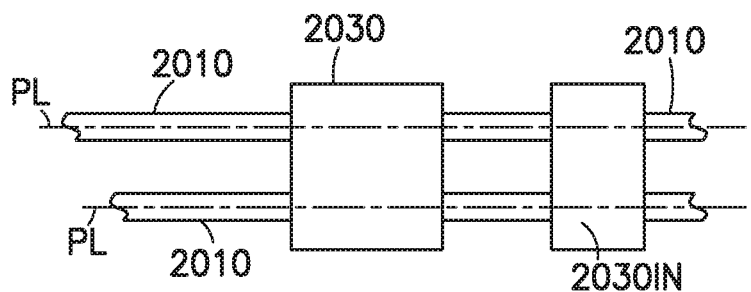
Figure 20D:
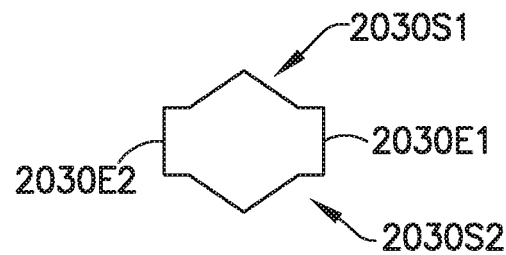
Figure 20E:
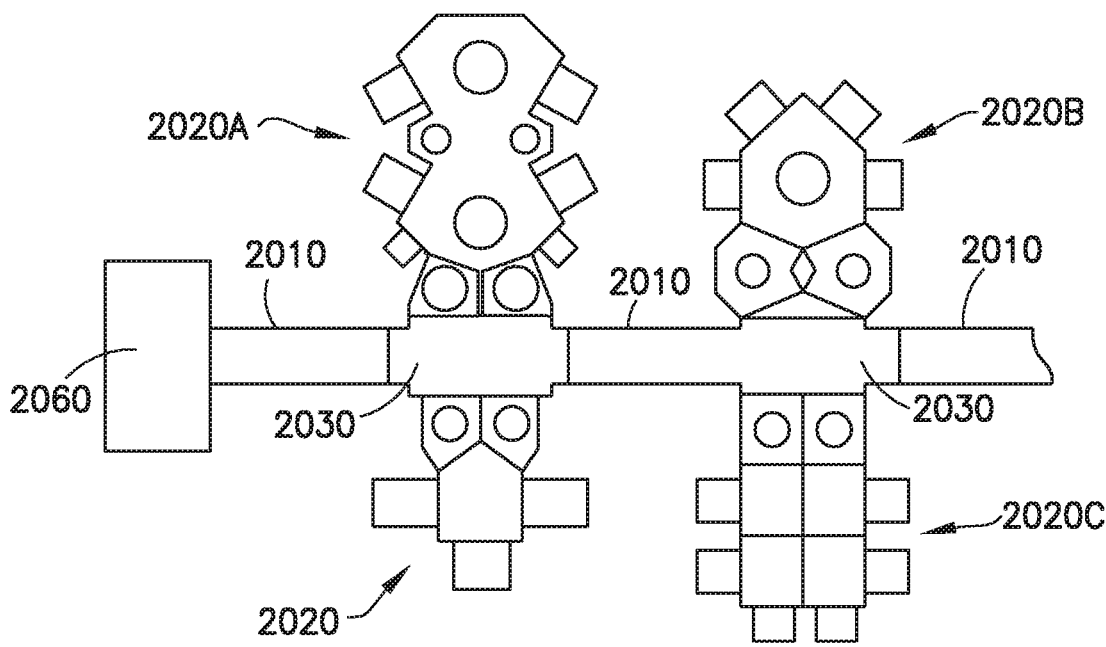

Referring now to FIG. 20A a schematic illustration of a processing apparatus 2000 is shown in accordance with aspects of the disclosed embodiment. Also referring to FIGS. 20E, 34A and 34B, generally the processing apparatus 2000 includes one or more processing tool assemblies/modules 2020 connected to one or more other processing tool modules 2020A, 2020B, 2020C and/or other suitable substrate processing equipment, such as an EFEM or batch loader interface 2060 by one or more vacuum tunnels 2010, 2010A, 2010B, 2050. The processing tool modules may be existing or otherwise "off the shelf" processing/cluster tools provided by a variety of original equipment manufacturers. As can be seen in FIG. 20E the processing tool modules 2020, 2020A, 2020B may have a cluster configuration or the processing tool modules 2020C may have a linear configuration or any suitable combination thereof. Each of the processing/cluster tools may have different predetermined processing characteristics for processing the substrates. The aspects of the disclosed embodiments allow these existing processing tool modules to be communicably connected to each other in, for example, an opposing configuration by, for example an automation module 2030, where substrates are transferred into the opposing processing tool modules through the automation module with a single touching of the substrate as will be described below. As will also be described below the processing tools may be connected to each other in a substantially linear arrangement such as by transport tunnels 2010A, 2010B, 2050.

It should be understood that while the "tunnels" 2010A, 2010B, 2050 are described herein as vacuum tunnels having a vacuum atmosphere, in other aspects the "tunnels" may have any suitable atmosphere therein such as for example, an inert gas atmosphere, a non-vacuum atmosphere, a vacuum atmosphere or any combination thereof. It should also be understood that in other aspects one or more of the modules (e.g. vacuum module, automation module, orientation module, interface module, etc., which will be described below) forming the "tunnel" may be sealable from other modules in the tunnel in any suitable manner (e.g. such as with a gate valve that allows transfer carts to pass between modules) such that one or more of the modules may have a different atmosphere (such as those noted above) than other modules in the tunnel.

The processing tool modules 2020 may include one or more processing chambers 2021-2023, a transfer chamber 2024 and load locks 2025, 2026. In one aspect the processing tool modules 2020 may be substantially similar to those described above with respect to FIGS. 3A-6 and 8A-19A while in other aspects the processing tool modules may have any suitable configuration and/or components. Referring also to FIG. 20B, in one aspect the processing tool modules 2020 and other modules/components of the processing apparatus, such as the automation modules 2030, may be configured such that the processing chambers 2022 and/or load locks 2025, 2026 may be coupled to ports of the modules in a stacked configuration (i.e. the processing chambers 2022 and/or load locks 2025, 2026 are disposed in one or more vertically spaced or stacked planes PL). In other aspects the processing chambers may not be stacked but rather arranged in a common plane. Referring to FIG. 20C, the automation modules 2030 and EFEMs 2060 may also be configured with stacked transfer planes PL so that the vacuum tunnels 2010 may be arranged in the different planes PL. It is also noted that substrate indexers/elevators 20301N may be disposed in the tunnel to elevate/lower substrates into/out of the tunnel. As may be realized, where the tunnels are stacked the indexers/elevators 20301N may connect the stacked tunnels to allow substrate transfer between the stacked tunnels.

An automation module 2030 configured to transfer one or more wafers at substantially the same time may connect the processing tool modules 2020 to the vacuum tunnels 2010A, 2010B, 2050 in any suitable manner. The automation module may include a housing forming a chamber capable of holding a sealed environment therein and having substrate port openings through which substrates are transported in and out of the chamber. The housing of the automation module 2030 may include a first end 2030E1 and a second end 2030E2 and two sides 2030S1, 2030S2 extending between the ends. Each of the sides may have at least two substrate transport openings or connection ports 2030P1, 2030P2, 2030P4, 2030P5 (FIGS. 24A, 24B) for coupling to, for example, the load locks of the processing tool modules 2020, a vacuum tunnel an EFEM, a load port module (e.g. the load port module may be connected substantially directly to the automation module as will be described below) and/or any other suitable automation equipment (e.g. equipment for processing or otherwise handling substrates). The sides 2030S1, 2030S2 may define a mating interface for mating with a side of a process tool assembly 2020, 2020A, 2020B, 2020C. At least one side 2030S1, 2030S2 of the housing may have more than one of the connection ports 2030P1, 2030P2, 2030P4, 2030P5 in common with substrate transport openings in a side of the process tool assembly mated to the mating interface at the connection ports and defining an equipment boundary EB between the housing of the automation module 2030 and the process tool module(s) 2020, 2020A, 2020B, 2020C. It is noted that the different processing tool modules 2020, 2020A, 2020B, 2020C may have different predetermined characteristics and may be interchangeably mateable to the mating interface of the housing. It is also noted that the spacing or distance between the connection ports of the processing tool modules may vary and the automation module 2030 is configured to accommodate this variance in the distance between the connection ports of the processing tool modules at least through, for example, the reach provided by transfer robots located within the automation modules and various mounting arrangements that may couple the automation modules to the processing tool modules.

Figure 21A:
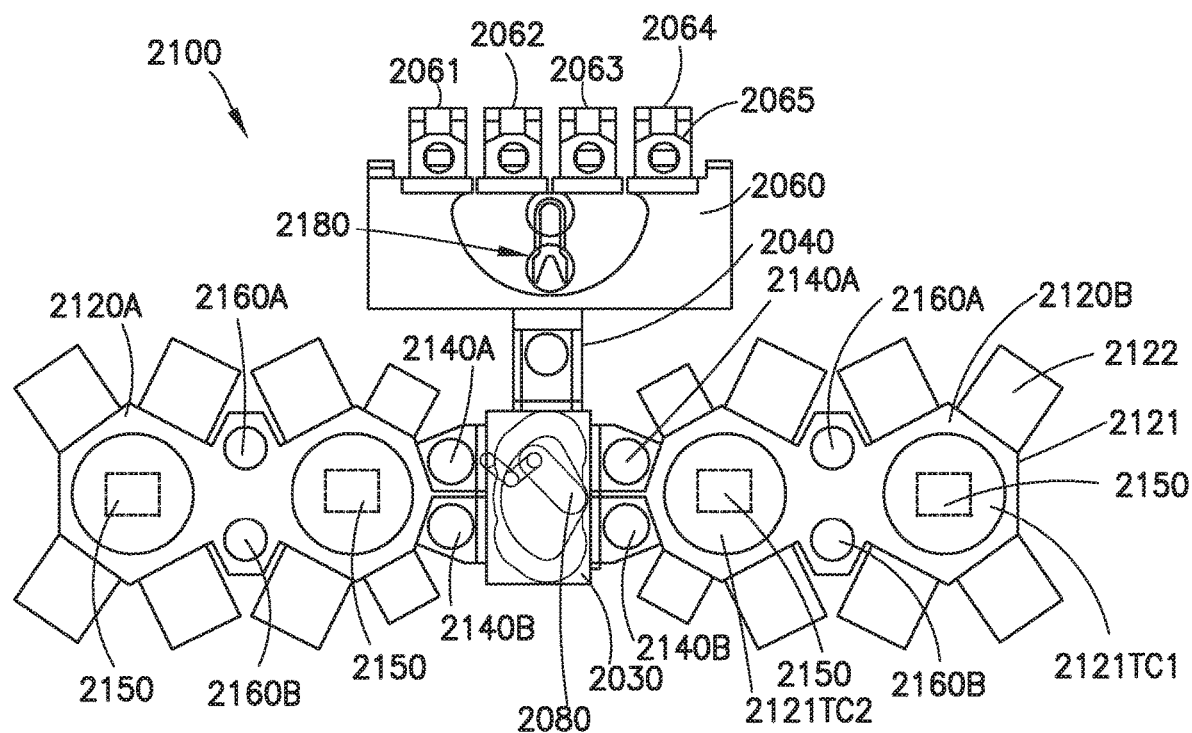
FIGS. 21A, 21B and 21C are schematic illustrations of processing apparatus in accordance with aspects of the disclosed embodiment.

It is noted that in one aspect the automation module 2030 may have any suitable shape such as having orthogonal sides (e.g. an orthogonal shape) as shown in, e.g., FIG. 21A. In other aspects the automation module 2030' may have a wedge shape where the sides of the automation module 2030' are facetted for coupling to any suitable processing tools or other automation equipment as shown in FIG. 20D. It is noted that the facetted sides of the automation module 2030' in FIG. 20D are illustrated as having a convex shape relative to an interior of the automation module 2030' but in other aspects one or more of the facetted sides may have a concave shape relative to the interior of the automation module 2030'. In still other aspects one side of the automation module may be orthogonal to the ends while the other side may be facetted as shown in FIG. 20A. As may be realized, a wedge adapter may be provided for the orthogonal shape transport chamber to allow the orthogonal shape automation module to connect to angled ports of a processing tool module. Similarly, an orthogonal adapter may be provided for the wedge shape automation module so that the wedge shape automation module can be connected to orthogonally arranged ports of a processing tool module.

At least one of the ends of the automation module 2030 may include a port 2030P3, 2030P6 (FIGS. 24A, 24B) for coupling the automation module 2030 to, for example, the transport tunnel, a load lock, load port module and/or any other suitable automation equipment (e.g. equipment for processing or otherwise handling substrates). At least one transport robot 2080, that may be substantially similar to the transport robots described above, may be disposed at least partly within the automation module 2030 for transferring one or more substrates from the transport tunnel (and/or a cart travelling in the transport tunnel) to any one of the load locks of the processing tool modules 2020 with substantially a single touching of the substrate. Where one or more components of the processing apparatus are arranged in stacked planes (such as shown in FIG. 20B) the transport robot 2080 may include sufficient Z-motion capability to provide access to each of the stacked processing planes. In one aspect the automation module 2030 may be connected to the vacuum tunnels 2010A, 2010B (or one or more EFEMs) through any suitable vacuum module 2040 or any other suitable connecting module. The vacuum module 2040 may be a pass through vacuum pod, a load lock, a buffer module, a substrate aligner module, a shuttle interface for a shuttle or cart located within the vacuum tunnels 2010A, 2010B and/or any other suitable module. In another aspect the automation module 2030 may be substantially directly coupled to the vacuum tunnel, such as vacuum tunnel 2050, so that the transfer robot 2080 within the automation module 2030 may transfer substrates directly to the vacuum tunnel, such as to the shuttle or cart within the vacuum tunnel 2050. In still other aspects, as will be described below, another processing tool module may be coupled to the automation module 2030 in place of vacuum tunnel 2050 so that opposing processing tool modules are communicably coupled to each other and the vacuum tunnel(s) 2010A, 2010B.

Referring to FIG. 21A a schematic illustration of a processing apparatus 2100 substantially similar to processing apparatus 2000 is shown. In this aspect the automation module 2030 connects opposing processing tool modules 2120A, 2120B to, for example, an EFEM 2060. The EFEM 2060 includes a housing having a controlled atmosphere therein, load ports 2061-2064 for transferring one or more substrates between substrate cassettes 2065 and the EFEM 2060, and a transfer robot 2180 configured to transfer the substrates between the cassettes 2065 and, for example, vacuum module 2040. In one aspect the transfer robot 2180 may be substantially similar to those described above while in other aspects the transfer robot may be any suitable transfer robot. The vacuum module 2040 connects the EFEM 2060 with the automation module 2030 and, in this aspect, may be a load lock configured to provide a transition between an atmosphere of the EFEM 2060 and the atmosphere of the automation module 2030 (which may be a vacuum atmosphere). In other aspects, the vacuum module 2040 may be replaced with an atmospheric module having similar features to vacuum module 2040 but configured to maintain a non-vacuum environment therein so that the atmospheric module and the tunnel interface 2030 are non-vacuum modules (e.g. the transition between non-vacuum and vacuum may occur at the load locks 2140A, 2140B when the substrates are transferred to the processing tool modules 2120A, 2120B).

Figure 24A:
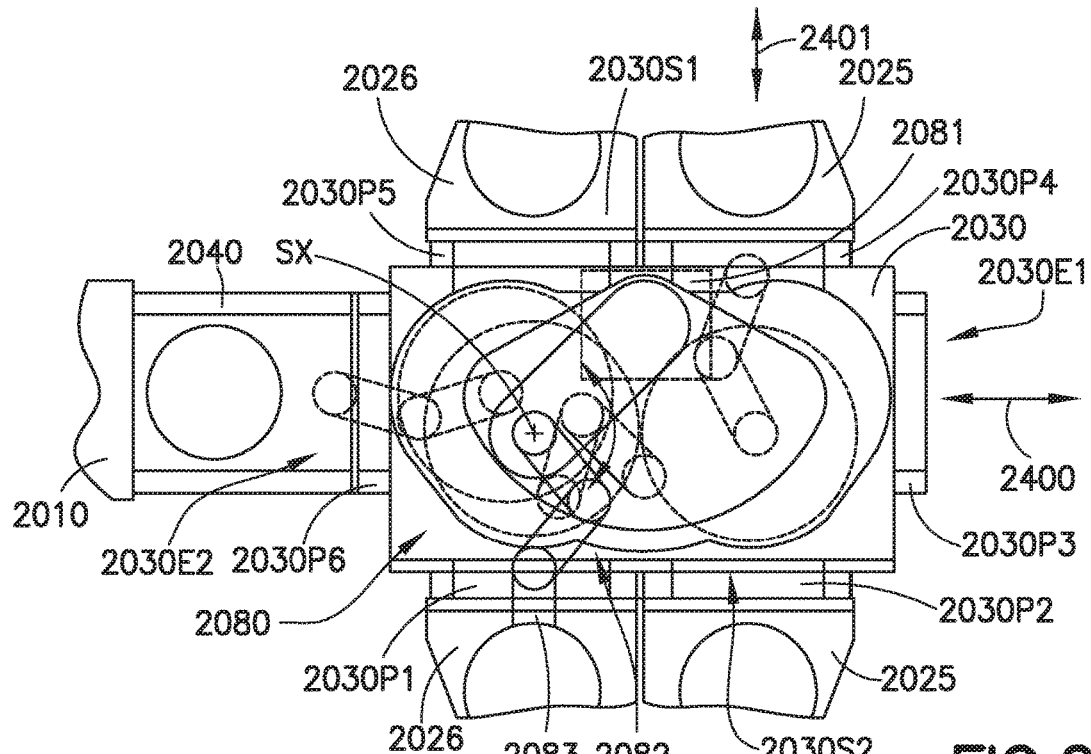
FIGS. 24A, 24B, 24C and 24D are schematic illustrations of a portion of a processing tool in accordance with aspects of the disclosed embodiment.
Figure 24B:
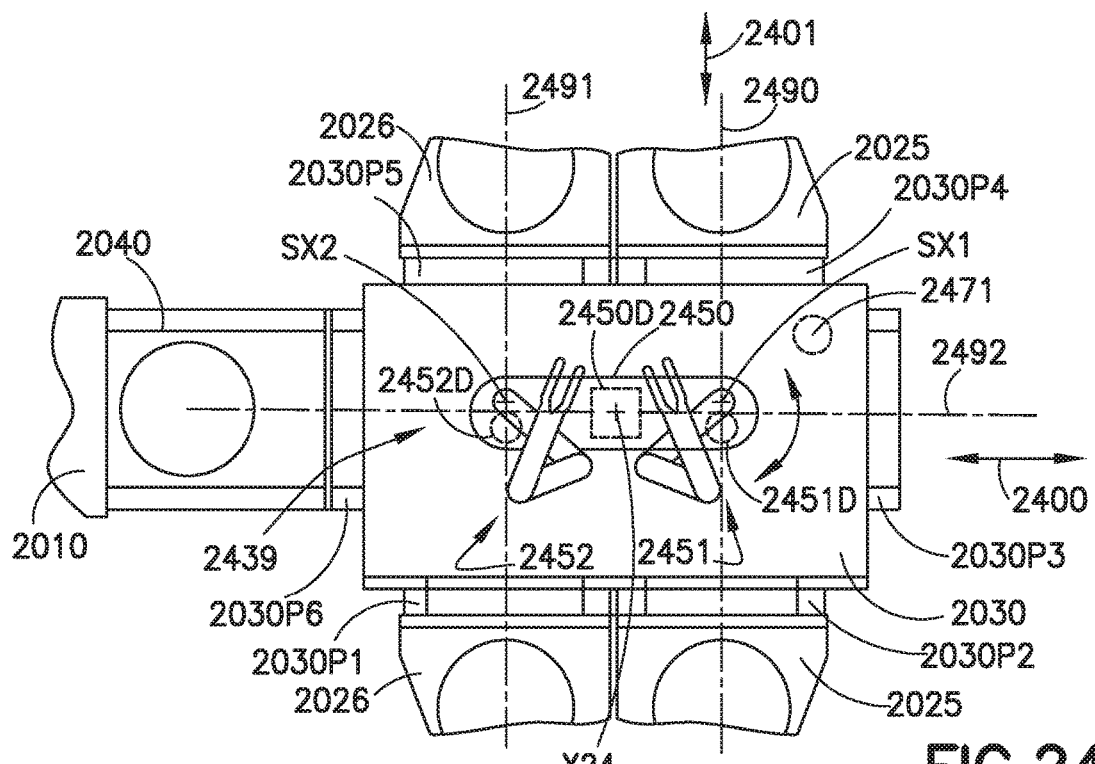

Referring also to FIG. 24A the automation module 2030, as described above, includes transfer robot 2080. In one aspect the transfer robot 2080 may be substantially similar to the transfer robots described above. The drive section 2081 of the transfer robot 2080 may also be substantially similar to drive sections 200, 700 described above. The drive section 2081 may be configured to rotate the arm(s) 2082 and end effector(s) 2083 about the shoulder axis SX as a unit so that the arm(s) 2082 can transfer substrates in the direction of arrow 2400 (e.g. along an a longitudinal axis of the automation module 2030 and/or vacuum tunnel) as well as in the direction of arrow 2401 for transferring substrates to both lateral sides of the automation module 2030 (e.g. to load locks 2025, 20206 of both of the opposing processing tool modules). Referring to FIG. 24B, in other aspects the transfer robot 2439 of the automation module 2030 may include a base link 2450 that is rotatable about axis X24. It should be understood that the transfer robot 2439 may be employed in each of the aspects of the disclosed embodiment described herein in a manner substantially similar to that described herein with respect to transfer robot 2080. The base link 2450 may be in the form of a double sided boom and may longitudinally extend in opposite directions from the axis X24 to form a substantially rigid link having two longitudinal ends that rotate around the axis X24. Any suitable transfer arm or arms 2451, 2452 including, but not limited to, selective compliant articulated robot arms (SCARA arms), frog leg arms, leapfrog arms, bi-symmetric arms, lost motion mechanical switch type arms or any other suitable arm having one or more end effectors (as described above) may be mounted to each end of the base link 2450 at a respective shoulder axis SX1, SX2.

The transfer robot 2439 may include a drive section 2450D located substantially about or proximate to axis of rotation X24 that is configured to rotate the base link 2450 about axis X24. The drive section 2450D may be any suitable drive and be connected to the base link 2450 in any suitable manner such as through any suitable transmission. A drive section 2451D, 2452D substantially similar to that described above with respect to, e.g., FIGS. 2H-2J may be located at respective ends of the base link 2450 for driving respective ones of the arms 2451, 2452. In other aspects the drive section 2451D, 2452D may be any suitable drive sections having any suitable configuration. The drive sections 2451D, 2452D may be configured to cause extension and retraction of the respective arm(s) in the directions of arrows 2400, 2401 along respective axes of extension/retraction 2490, 2491, 2492 through the ports of the automation module 2030 for picking and placing substrates from/to the load locks 2025, 2026 of the process tool modules, the carts travelling in the vacuum tunnels, or any other suitable substrate holding location connected to one of the ports. In one aspect the drive sections 2451D, 2452D may be configured to rotate their respective arms as a unit about the respective shoulder axes SX1, SX2 and drive 2450D may be configured to rotate the base link 2450 so that each arm 2451, 2452 can extend/retract along axis 2492 for transferring substrates through ports 2030P3, 2030P6. In addition to extension/retraction through both ports 2030P3, 2030P6, as can be seen in FIG. 24B the arms 2451, 2452 may be configured for substantially straight line extension and the side by side configuration of the arms 2451, 2452 may allow arm 2451 to extend through ports 2030P1, 2030P4 (with rotation of the base link 2450) and allow arm 2452 to extend through ports 2030P2, 2030P5 (with rotation of the base link 2450). In other aspects, the side by side configuration of the arms 2451, 2452 may allow arm 2451 to extend through ports 2030P2, 2030P4 (without rotation of the base link 2450 but with rotation of the arm 2451 about axis SX1) and allow arm 2452 to extend through ports 2030P1, 2030P5 (without rotation of the base link 2450 but with rotation of the arm 2451 about axis SX2).

The arms 2451, 2452 of the transfer robot 2439 may also be configured and controlled, such as by controller 120 (FIG. 1), to hand off substrates from one arm 2451, 2452 to the other arm 2451, 2452. For example, in one aspect substrates may be handed off between the arms 2451, 2452 substantially directly. In another aspect the substrates may be placed at a substrate holding location 2471 located within the automation module 2030 apart from the transfer arm 2439 by one of the arms 2451, 2452 so that the other one of the arms 2451, 2452 can pick the substrate from the holding location 2471 for transferring the substrates from one arm 2451, 2452 to the other arm 2451, 2452. In still other aspects the base arm 2450 may include a substrate holding location similar to substrate holding location 2471 (e.g. the substrate holding location is mounted to the base arm 2450) so that substrate may be transferred from one arm to the other arm in a manner substantially similar to that described above with respect to substrate holding location 2471.

Figure 24C:
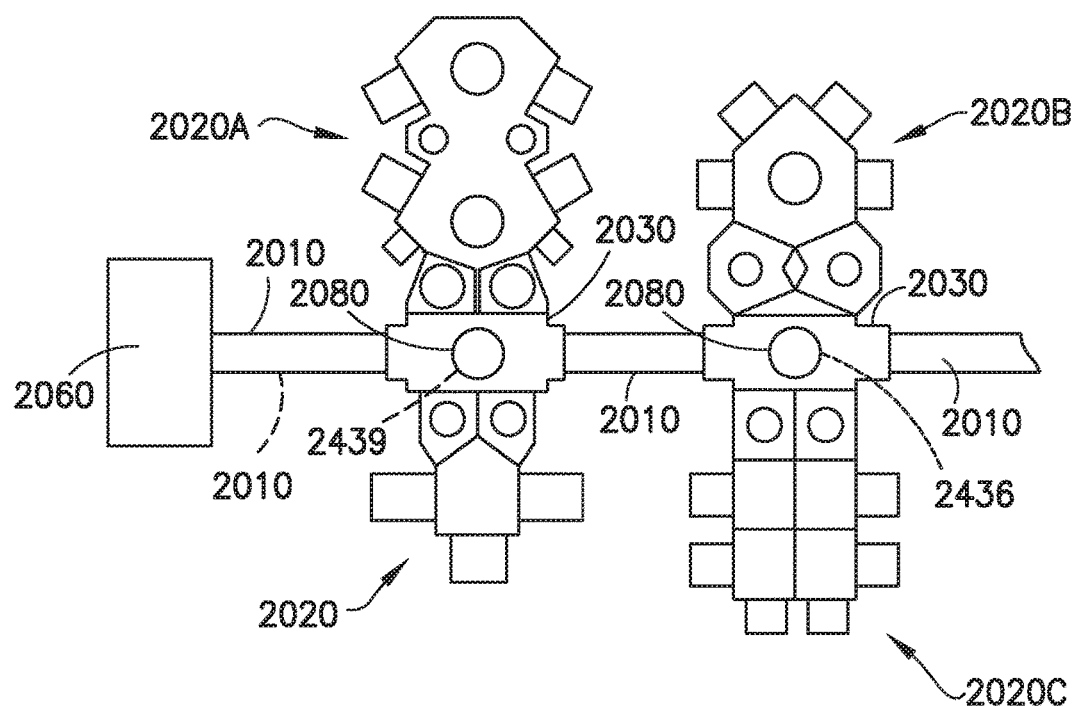
Figure 24D:
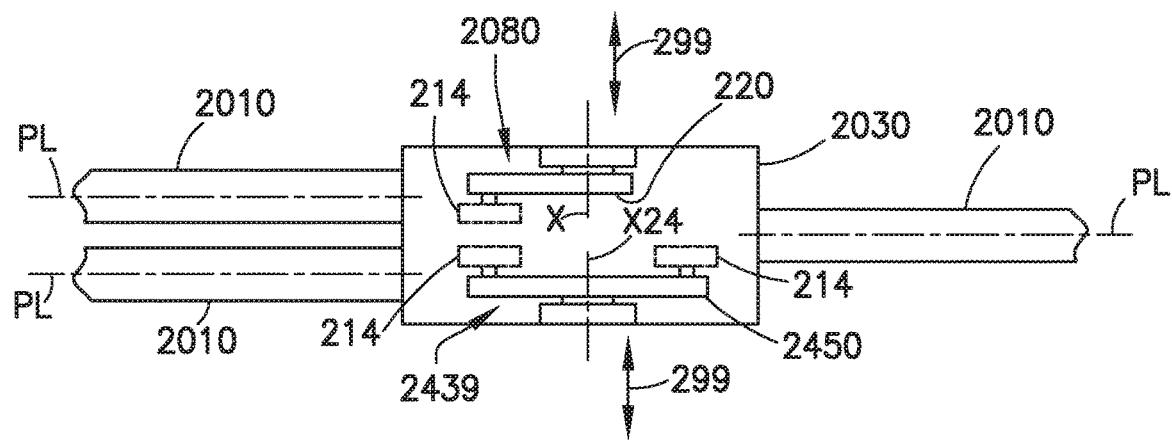
Figure 26A:
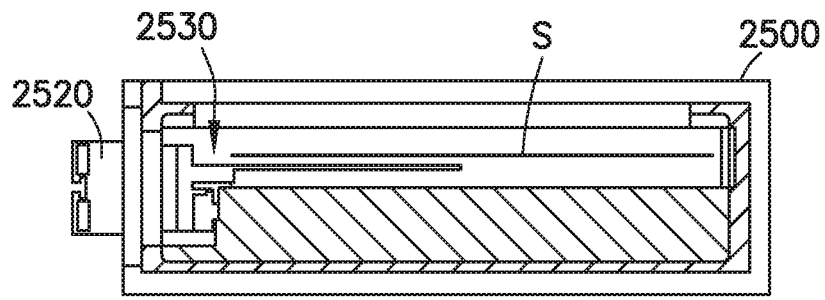
FIGS. 26A, 26B, and 26C are schematic illustrations of portions of a transport tunnel in accordance with aspects of the disclosed embodiments.
Figure 26B:
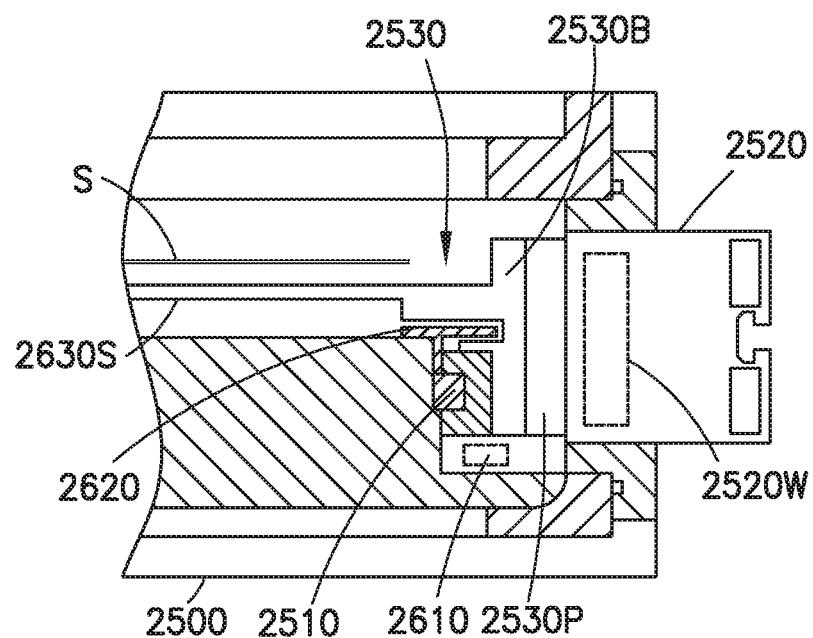
Figure 26C:
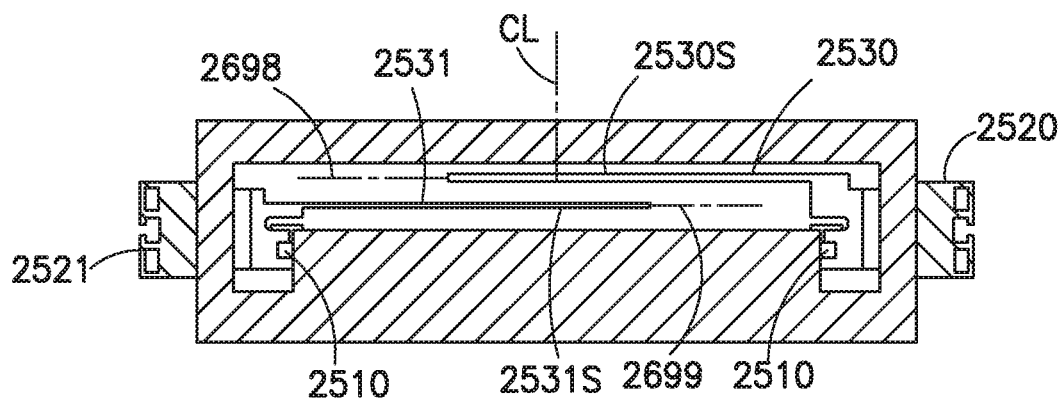

Referring to FIGS. 24C and 24D the transfer robots 2080, 2439 may be mounted within the automation module 2030 in, for example, a vertically opposing arrangement in a manner substantially similar to that described above with respect to FIG. 2G. For example, in one aspect the arm 2080 may be mounted to a top of the automation module 2030 while the arm 2439 is mounted to a bottom of the automation module 2030 or vice versa. In other aspects, a first transfer arm 2080 may be mounted to the top of the automation module and a second arm 2080 may be mounted to the bottom of the automation module. In still other aspects, a first transfer arm 2439 may be mounted to the top of the automation module and a second arm 2439 may be mounted to the bottom of the automation module. As may be realized, each the transfer arms 2080, 2439 may be movable in the direction of arrow 299 and controlled in any suitable manner, such as by controller 120, for aligning the substrate carried by the transfer arms 2080, 2439 with the transfer planes PL of each of the vacuum tunnels 2010 as well as the transfer planes of the processing tool modules 2020, 2020A, 2020B, 2020C. The transfer robots 2080, 2439 may also be controlled in any suitable manner for transferring substrates between the automation module 2030 and any one or more of the tunnels 2010 (e.g. by reaching into the tunnel for transferring substrates to/from a cart and/or for transfer of a substrate to/from a substrate holder on the cart that is extended into the automation module) and processing tool modules 2020, 2020A, 2020B, 2020C. As may be realized the transfer robots may be rotated about their respective axes X, X24 so that one transfer robot 2080, 2439 does not interfere with the operation of the other transfer robot 2080, 2439.

The processing tool modules 2120A, 2120B may be coupled to the lateral sides of the automation module 2030 so that the processing tool modules 2120A, 2120B (or any other suitable modules capable of holding or otherwise processing substrates) are arranged in an opposing configuration. The processing tool modules 2120A, 2120B may be substantially similar to those described above. In other aspects the processing tool modules may have any suitable configuration. For example, processing tool modules 2120A, 2120B may include a transfer module 2121 that includes one or more transfer chambers 2121TC1, 2121TC2 each having processing chambers 2122 coupled thereto. Each transfer chamber 2121TC1, 2121TC2 may include any suitable transfer robot 2150 such that substrates are transferred between the transfer chambers 2121TC1, 2121TC2 through direct robot to robot transfer or through a substrate holding station 2160A, 2160B (which may be a buffer, aligner, heater, cooler or any other suitable holding station). In one aspect the transfer module 2121 may be connected to the automation module 2030 by, for example, load locks 2140A, 2140B, while in other aspects the transfer module 2121 may be coupled substantially directly to the automation module 2030.

Figure 21B:
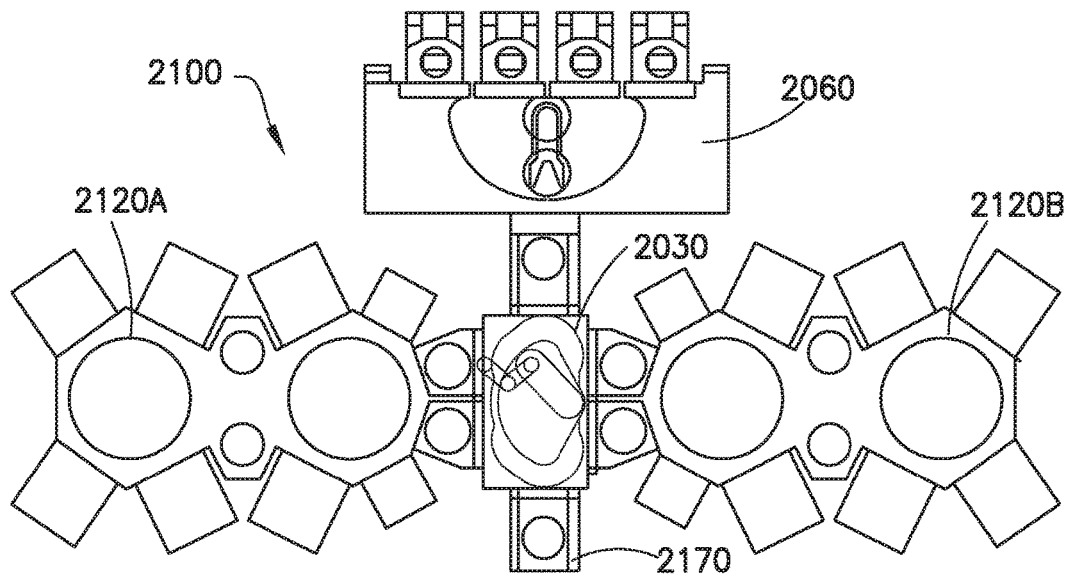
Figure 21C:
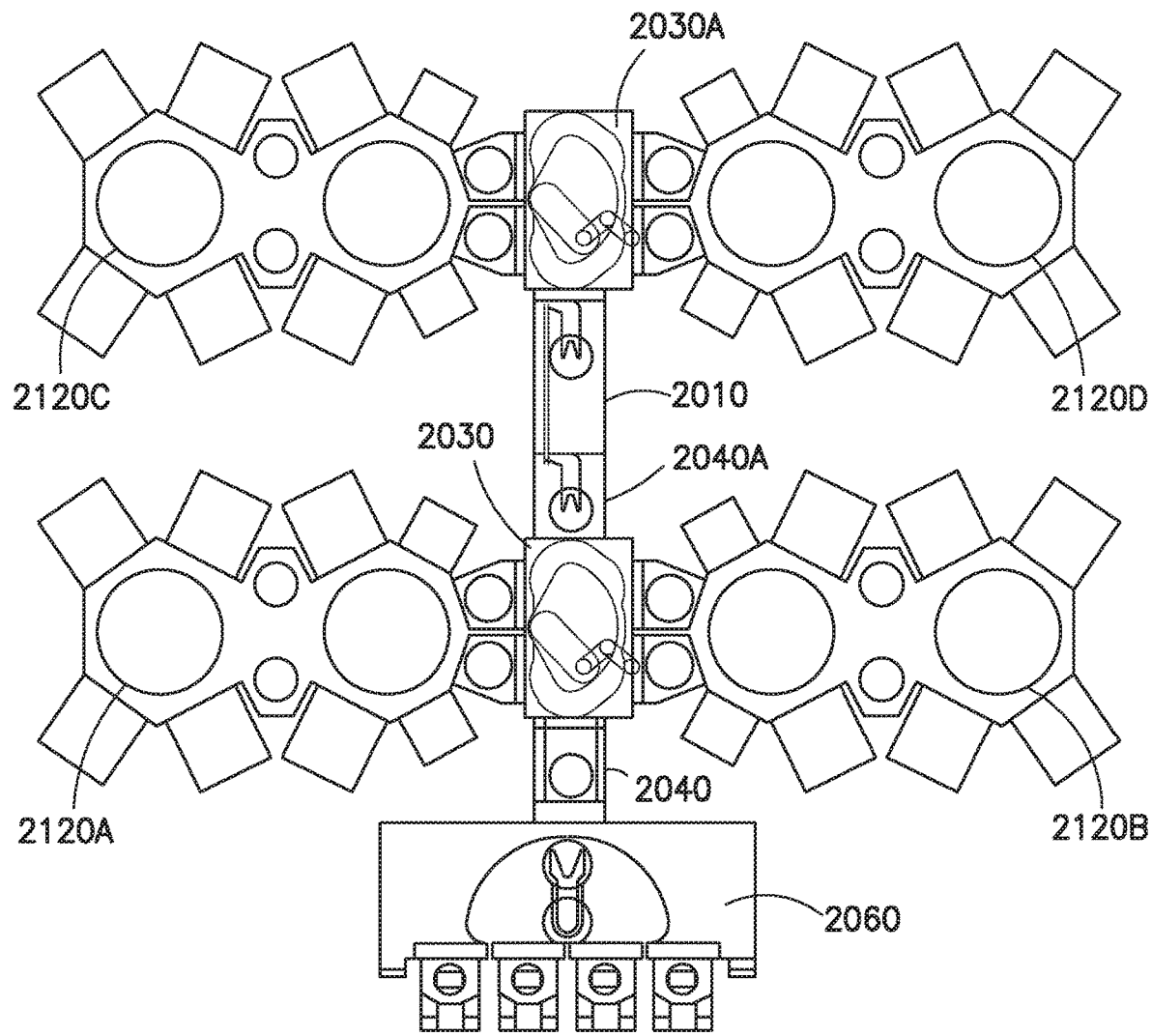

Referring to FIG. 21B other substrate holding stations, processing chambers and/or vacuum tunnels may be connected to the automation module 2030 in any suitable manner. For example, any suitable module 2170 (e.g. a substrate aligner, heater, cooler, buffer, etc.) may be coupled to the automation module 2030 opposite the vacuum module 2040. Referring also to FIG. 21C, a vacuum module 2040A (which may be substantially similar to vacuum module 2040) and/or a vacuum tunnel 2010 may be coupled to the automation module opposite the vacuum module 2040 to modularly increase the processing capacity of the processing apparatus. For example, as can be seen in FIG. 21C, another automation module 2030A is coupled to the vacuum tunnel 2010 so that additional processing tool modules 2120C, 2120D (which are connected to the automation module in a manner substantially similar to that described above) may be added to the processing apparatus. As may be realized, any suitable number of additional vacuum modules 2040, vacuum tunnels 2010, vacuum interface modules and processing tool modules may be added to the processing apparatus in a manner substantially similar to that described above.

Figure 22A:
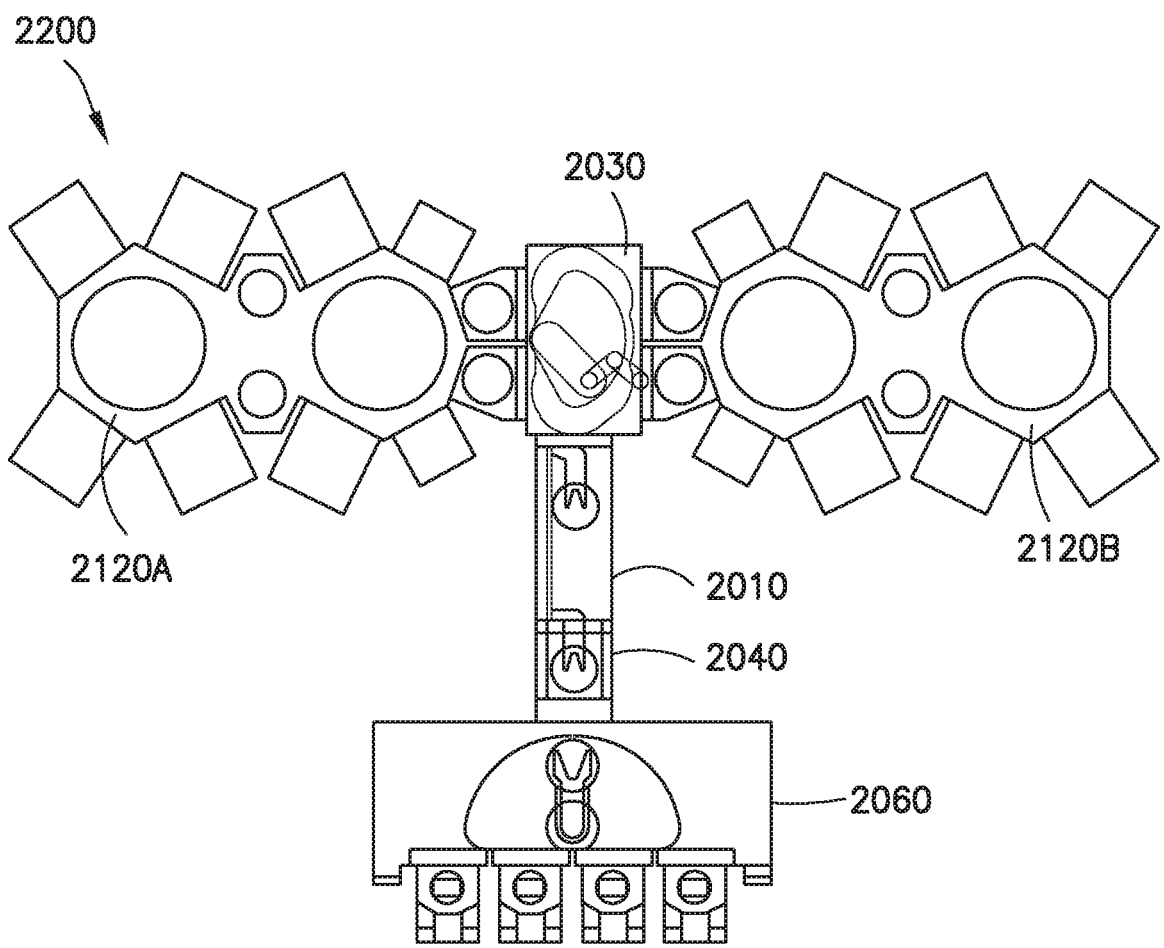
FIGS. 22A, 22B and 22C are schematic illustrations of processing apparatus in accordance with aspects of the disclosed embodiment.
Figure 22B:
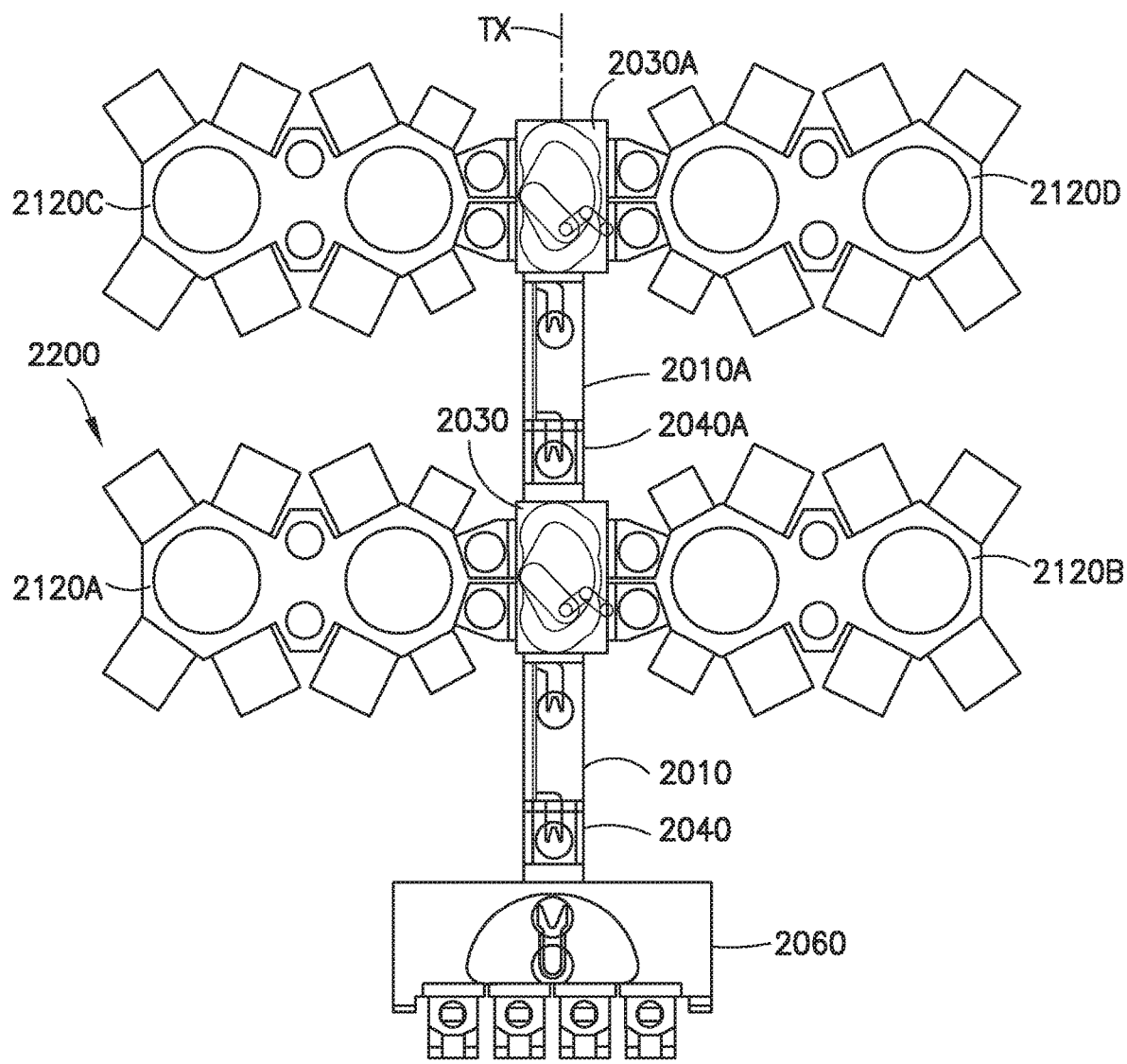
Figure 22C:
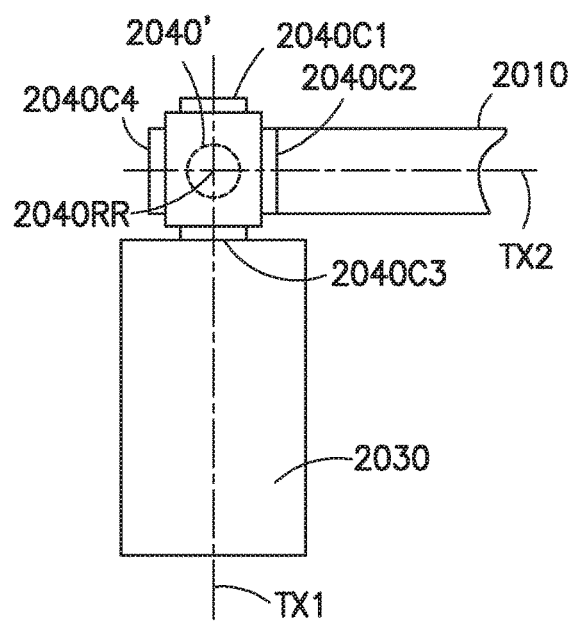

Referring to FIG. 22A a processing apparatus 2200 is schematically shown in accordance with aspects of the disclosed embodiment. The processing apparatus 2200 may be substantially similar to processing apparatus 2100 described above, however, the automation module 2030 in this aspect is connected to the EFEM 2060 through vacuum tunnel 2010 and vacuum module 2040. Each of the vacuum tunnels 2010 and/or vacuum modules 2040 may be configured for transporting or otherwise holding one or more substrates at the same time as will be described below. As may be realized, in a manner substantially similar to that described above, the processing apparatus 2200 may also be expanded as shown in FIG. 22B to increase the processing capacity of the processing apparatus by adding any suitable number of additional vacuum modules 2040, vacuum tunnels 2010A and/or automation modules 2030A. It is noted that coupled or otherwise connected vacuum modules 2040, vacuum tunnels 2010 and automation modules 2030 extend along a transport axis TX to form a modular tunnel that can be extended to any suitable length by adding, for example, the vacuum modules 2040, vacuum tunnels 2010 and automation modules 2030 noted above. As may also be realized, the vacuum modules such as vacuum module 2040' may include ports 2040C1-2040C4 on one or more sides such that other modules may be connected to the vacuum module 2040' for changing a direction in which the transport axis TX extends. The vacuum module 2040' may include a rotation module 2040RR that may rotate the substrate so that the crystal structure of the substrate is maintained in a predetermined alignment position as the substrate transitions from transport path TX1 to transport path TX2. The rotation module 2040RR may be part of a substrate buffer or an indexer/elevator that may facilitate the handoff of substrates between two or more transfer robots within the automation module 2030 and a transport cart travelling along the transport paths TX1, TX2.

Figure 23B:
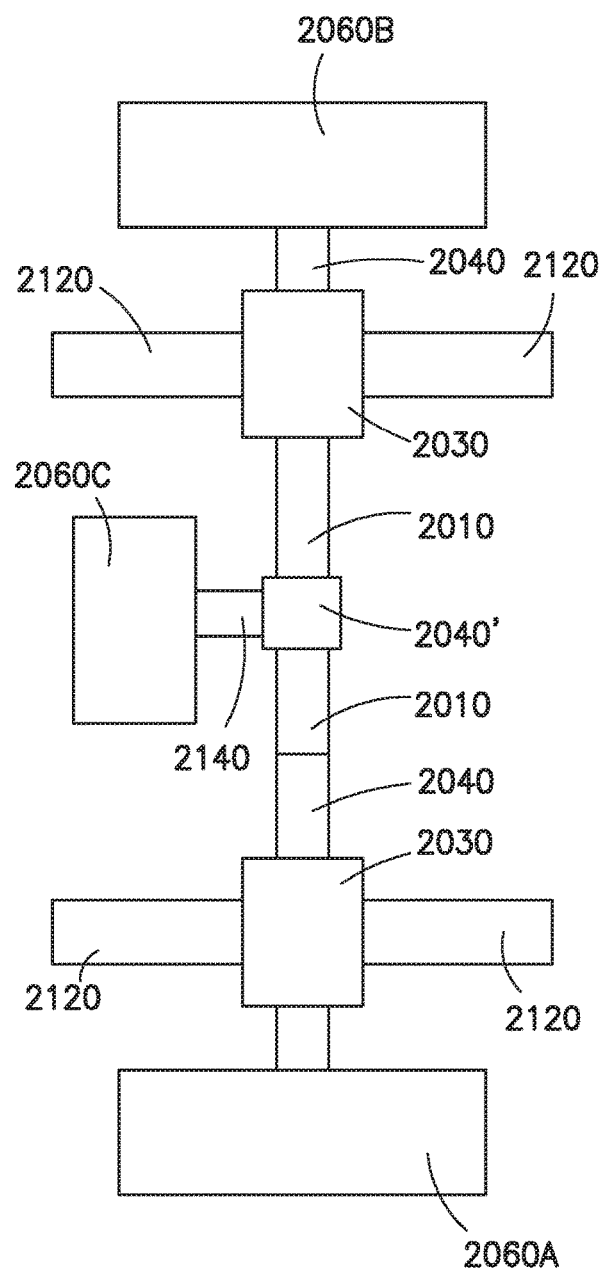
FIGS. 23A and 23B are schematic illustrations of processing apparatus in accordance with aspects of the disclosed embodiment.
Figure 23A:
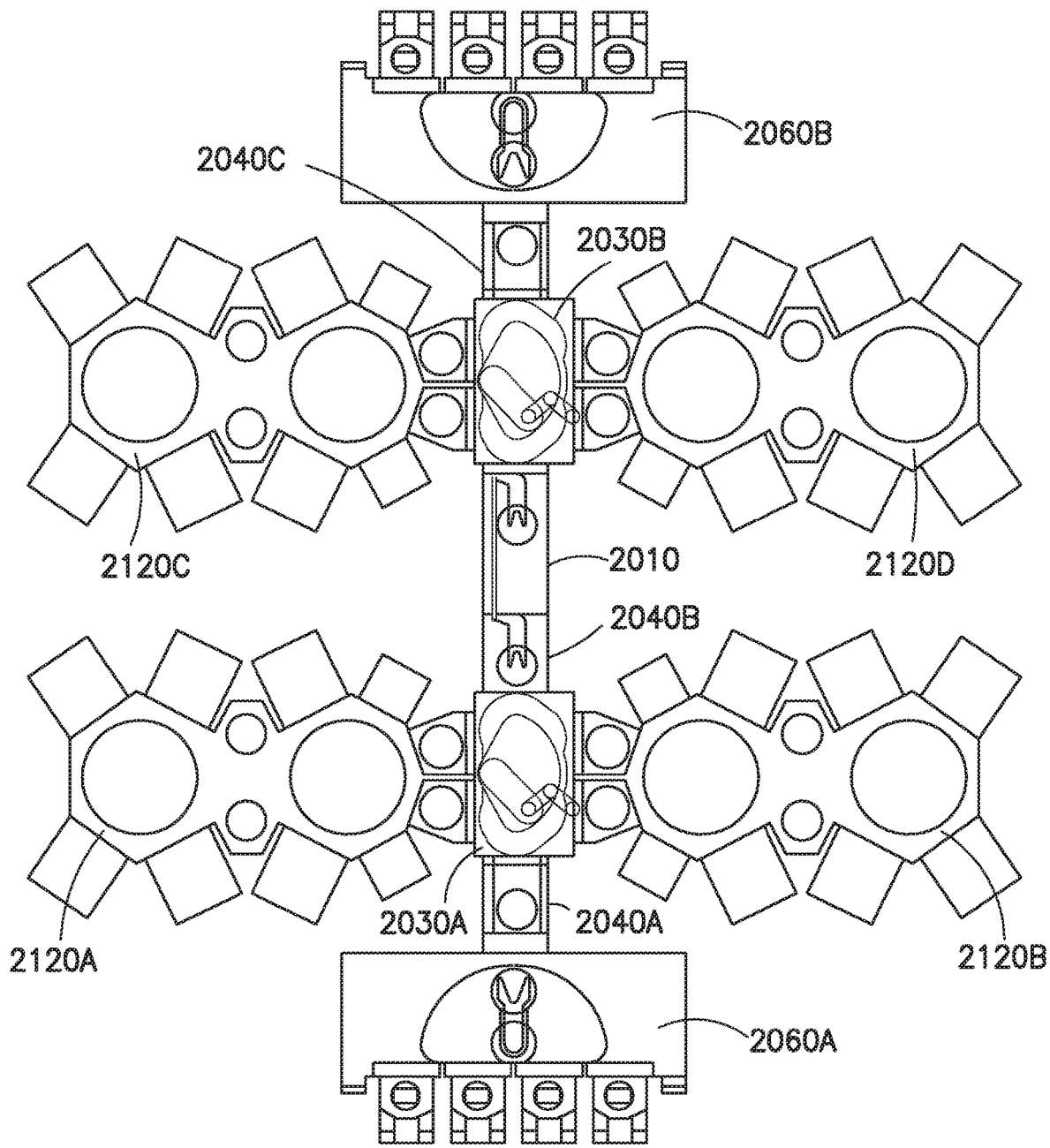

The processing apparatus described herein may also be configured to allow entry/exit of substrates to/from the processing apparatus in more than one location in the processing apparatus. For example, referring to FIG. 23A, an EFEM 2060A, 2060B may be connected to both ends of the transport tunnel formed by the vacuum modules 2040A, 2040B, 2040C, the vacuum tunnel 2010 and the automation modules 2030A, 2030B. Here, in one aspect, substrates may enter the processing apparatus through EFEM 2060A and exit through EFEM 2060B or vice versa. In other aspects the substrates may enter and exit through any one or more of EFEM 2060A and 2060B. Referring also to FIG. 23B an entry/exit point for adding/removing substrates to/from the processing apparatus may also be located between the ends of the transport tunnel. For example, vacuum modules, such as vacuum module 2040', may be added to the transport tunnel to allow connection of an EFEM 2060C at a midpoint, or at any other point between the ends of the transport tunnel. Here, in one aspect, substrates may enter the processing apparatus through EFEM 2060A and exit through EFEM 2060B and/or EFEM 2060C; enter the processing apparatus through EFEM 2060B and exit through EFEM 2060A and/or EFEM 2060C; enter the processing apparatus through EFEM 2060C and exit through EFEM 2060A and/or EFEM 2060B. In other aspects the substrates may enter or exit through any one or more of EFEM 2060A, 2060B and 2060C to form any suitable process flow through the processing apparatus.

Referring now to FIGS. 25A and 25B, the vacuum tunnel 2010 may include one or more vacuum tunnel modules 2500A-2500n that may be sealingly coupled together to form a vacuum tunnel having any suitable length. Each vacuum tunnel module 2500A-2500n may include a connection port 2500P at each end of the vacuum tunnel module 2500A-2500n to allow connection of the vacuum tunnel modules to each other and/or any other suitable module of the processing apparatus described herein. In this aspect, each vacuum tunnel module 2500 includes at least one transport cart guide 2510 and at least one motor component 2520 for driving at least one transport cart 2530 through a respective vacuum tunnel module 2500. It is noted that the ports 2500P may be sized to allow passage of the transport carts through the ports. As may be realized, when two or more vacuum tunnel modules 2500 are coupled to each other the at least one transport cart guide 2510 of each vacuum chamber module 2500 form a substantially continuous transport cart guide that extends through the vacuum tunnel 2010 for allowing passage of the transport cart 2530 between longitudinal ends 2010E1, 2010E2 of the vacuum tunnel 2010. The at least one motor component 2520 of each of the vacuum chamber modules 2500 also form a substantially continuous motor component that allows for substantially continuous driving movement of the transport cart between the ends 210E1, 2010E2 of the vacuum tunnel 2010.

Referring also to FIGS. 26A, 26B, 26C and 27B each of the at least one transport cart 2530, 2531, 2530', 2531' may include a base 2530B, 2530B' and at least one substrate holder 2530S, 2531S, 2530S', 2531S' extending from the base 2530B, 2530B'. In one aspect the substrate holder 2530S, 2531S, 2530S', 2531S' may be cantilevered from a respective base 2530B, 2530B' while in other aspects the substrate holder 2530S, 2531S, 2530S', 2531S' may be supported from the respective base 2530B, 2530B' in any suitable manner. The substrate holder 2530S, 2531S, 2530S', 2531S' may have any suitable shape for actively or passively gripping/holding one or more substrates S as will be described in greater detail below. The base 2530B, 2530B' may be configured in any suitable manner to interface with a respective one of the at least one motor component 2520, 2521, 2520', 2521' and a respective one of the at least one transport cart guide 2510, 2510' for allowing movement of the transport cart 2530, 2531, 2530', 2531' through the vacuum tunnel 2010. As may be realized, where the vacuum tunnel includes more than one transport cart, each of the transport carts may transfer substrates within the tunnel at the same time other transport carts are transporting substrates within the tunnel (i.e. more than one substrate can be transported in the tunnel at the same time). While, in one aspect, the transport cart 2530 is shown and described herein as being a passive transport cart (e.g. the cart has a substantially fixed and stationary substrate holder) in other aspects the transport cart may be an active cart including a cart borne transfer arm having one or more articulated links that can extend past the ends of the vacuum tunnel 2010. Suitable examples of transport carts can be found in, for example, U.S. Pat. Nos. 8,197,177; 8,129,984; 7,959,395; 7,901,539; 7,575,406; and 5,417,537 and United States publication numbers 2012/0076626; 2011/0158773; 2010/0329827; 2009/0078374 and 2009/0191030 the disclosures of which are incorporated herein by reference in their entireties.

As can be seen in FIGS. 26A, 26B, 26C and 27B the base 2530B, 2530B' is generally located towards a lateral side of the vacuum chamber module 2500, 2500' but in other aspects the base may be located in any suitable location. The substrate holders 2530S, 2531S, 2530S', 2531S' are also generally shown as extending from the base 2530B, 2530B' towards a centerline CL of the vacuum chamber module 2500, 2500' but in other aspects the substrate holders 2530S, 2531S, 2530S', 2531S' may extend in any suitable direction for supporting the substrates S within the vacuum chamber modules 2500, 2500'. As may be realized, where there are more than one transport cart 2530, 2531, 2530', 2531' within the vacuum chamber module 2500, 2500' the substrate holders 2530S, 2531S, 2530S', 2531S' may be disposed in different spaced apart planes 2698, 2699 so that the transport carts 2530, 2531, 2530', 2531' may pass by one another within the vacuum chamber modules 2500, 2500'. While there are only two planes 2698, 2699 shown in the FIGS. is should be understood that there may be any suitable number of transfer planes and corresponding substrate holders operating in those transfer planes. As may be realized, the transport robots interfacing with the transport carts 2530, 2531, 2530', 2531' may have any suitable amount of Z-movement capability for accessing substrates carried along either transport plane 2698, 2699.

Figure 27A:
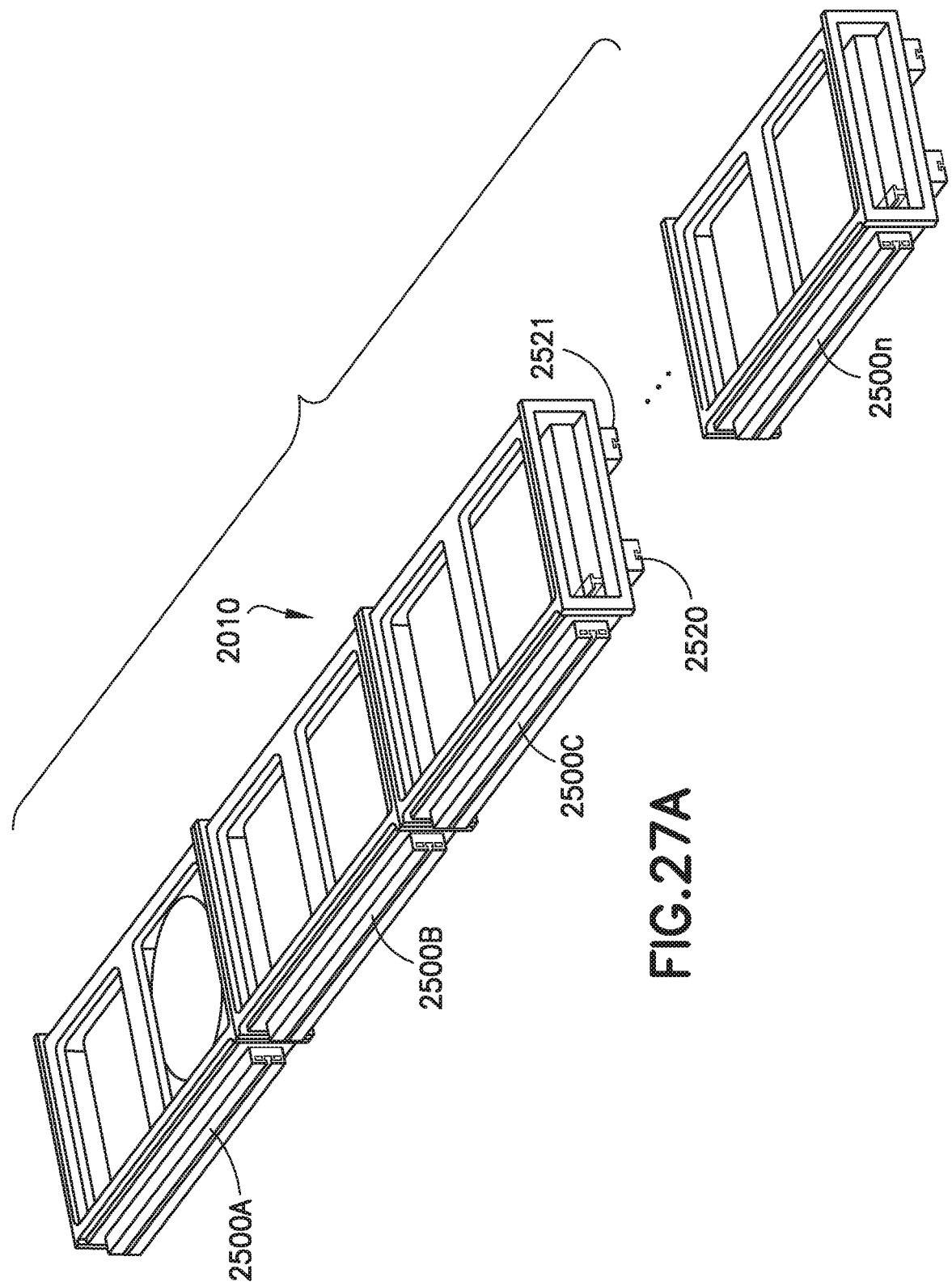
FIGS. 27A and 27B are schematic illustrations of a transport tunnel in accordance with aspects of the disclosed embodiment.
Figure 27B:
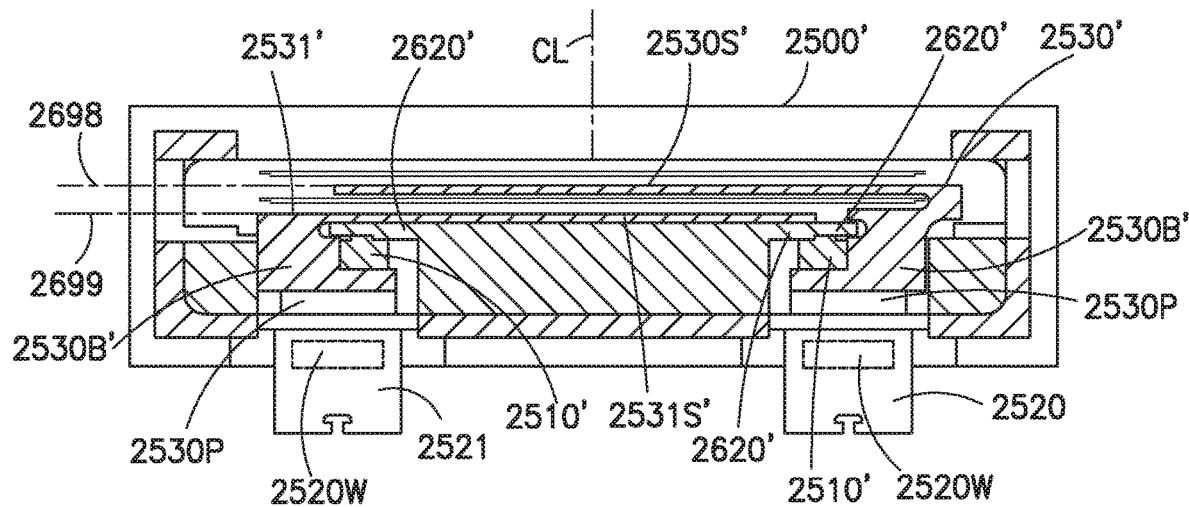

The at least one motor component 2520 and transport cart guide 2510 of each vacuum chamber module 2500 may be any suitable motor component and guide for interfacing with and driving the transport cart 2530 through the vacuum tunnel 2010. In one aspect, as shown in FIGS. 25A-26C the at least one motor component may be located on the lateral sides of each of the vacuum chamber modules 2500. In other aspects, referring to FIGS. 27A and 27B, the at least one motor component may be disposed on a bottom or top of each of the vacuum chamber modules 2500. For example, the motor component 2520 may be or include any component of any suitable drive system such as a magnetic levitation drive (e.g. having stationary windings that drive and levitate the transport cart), chain/cable drive (e.g. where the cart is pulled/pushed through the vacuum tunnel by the chain/cable), ball screw drive (e.g. where the cart is pulled/pushed through the vacuum tunnel by the ball screw), magnetic coupling drive (e.g. where a movable magnet is driven along the length of the vacuum tunnel and the transport cart includes magnets that are magnetically coupled to the movable magnet such that as the movable magnet is driven along the length of the vacuum tunnel the transport cart driven with the movable magnet) or any combination thereof or any other suitable drive. The transport cart guide 2510 may be, for example, a contact guide member (e.g. one or more rails, rollers, bearings, etc.) or a contactless guide member (e.g. magnetic, magnetic levitation) guide members. Suitable examples of non-contact and contact transport cart guides and drive systems can be found in, for example, U.S. Pat. Nos. 8,197,177; 8,129,984; 7,959,395; 7,901,539; 7,575,406; and 5,417,537 and United States publication numbers 2012/0076626; 2011/0158773; 2010/0329827; 2009/0191030; and 2009/0078374 the disclosures of which are incorporated herein by reference in their entireties.

In one aspect as shown in FIGS. 26A, 26B, 26C and 27B, the at least one transport cart guide 2510 may be a rail or bearing along which the base 2530B, 2530B' rides. As may be realized, the at least one transport cart guide 2510, 2510' in this aspect may physically support (e.g. contact) a respective transport cart 2530. The at least one motor component 2520 may include one or more stationary windings 2520W and the transport cart 2530, 2531, 2530', 2531' may include one or more magnetic platens 2530P that interface with the windings 2520W for driving a respective one of the at least one transport cart 2530, 2531, 2530', 2531' along a respective one of the at least one transport cart guide 2510, 2510'. The magnetic platens 2530P may be integral with or otherwise affixed to the transport cart base 2530B, 2530B' in any suitable manner. The at least one motor component 2520, 2521 may be connected to any suitable controller, such as controller 120 (FIG. 1) where the controller 120 is configured or otherwise programmed to control the windings for driving a respective one of the transport cart 2530, 2531, 2530', 2531'. Any suitable shield(s) 2620, 2620' may be disposed adjacent the at least one transport cart guide 2510, 2510' to substantially contain any particles generated by the interaction of the at least one transport cart guide 2510, 2510' and the at least one transport cart 2530, 2531, 2530', 2531' for preventing the migration of the particles onto the substrates S being transported within the vacuum tunnel 2010. As may be realized, any suitable position feedback device(s) 2610 may be included on one or more of the at least one transport cart 2530 and vacuum chamber module 2500 for tracking a position of the at least one transport cart 2530 between the ends of the transport tunnel formed by the coupled vacuum chamber modules 2500A-2500n. The position feedback device(s) 2610 may be connected to the controller 120 for sending signals to the controller that may be used for controlling the windings 2520W (e.g. to drive the at least one transport cart 2530 to a predetermined position within the transport tunnel). Suitable examples of position feedback devices can be found in, for example, U.S. Pat. No. 8,129,984 and United States patent publication 2009/0033316 the disclosures of which are incorporated by reference herein in their entireties.

Figure 28A:
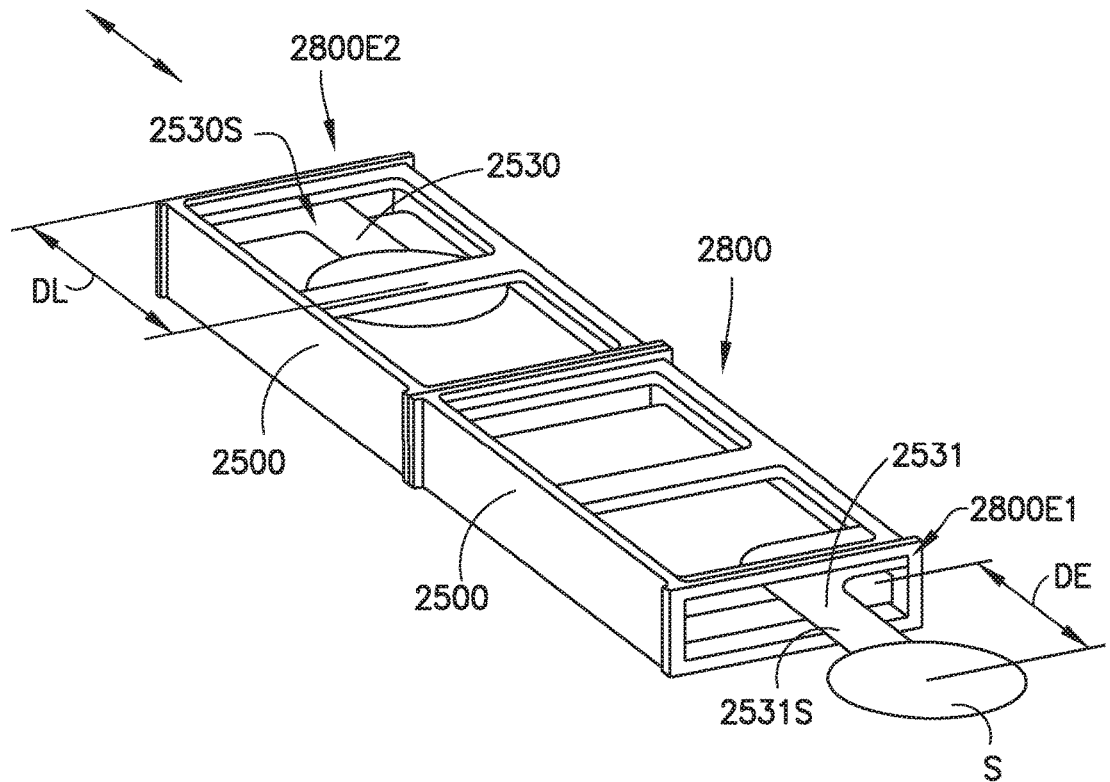
FIGS. 28A, 28B, and 28C are schematic illustrations of portions of a transport tunnel in accordance with aspects of the disclosed embodiments.

Referring to FIG. 28A, a portion of a vacuum tunnel 2800 (which may be substantially similar to vacuum tunnel 2010) is shown having two vacuum tunnel modules 2500 for exemplary purposes only. In one aspect the substrate holders 2530S, 2531S of the transport carts 2530, 2531 operating in the vacuum tunnel 2800 may be configured to extend longitudinally within the vacuum tunnel 2800 so that each substrate holder 2530S, 2531S extends out of the tunnel by a predetermined distance DE for transferring the substrate S held on the substrate holders 2530S, 2531S to any suitable substrate holding station such as vacuum modules 2040, 2040A, 2040B or handing off the substrates S substantially directly to a transfer robot located within, for example, EFEM 2060 or automation module 2030. In other aspects the substrate holders 2530S, 2531S may have any suitable configuration or shape. In this aspect the substrate holders 2530S, 2531S are facing in a common direction, e.g. towards longitudinal end 2800E1 of the vacuum tunnel 2800 and as such the substrate holders 2530S, 2530S1 may only extend past the end 2800E1 for transferring substrates S. As may be realized, any automation, such as the transfer robots described herein, located at longitudinal end 2800E2 of the vacuum tunnel 2800 may be configured to extend into the vacuum tunnel 2800 by a predetermined amount DL for picking and placing substrates S substantially directly to the substrate holders 2530S, 2531S.

Figure 28B:
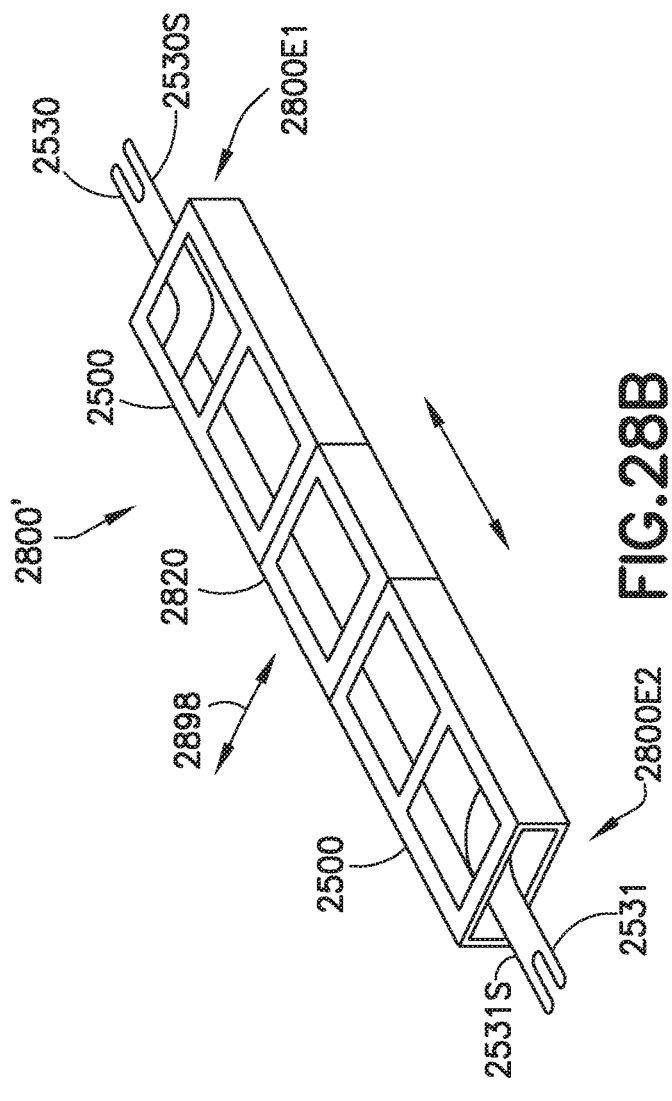
Figure 28C:
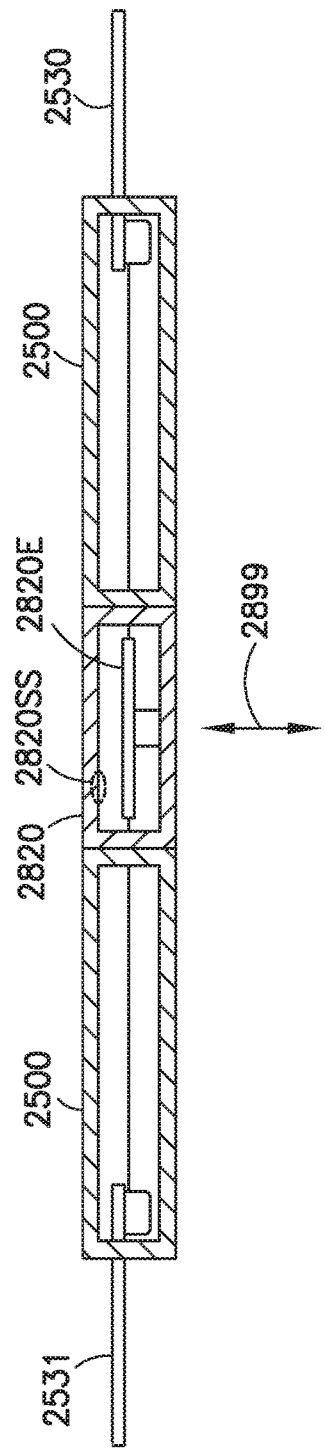

Referring to FIGS. 28B and 28C a portion of a vacuum tunnel 2800' is shown having two vacuum tunnel modules 2500 and an interface module 2820 for exemplary purposes only. As can be seen in FIG. 28 there are two transport carts 2530, 2531 (which may be substantially similar to the transport carts described above with respect to FIG. 28A) operating in the vacuum tunnel 2800'. In this aspect of the disclosed embodiment, the substrate holders 2530S, 2531S of the transport carts also extend longitudinally within the vacuum tunnel 2800' but rather than extend in a common direction the substrate holders extend in opposite directions (substrate holder 2530S extends towards end 2800E1 and substrate holder 2531S extends towards end 2800E2). In this aspect, the substrate holder 2530S extends past the end 2800E1 of the vacuum tunnel 2800' for transferring substrates between the substrate holder 2530S and any suitable substrate holding station and/or transfer robot in a manner similar to that described above with respect to FIG. 28A. Similarly, the substrate holder 2531S extends past the end 2800E2 of the vacuum tunnel 2800' for transferring substrates between the substrate holder 2531S and any suitable substrate holding station and/or transfer robot in a manner similar to that described above with respect to FIG. 28A. In one aspect, substrates placed on the substrate holder 2531S are transferred to substrate holder 2530S to allow the substrate to be transferred to a substrate holding location of transfer robot as substrate holder 2531S is not capable of extending past the end 2800E1 and vice versa. As such, at least one interface module 2820 may be disposed between vacuum tunnel modules 2500 and be configured to allow transfer of substrates S between the substrate holders 2530S, 2531S. For example, the interface module 2820 may include a substrate support 2820E that is movable in the direction of arrow 2899 (e.g. in a direction substantially perpendicular to a transfer plane of the substrates). The interface module 2820 may include guide rails and motors components for the transport carts 2530, 2531 in a manner substantially similar to that described above with respect to the vacuum chamber modules. The substrate support 2820E may be configured to allow the transport carts 2530, 2531 to pass through the interface module 2820 and to allow the alignment of the substrates S held on the substrate holders 2530S, 2531S with the substrate support 2820E for transferring the substrates between the substrate holders 2530S, 2531S. For example, to transfer a substrate from transport cart 2531 to transport cart 2530 the controller 120 (FIG. 1) may control the transport cart 2531 so that the transport cart 2531 is positioned to align the substrate with the substrate support 2820E. The substrate support 2820E may move in the direction of arrow 2899 to lift the substrate S from the substrate holder 2531S. The controller 120 may cause the transport cart 2531 to move away from the substrate support 2820E and control the transport cart 2530 for aligning the substrate holder 2530S with the substrate support 2820E. The substrate support 2820E may move in the direction 2899 for placing the substrate S on the substrate holder 2530S. As may be realized, in one aspect, any suitable sensors 2820SS may also be provided in the interface module 2820 and the substrate support 2820E may be rotatable so that the sensors may scan a substrate rotated by the substrate support 2820E for aligning the substrate to a predetermined orientation. In another aspect, the substrate support 2820E may be movable in the direction of arrow 2898 by any suitable drive mechanism such that the sensors 2820SS may scan the substrate and the substrate support 2820E may move in the direction of arrow 2898 for centering the substrate on the substrate holders of the transport carts.

Figure 30A:
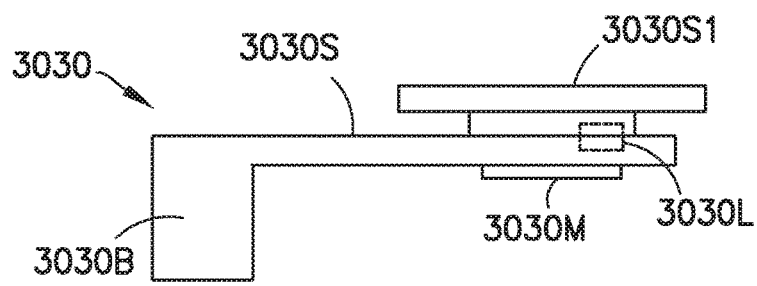
FIGS. 30A and 30B are schematic illustrations of a substrate transport cart in accordance with aspects of the disclosed embodiment.
Figure 30B:
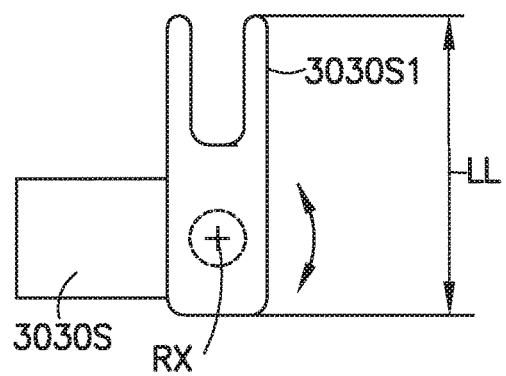
Figure 31A:
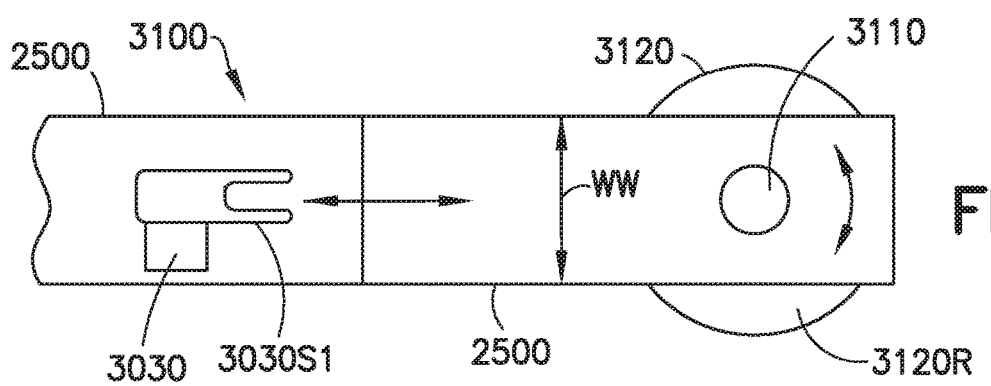

Referring to FIGS. 30A and 30B in one aspect of the disclosed embodiment the transport carts operating within the vacuum tunnels may include rotatable substrate holders so that each transport cart can extend past both ends of the vacuum tunnel. For example, transport cart 3030 (which may be substantially similar to transport carts 2530, 2531) includes a base 3030B configured to ride along the guide member 2510, 2510' and a substrate holder support section 3030S. A substrate holder 3030S1 may be rotatably mounted to the substrate holder support section 3030S in any suitable manner so that the substrate holder 3030S1 rotates about axis RX. A drive coupling member 3030M may be coupled to the substrate holder 3030S1 for rotating the substrate holder 3030S1 about the axis RX at least about 180° so that the substrate holder can extend past both ends of the vacuum tunnel. As may be realized, the substrate holder 3030S1 and/or the drive coupling member 3030M may include any suitable mechanical or solid state locking mechanism(s) 3030L for holding the substrate holder 3030S1 in a predetermined position for allowing the substrate holder to extend past the ends of the vacuum tunnel for transferring substrates to and from the substrate holder. In one aspect a length LL of the substrate holder 3030S1 and its configuration may be such that the substrate holder 3030S1 may rotate at any point within the vacuum tunnel. In other aspects the length LL of the substrate holder 3030S1 may be such that the substrate holder 3030S1 is not capable of rotating within a width WW (FIG. 31A) of the vacuum tunnel. Referring also to FIG. 31A, to allow rotation of the of the substrate holder 3030S1 the vacuum tunnel 3100 (which may be substantially similar to vacuum tunnel 2010) may include an orientation module 3120. The orientation module 3120 may include guide rails and motor components in a manner substantially similar to that described above to allow the transport cart 3030 to pass through the orientation module 3120. The orientation module 3120 may have a housing shaped to allow the substrate holder 3030S1 to rotate for changing a direction of the substrate holder 3030S1. In this aspect the orientation module 3120 is shown such that the housing has a substantially circular shaped portion 3120R for allowing rotation of the substrate holder 3030S1 but in other aspects the housing may have any suitable shape and/or configuration. A drive 3110 may be disposed within the orientation module 3120 for interfacing with the drive coupling member 3030M of the transport cart 3030. For example, the drive coupling member 3030M and the drive 3110 may include one or more magnets for magnetically coupling the drive coupling member 3030M to the drive in a non-contact manner. In other aspects the drive coupling member 3030M and the drive 3110 may be coupled to each other in any suitable manner. It is noted that the locking mechanism(s) 3030L may be configured such that when the when the drive coupling member 3030M and the drive 3110 are coupled the locking mechanism(s) release to allow rotation of the substrate holder 3030S1 and when the drive coupling member 3030M and the drive 3110 are de-coupled the locking mechanism(s) 3030L are engaged. In operation the controller 120 (FIG. 1) may move the transport cart 3030 to align the drive coupling member 3030M with the drive 3110 within the orientation module 3120. The drive 3110 may be operated to rotate the substrate holder 3030S1 at least about 180° so that the substrate holder is facing substantially in an opposite direction (compared to the direction of the substrate holder before rotation) to allow the substrate holder 3030S1 to extend past both ends of the vacuum tunnel 3100.

Figure 29:
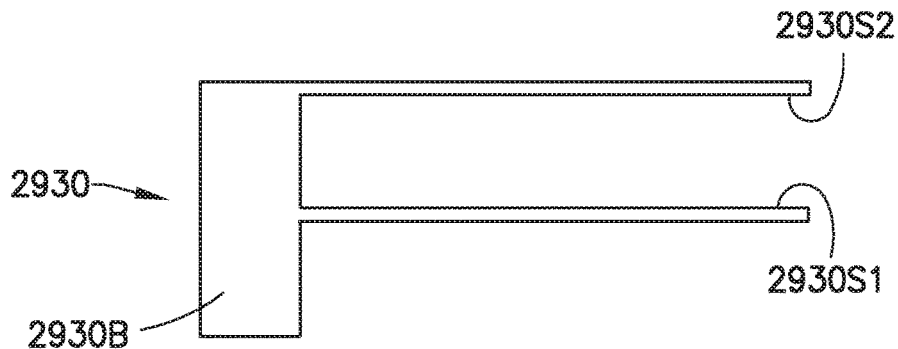
FIG. 29 is a schematic illustration of a substrate transport cart in accordance with aspects of the disclosed embodiment.

As may be realized, and as noted above, the substrate holders described herein may be configured to hold more than one substrate. For example, referring to FIG. 29, the substrate holders may be configured for batch transfer of substrates. For example, a batch substrate holder 2930 may include any suitable number of spaced apart substrate supports 2930S1, 2930S2 for holding substrates in different spaced apart planes. The substrate holders may also include double ended substrate holders 3030S2 as shown in FIG. 31C capable of holding at least two substrates in line with each other substantially in the same plane. In other aspects the substrate holders may have any suitable combination of spaced apart substrate holders (e.g. for holding substrates in different planes) and double ended substrate holders. As may also be realized, the transport carts, such as those described above, may allow for the fast swapping of substrates. For example, where each cart has substrate holders facing the same direction one transport cart may pick a substrate and the other transport cart may place a substrate in substantially immediate succession. Where a transport cart includes a batch substrate holder one support in the batch holder may be left empty such that a processed substrate can be placed on the empty support while an unprocessed substrate is removed from another support and vice versa in substantially immediate succession. Where the substrate holder includes a double ended substrate holder an orientation chamber 3120 may be placed at the ends of the vacuum tunnel such that one side of the double ended substrate holder may pick a substrate, the holder may be rotated and the other side of the double ended substrate holder may place a substrate in substantially immediate succession.

As noted above, in one aspect one or more of the transport carts described herein may include a transfer arm disposed on the transfer cart that is capable of extending and retracting for picking and placing substrate to a location outside of the vacuum tunnel or otherwise beyond the ends of the vacuum tunnel. For example, referring to FIG. 32 the transport cart 3200 includes an arm 3200A having extendable arm links. The links may be connected to each other in any suitable manner so that as the base link 3201 rotates the substrate holder 3203 is constrained to extend/retract along the transport path TX. In one aspect the transport cart 3200 may include a base arm drive that may be configured to engage a cam 3200C located as a predetermined position within a vacuum tunnel module 2500 (such as at an end of the vacuum tunnel or any suitable location where the arm is to extend to transfer substrates) such that as the transport cart passes the cam 3200C the cam engages the base arm drive to cause rotation of the base arm 3201 for extending the substrate holder 3203. To retract the substrate holder 3203 the transport cart may move away from the cam. The arm 3200A may be biased to the retracted configuration, such as through springs or other biasing members, so that as the base arm drive disengages the cam the arm is retracted. In other aspects, the extension of the arm may be driven through a magnetic coupling drive. For example, motor components 3301, 3302 may be located in a vacuum tunnel module 2500 at predetermined positions within the vacuum tunnel (such as at an end of the vacuum tunnel or any suitable location where the arm is to extend to transfer substrates). The motor components 3301, 3302 may be configured to drive movable platens 3310A, 3310B of the transport cart 3320 for extending and retracting the arm 3320A such as in the manner described in U.S. Pat. No. 7,959,395, the disclosure of which is incorporated herein by reference in its entirety. In still other aspects the arm carried by the transport cart may be driven in any suitable manner.

As may be realized, in the aspects of the disclosed embodiments described herein, where substrates are transported by, for example, a transport cart moving within the vacuum tunnel any automation (e.g. aligners, robots, buffers, etc. as described above) may include Z-movement capabilities for picking and placing substrate from/to the substrate holder on the transport cart. In other aspects, the transport carts may include Z-movement capability for picking and placing substrates.

Figure 34A:
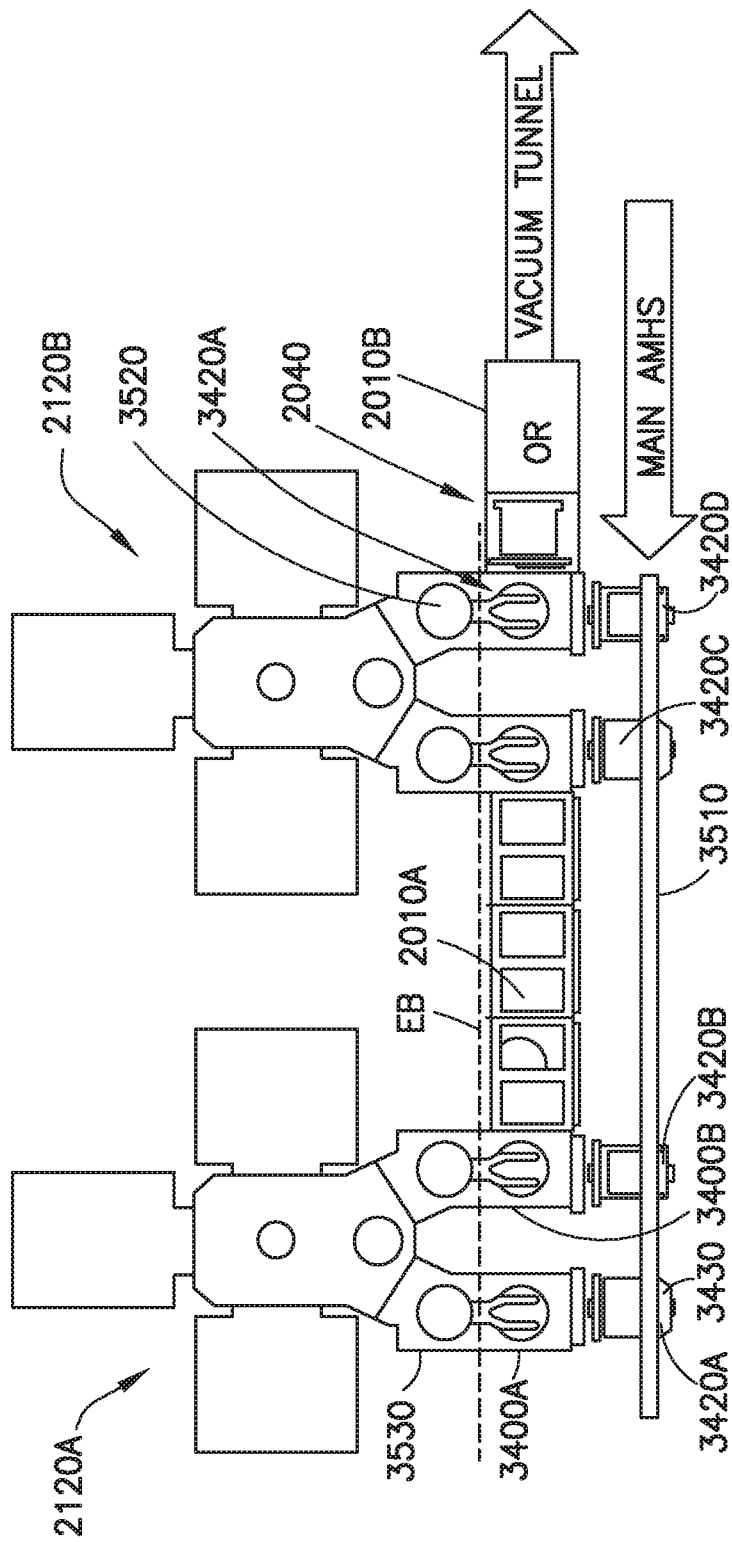

Referring to FIGS. 34A and 34B a batch load lock 3400A-D is shown. The batch load lock 3400A-D may be substantially similar to that described in U.S. patent Ser. No. 12/123,391 filed on May 19, 2008 the disclosure of which is incorporated by reference herein in its entirety. In one aspect the batch load lock 3400 may be substantially directly coupled to a load port 3420 in any suitable manner. The batch load lock 3400 may include any suitable automation, such as e.g. a transfer arm, for transferring substrates to and from a substrate carrier 3420A-3420D. The batch load lock 3400A-D may form an automation interface similar to that described above with respect to automation module 2030. For example, FIG. 34A illustrates a portion of a processing apparatus in accordance with aspects of the disclosed embodiment. The processing apparatus includes process tool modules 2120A, 2020B each having, e.g., load locks 3530 coupled thereto. A batch load lock 3400A, 3400B, 3400C, 3400D may be coupled to each of the load locks 3530. One or more vacuum tunnels 2010A, 2010B may be connected to the batch load lock 3400A, 3400B, 3400C, 3400D. For exemplary purposes only, vacuum tunnel 2010A may connect batch load lock 3400B with batch load lock 3400C which also connects processing tool modules 2120A, 2120B to each other for transporting substrates between processing tool modules 2120A, 2120B without returning the substrates to the substrate carrier 3430 for transport on any suitable automated material handling system (AMHS) 3510. A vacuum module 2040 may couple the vacuum tunnel 2010B to batch load lock 3400D for connecting the batch load lock 3400D (and the remainder of the processing apparatus) to, for example, an EFEM or other automation equipment. In this aspect each of the batch load locks 3400A, 3400B, 3400C, 3400D may be substantially directly coupled to a load port 3420A, 3420B, 3420C, 3420D which interfaces each of the batch load locks 3400A, 3400B, 3400C, 3400D to the AMHS 3510. FIG. 34B illustrates a portion of a processing apparatus similar to that shown in FIG. 34A in accordance with aspects of the disclosed embodiment. However, in FIG. 34B the batch load locks 3400A, 3400B, 3400C, 3400D are coupled substantially directly to the processing tool modules 2120A, 2120B and function as a load lock between the load ports 3420A, 3420B, 3420C, 3420D and the respective processing tool modules 2120A, 2120B.

Figure 35A:
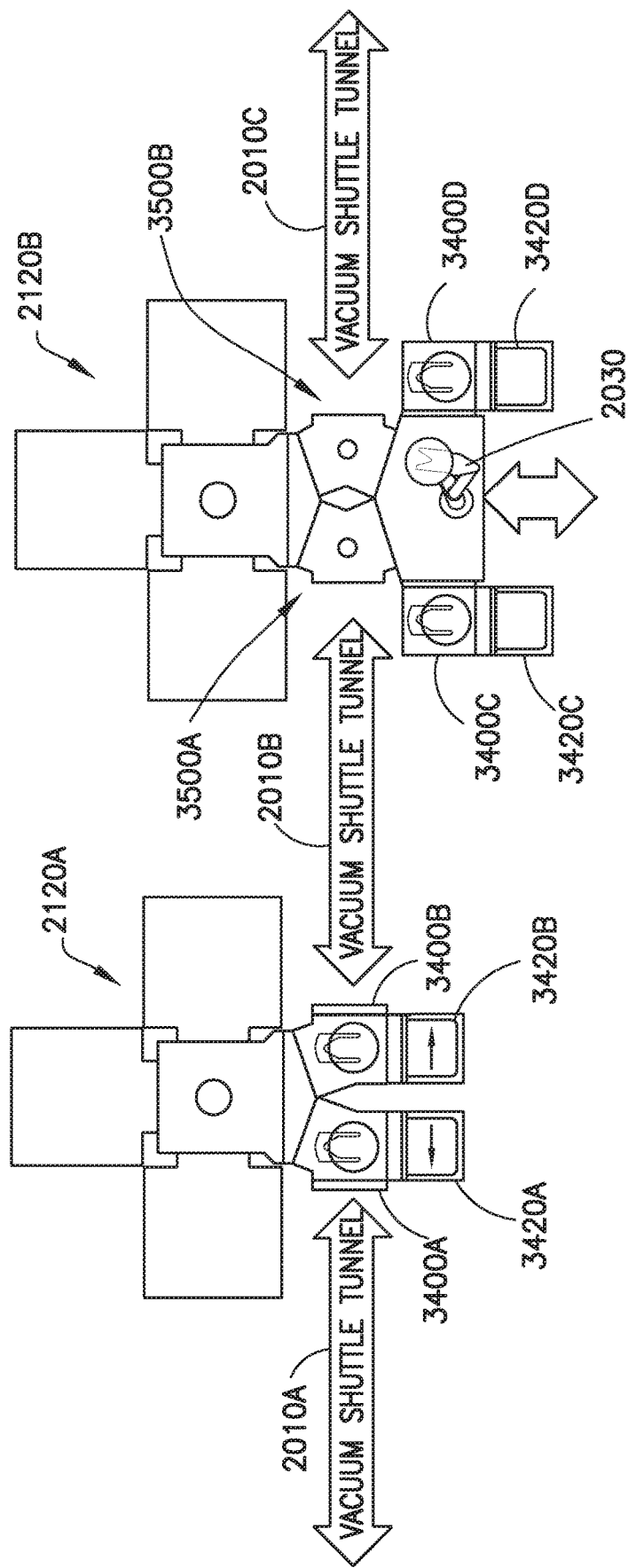

Referring to FIGS. 35A, 35B and 35C a portion of a processing apparatus is shown in accordance with aspects of the disclosed embodiment. In this aspect the processing tool modules 2120A, 2120B may be connected to each other through vacuum tunnel 2010B and to other processing tool modules (or other suitable automation equipment) through vacuum tunnels 2010A, 2010C. Here the vacuum tunnels 2010A, 2010B are connected to the processing tool module through batch load locks 3400A, 3400B. As can be seen in FIG. 35A load ports 3420A, 3420B are coupled to each of the batch load locks 3400A, 3400B. The vacuum tunnels 2010B, 2010C are connected to processing tool 2120B through load locks 3500A, 3500B which may be any suitable load locks. Here, the load locks 3500A, 3500B are coupled to the automation module 2030 and the automation module is coupled to the batch load locks 3400C, 3400D. Load ports 3420C, 3420D are coupled to the batch load locks 3400C, 3400D in any suitable manner. It should be understood that while the batch load locks are illustrated as interfacing with front opening unified pods (FOUPs) in other aspects the batch load locks may be configured to interface with any suitable substrate carriers such as bottom opening carriers or top loading carriers.

Figure 36A:
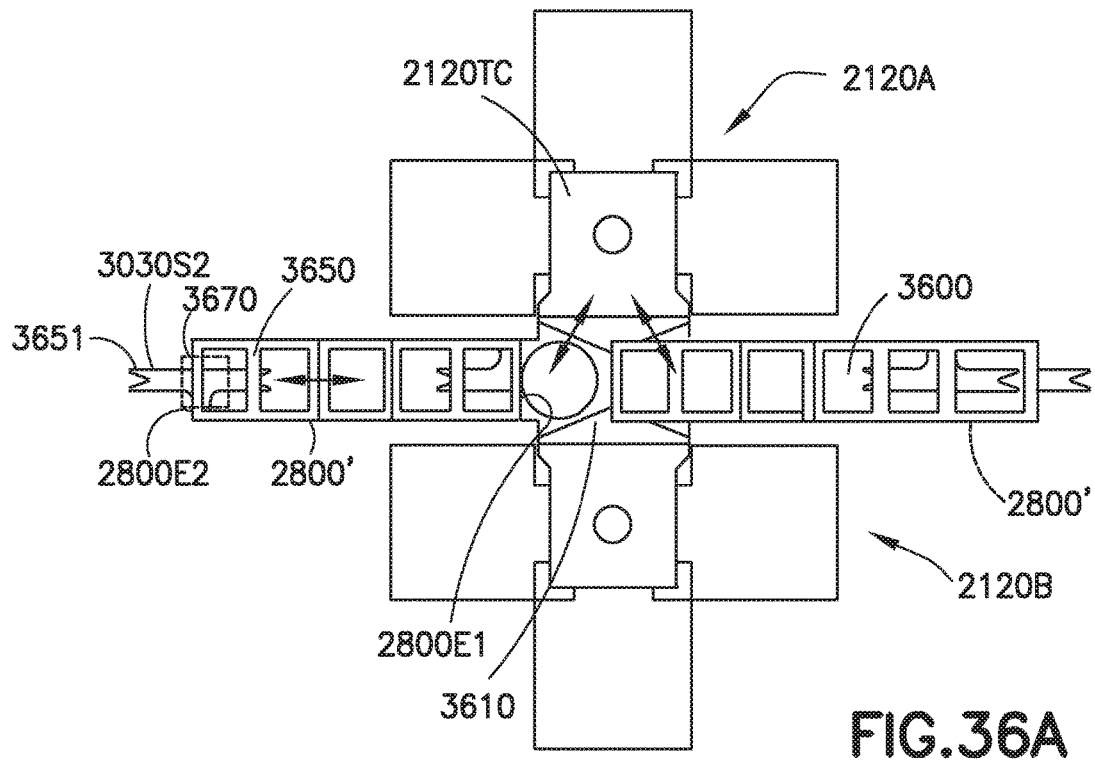
Figure 36B:
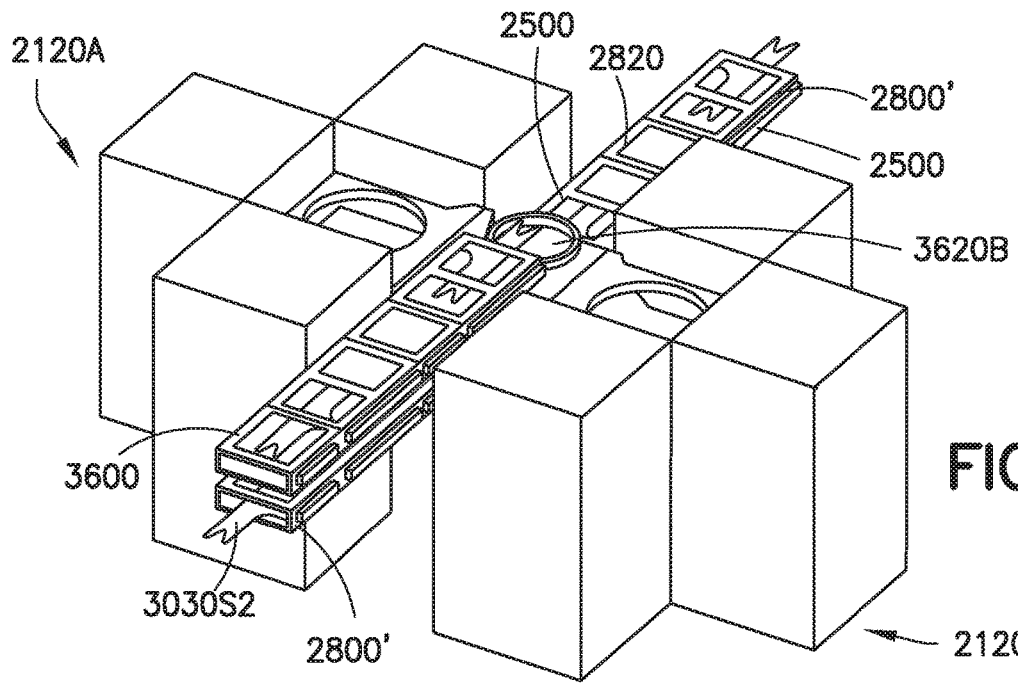
Figure 36D:
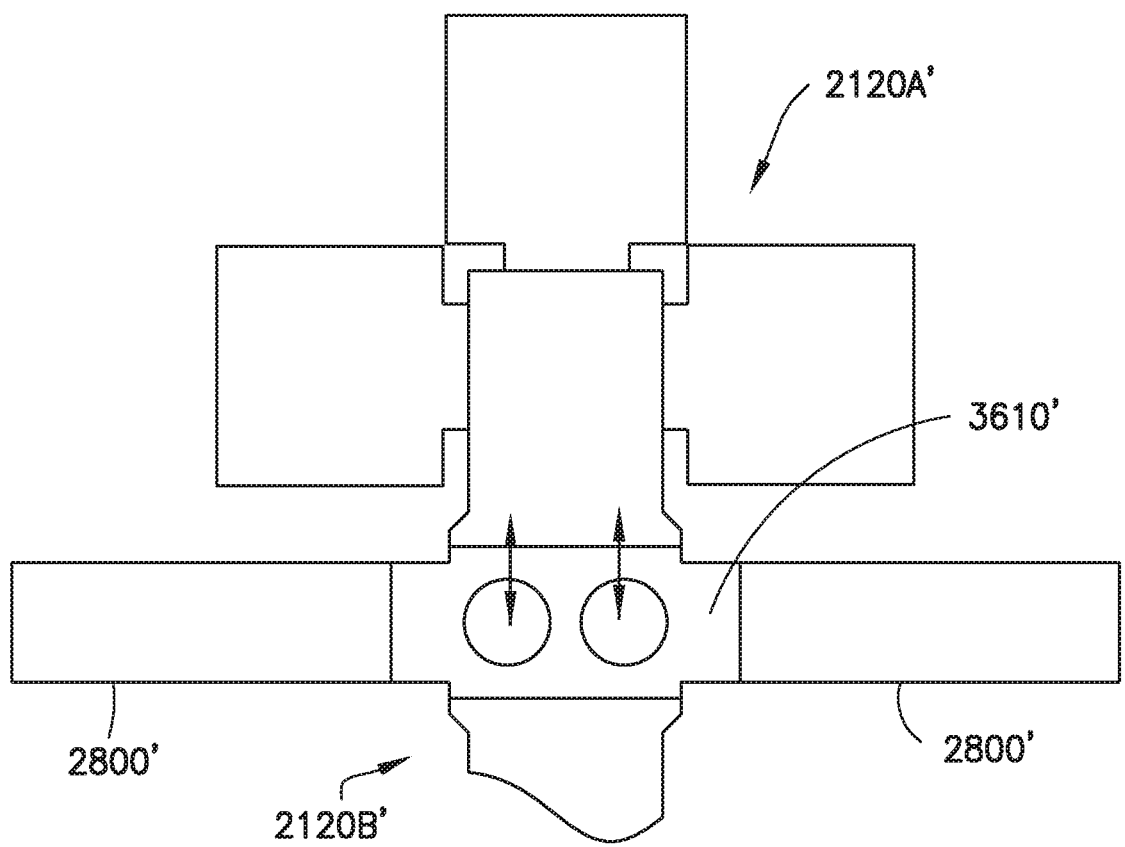

Referring to FIGS. 36A-36C a portion of a processing apparatus is shown in accordance with aspects of the disclosed embodiment. Processing tool modules 2120A, 2120B are disposed on lateral sides of load lock 3610. In this aspect the load lock 3610 is shown as having a wedge shape so as to couple with the transfer chamber 2120TC of the processing tool modules 2120A, 2120B. As may be realized, substrates located at the, e.g., two substrate holding locations (e.g. 3620A, 3620B) may be transported to and from the processing tool modules 2120A, 2120B along converging/diverging paths that correspond to an angle of the wedge shape. In other aspects, the load lock may have any suitable shape and/or configuration, such as an orthogonal shape (see load lock 3610' in FIG. 36D) configured to allow coupling with the processing tool modules 2120A', 2120B'. As may be realized, the orthogonal shape load lock 3610' may allow transfer of substrates between the processing tool modules and each of the substrate holding locations 3620A, 3620B along substantially parallel paths as shown in FIG. 36D. As may be realized, wedge adapter and orthogonal adapters may be provided for the orthogonal load lock 3610' and the wedge load lock 3610 in a manner substantially similar to that described above with respect to the automation module so that the wedge load lock 3610 may be connected to orthogonally arranged ports of a processing tool module and the orthogonal load lock can be connected to angularly arranged ports of a processing tool module. Vacuum tunnels 2800' may be coupled to each of the longitudinal ends of the load lock 3610, 3610'. As described above, the each of the vacuum tunnels may include a transport cart including one or more double ended substrate holders 3030S2 as shown in FIG. 31C capable of holding at least two substrates in line with each other substantially in the same plane. As also described above, each of the vacuum tunnels 2800' may include interface module 2820. The interface module 2820 may include a substrate support 2820E (FIG. 28C) that is movable in the direction of arrow 2899 (e.g. in a direction substantially perpendicular to a transfer plane of the substrates). As may be realized, where there are two or more transport carts having double ended substrate holders 3030S2 travelling through the tunnel each of the transport carts may be holding at least one substrate at the same time (e.g. every one of the carts can transport and pick or place substrates to both ends of the respective vacuum tunnels 2800' independent of other transport carts in the respective tunnel 2800'). In this aspect the interface module may allow each of the carts to transfer substrates to both ends of the vacuum tunnels 2800'. For example, transport cart 3670 may pick a substrate from any suitable substrate holding location at end 2800E1 of the vacuum tunnel 2800' with end 3650 of the double ended substrate holder 3030S2. To place that substrate at any suitable substrate holding location at end 2800E2 of vacuum tunnel 2800' the transport cart 3670 may be positioned so that the substrate is placed over substrate support 2820E of the interface module 2820. The substrate support 2820E may move in the direction of arrow 2899 to lift the substrate off of end 3650. The transport cart 3670 may move to place the end 3651 of the double ended substrate holder 3030S2 over the substrate support 2820E and the substrate support may move in the direction of arrow 2899 for placing the substrate on the end 2651 so that the substrate can be placed at end 2800E2 of the vacuum tunnel 2800'.

As can also be seen in FIGS. 36A-36C, and as described above, the vacuum tunnels 2800', 3600 may be stacked one above the other. In this aspect the load lock 3610 may include at least one indexer 3620A, 3620B that is configured to move in the direction of arrow 3899 for transferring the substrates between the different transport planes of the vacuum tunnels 2800', 3600. The indexer 3620A, 3620B may be configured such that the substrate holders of the transport carts travelling within the vacuum tunnels can pick and place substrates to the indexer (where the indexer lifts and lowers the substrates on off and on the substrate holders). The indexers 3620A, 3620B may also provide rotation of the substrates to, for example, aligning the substrates in a manner substantially similar to that described above with respect to interface module 2820. In one aspect one of the stacked vacuum tunnels 3600 may be an "express" tunnel that provides substantially non-stop travel between two locations of the processing apparatus without stopping at possible intermediate destinations while other ones of the vacuum tunnels 2800' may provide for stops at the two locations as well as the intermediate destination.

In accordance with one or more aspects of the disclosed embodiment a transfer apparatus is provided for transporting substrates in a transfer chamber having a first end and a second end and two sides extending between the ends, each side having at least two linearly arranged substrate holding stations and each end having at least one substrate holding station. The transfer apparatus includes a drive section, at least one base arm fixed at one end with respect to the transfer chamber and including at least one arm link rotatably coupled to the drive section and at least one transfer arm rotatably coupled to a common end of the base arm where the at least one transfer arm has two end effectors. The drive section has motors with three independent axes of rotation defining three degrees of freedom. One degree of freedom of the drive section moves the at least one base arm horizontally for transporting the at least one transfer arm within the transfer chamber and two degrees of freedom of the drive section drives the at least one transfer arm to extend the at least one transfer arm, retract the at least one transfer arm and swap the two end effectors.

In accordance with one or more aspects of the disclosed embodiment the transfer apparatus is configured to transfer substrates between the at least two linearly arranged substrate holding stations on each side of the transfer chamber and to the at least one substrate holding station located on each of the first and second ends of the transfer chamber.

In accordance with one or more aspects of the disclosed embodiment the at least one substrate holding station located between one or more of the first and second ends of the transfer chamber includes three inline load locks or four inline load locks.

In accordance with one or more aspects of the disclosed embodiments the transfer apparatus is configured to handle 450 mm diameter wafers.

In accordance with one or more aspects of the disclosed embodiments the transfer apparatus is configured to handle 200 mm diameter wafers, 300 mm diameter wafers, or flat panels for flat panel displays, light emitting diodes, organic light emitting diodes or solar arrays.

In accordance with one or more aspects of the disclosed embodiment the drive section includes a coaxial drive shaft arrangement.

In accordance with one or more aspects of the disclosed embodiment the drive section includes a z-axis drive configured to linearly move the at least one transfer arm in a direction substantially perpendicular to an axis of extension and retraction of the at least one transfer arm.

In accordance with one or more aspects of the disclosed embodiment the at least one base arm includes at least one arm link rotatably mounted at one end to the drive section at a drive axis and the at least one transfer arm is rotatably mounted to a second opposite end of the at least one arm link at a shoulder axis.

In accordance with one or more aspects of the disclosed embodiment, the drive section includes a one degree of freedom drive disposed at the drive axis and a two degree of freedom drive disposed at the shoulder axis.

In accordance with one or more aspects of aspects of the disclosed embodiment the one degree of freedom drive comprises a harmonic drive.

In accordance with one or more aspects of the disclosed embodiment the two degree of freedom drive comprises a coaxial drive having an inner and outer drive shaft, wherein the outer drive shaft is rotatable independent of the inner drive shaft and supported by support bearings of the inner drive shaft.

In accordance with one or more aspects of the disclosed embodiment the at least one base arm includes an upper arm link having first and second ends, and a forearm link having first and second ends, the upper arm link being rotatably mounted to the drive section at the first end about a drive axis and the forearm link being rotatably mounted at a first end to the second end of the upper arm link. The at least one transfer arm being rotatably mounted to the second end of the forearm link at a shoulder axis of rotation. In a further aspect of the disclosed embodiment the forearm link is slaved to the drive section so that the shoulder axis of rotation is substantially constrained to follow a substantially linear path. One or more of the upper arm link and forearm link includes at least one interchangeable spacer section configured to be interchangeable with other removable spacer sections for allowing a length of a respective one of the upper arm link and forearm link to be scaled. In another aspect of the disclosed embodiment the drive section includes a motor disposed at the second end of the upper arm link for driving rotation of the forearm. In still another aspect of the disclosed embodiment, the base arm includes an upper arm link having a first and second ends, a forearm link having a first and second ends, and a wrist having a first and second ends, the upper arm link being rotatably mounted to the drive section at the first end about the drive axis, the forearm link being rotatably mounted at the first end to the second end of the upper arm link and the wrist being rotatably mounted at the first end to the second end of the forearm link.

In accordance with one or more aspects of the disclosed embodiment a transfer apparatus is provided for transporting substrates in a transfer chamber having a first end and a second end and two sides extending between the ends, each side having at least two linearly arranged substrate holding stations. The transfer apparatus includes a drive section, at least one base arm fixed at one end with respect to the transfer chamber and including at least one arm link rotatably coupled to the drive section and at least one transfer arm rotatably coupled to the base arm where the at least one transfer arm has two end effectors. The drive section has motors with three independent axes of rotation defining three degrees of freedom. One degree of freedom of the drive section moves the at least one base arm horizontally for transporting the transfer arm within the transfer chamber and two degrees of freedom of the drive section drives the at least one transfer arm to extend the at least one transfer arm, retract the at least one transfer arm and swap the two end effectors.

In accordance with one or more aspects of the disclosed embodiment the transfer apparatus is configured to transfer substrates between the at least two linearly arranged substrate holding stations on each side of the transfer chamber.

In accordance with one or more aspects of the disclosed embodiment the transfer chamber includes three inline load locks or four inline load locks located at one or more of the first and second ends of the transfer chamber and the transfer apparatus is configured to transfer substrates to and from the three inline load locks or four inline load locks.

In accordance with one or more aspects of the disclosed embodiments the transfer apparatus is configured to handle 450 mm diameter wafers.

In accordance with one or more aspects of the disclosed embodiments the transfer apparatus is configured to handle 200 mm diameter wafers, 300 mm diameter wafers, or flat panels for flat panel displays, light emitting diodes, organic light emitting diodes or solar arrays.

In accordance with one or more aspects of the disclosed embodiment a substrate processing apparatus is provided. The substrate processing apparatus includes at least one transfer chamber forming a substantially sealed environment and at least one transfer apparatus disposed at least partly within each of the at least one transfer chamber. The at least one transfer apparatus includes a drive section, a base arm fixed at one end with respect to the transfer chamber and including at least one arm link rotatably coupled to the drive section and at least one transfer arm rotatably coupled to a common end of the base arm, where the at least one transfer arm has two end effectors. The drive section has motors with three independent axes of rotation defining three degrees of freedom. One degree of freedom of the drive section moves the base arm for transporting the at least one transfer arm horizontally within the transfer chamber and two degrees of freedom of the drive section drives the at least one transfer arm to extend the at least one transfer arm, retract the at least one transfer arm, and swap the two end effectors.

In accordance with one or more aspects of the disclosed embodiment, each of the at least one transfer chamber has a first end and a second end and two sides extending between the ends, each side having at least two linearly arranged substrate holding stations and each end having at least one substrate holding station and the transfer apparatus is configured to transfer substrates between the at least two linearly arranged substrate holding stations on each side of the transfer chamber and to the at least one substrate holding station located on each of the first and second ends of the transfer chamber.

In accordance with one or more aspects of the disclosed embodiment the at least one substrate holding station located one or more of the first and second ends of the transfer chamber includes three inline load locks or four inline load locks.

In accordance with one or more aspects of the disclosed embodiments the substrate processing apparatus is configured to handle 450 mm diameter wafers.

In accordance with one or more aspects of the disclosed embodiments the substrate processing apparatus is configured to handle 200 mm diameter wafers, 300 mm diameter wafers, or flat panels for flat panel displays, light emitting diodes, organic light emitting diodes or solar arrays.

In accordance with one or more aspects of the disclosed embodiment the at least one transfer chamber has a clustered configuration. In a further aspect the clustered configuration is a dual cluster transfer chamber configuration or a triple cluster transfer chamber configuration.

In accordance with one or more aspects of the disclosed embodiment at least one end of the at least one transfer chamber includes an equipment front end module for inserting or removing substrates from the substrate processing apparatus.

In accordance with one or more aspects of the disclosed embodiment the at least one transfer chamber includes at least two linearly elongated transfer chambers communicably coupled to each other to form a combined linearly elongated transfer chamber. In a further aspect at least one end of the combined linearly elongated transfer chamber includes an equipment front end module for inserting or removing substrates from the substrate processing apparatus.

In accordance with one or more aspects of the disclosed embodiment the drive section includes a coaxial drive shaft arrangement.

In accordance with one or more aspects of the disclosed embodiment the base arm includes at least one arm link rotatably mounted at one end to the drive section at a drive axis and the at least one transfer arm is rotatably mounted to a second opposite end of the at least one arm link at a shoulder axis.

In accordance with one or more aspects of the disclosed embodiment, the drive section includes a one degree of freedom drive disposed at the drive axis and a two degree of freedom drive disposed at the shoulder axis.

In accordance with one or more aspects of aspects of the disclosed embodiment the one degree of freedom drive comprises a harmonic drive.

In accordance with one or more aspects of the disclosed embodiment the two degree of freedom drive comprises a coaxial drive having an inner and outer drive shaft, wherein the outer drive shaft is rotatable independent of the inner drive shaft and supported by support bearings of the inner drive shaft.

In accordance with one or more aspects of the disclosed embodiment the base arm includes an upper arm link having a first and second ends, and a forearm link having a first and second end, the upper arm link being rotatably mounted to the drive section at the first end about the drive axis and the forearm link being rotatably mounted at a first end to the second end of the upper arm link. The at least one transfer arm being rotatably mounted to the second end of the forearm link at the shoulder axis of rotation. In a further aspect of the disclosed embodiment the forearm link is slaved to the drive section so that the shoulder axis of rotation is substantially constrained to follow a substantially linear path along a length of the at least one linearly elongated transfer chamber. One or more of the upper arm link and forearm link includes at least one interchangeable spacer section configured to be interchangeable with other removable spacer sections for allowing a length of a respective one of the upper arm link and forearm link to be scaled. In another aspect of the disclosed embodiment the drive section includes a motor disposed at the second end of the upper arm link for driving rotation of the forearm. In still another aspect of the disclosed embodiment, the base arm includes an upper arm link having a first and second ends, a forearm link having a first and second ends, and a wrist having a first and second ends, the upper arm link being rotatably mounted to the drive section at the first end about the drive axis, the forearm link being rotatably mounted at the first end to the second end of the upper arm link and the wrist being rotatably mounted at the first end to the second end of the forearm link.

In accordance with one or more aspects of the disclosed embodiment a substrate processing apparatus is provided. The substrate processing apparatus includes at least one linearly elongated transfer chamber and a transfer apparatus disposed at least partly within the at least one linearly elongated transfer chamber. The transfer apparatus including a drive section having a drive system with three independent axes of rotation defining three degrees of freedom. A base arm section is rotatably coupled to the drive section and a transfer arm section is rotatably coupled to the base arm section. The transfer arm section having two end effectors. One degree of freedom of the drive section moves the base arm horizontally for transporting the transfer arm section and two degrees of freedom drive the transfer arm section to extend the transfer arm section, retract the transfer arm section, and swap the two end effectors.

In accordance with one or more aspects of the disclosed embodiments the substrate processing apparatus is configured to handle 450 mm diameter wafers.

In accordance with one or more aspects of the disclosed embodiments the substrate processing apparatus is configured to handle 200 mm diameter wafers, 300 mm diameter wafers, or flat panels for flat panel displays, light emitting diodes, organic light emitting diodes or solar arrays.

In accordance with one or more aspects of the disclosed embodiment a substrate transport apparatus is provided. The substrate transport apparatus includes a drive section with three independent axes of rotation defining three degrees of freedom, a base arm connected to the drive section and a transfer arm having two end effectors where the transfer arm is rotatably mounted to the base arm. One degree of freedom of the drive section moves the base arm horizontally for transporting the transfer arm. A motor of the drive section having two degrees of freedom is configured for removable coupling to the base arm as a unit where when coupled to the base arm the transfer arm is coupled to the motor of the drive section having two degrees of freedom.

In accordance with one or more aspects of the disclosed embodiments the substrate transport apparatus is configured to handle 450 mm diameter wafers.

In accordance with one or more aspects of the disclosed embodiments the substrate transport apparatus is configured to handle 200 mm diameter wafers, 300 mm diameter wafers, or flat panels for flat panel displays, light emitting diodes, organic light emitting diodes or solar arrays.

In accordance with one or more aspects of the disclosed embodiment the motor of the drive section having two degrees of freedom comprises a coaxial drive having an inner and outer drive shaft, wherein the outer drive shaft is rotatable independent of the inner drive shaft and supported by support bearings of the inner drive shaft.

In accordance with one or more aspects of the disclosed embodiment a substrate processing tool is provided. The substrate processing tool includes a polygonal transfer chamber and at least two substrate holding stations disposed on each side of the transfer chamber. At least two substrate transport apparatus are disposed at least partly within the transport chamber. Each of the at least two substrate transport apparatus including a base arm rotatably mounted within the transport chamber at a drive axis and at least one transfer arm having two end effectors rotatably mounted on the base arm. Each base arm being independently rotatable about the drive axis and the at least one transfer arm being independently rotatable relative to a respective base arm so that an axis of extension and retraction of each transfer arm is capable of transferring substrates between the transfer arm and any of the substrate holding stations.

In accordance with one or more aspects of the disclosed embodiments the substrate processing tool is configured to handle 450 mm diameter wafers.

In accordance with one or more aspects of the disclosed embodiments the substrate processing tool is configured to handle 200 mm diameter wafers, 300 mm diameter wafers, or flat panels for flat panel displays, light emitting diodes, organic light emitting diodes or solar arrays.

In accordance with one or more aspects of the disclosed embodiment each substrate transport apparatus includes a one degree of freedom drive motor configured to rotatably drive the base arm and a two degree of freedom drive motor configured to effect rotation, extension and retraction of the at least one transfer arm independent of the base arm.

In accordance with one or more aspects of the disclosed embodiment a substrate processing apparatus is provided. The substrate processing apparatus includes a composite transfer chamber including a grid formed of a two-dimensional array of interconnected transfer chamber modules where each transfer chamber module is selectively sealable from other ones of the transfer chamber modules. One or more substrate holding stations are communicably coupled to each of the transfer chamber modules. Each transfer chamber module including a transfer arm disposed therein for transporting substrates between the transfer chamber modules and substrate holding stations communicably coupled to the composite transfer chamber.

In accordance with one or more aspects of the disclosed embodiment the two dimensional array of interconnected transfer chamber modules comprises at least a two-by-two array of transfer chamber modules.

In accordance with one or more aspects of the disclosed embodiment the substrate processing apparatus includes multiple horizontal levels of substrate holding stations.

In accordance with one or more aspects of the disclosed embodiment a substrate processing tool is provided. The substrate processing tool includes a polygonal transfer chamber and at least two substrate holding stations disposed on each side of the transfer chamber. At least one substrate transport apparatus are disposed at least partly within the transport chamber. Each of the at least one substrate transport apparatus including a hub spacer link, the hub spacer link being coupled to a hub mounted within the transport chamber at a drive axis and at least one transfer arm is rotatably mounted on the hub spacer link. The hub being rotatably indexable so that an axis of extension and retraction of each transfer arm is capable of transferring substrates between the transfer arm and any of the substrate holding stations. A motor module is disposed at an end of each hub spacer link opposite the hub for driving the at least one transfer arm.

In accordance with one or more aspects of the disclosed embodiment a substrate processing apparatus is provided. The substrate processing apparatus includes a composite transfer chamber having at least a first and second transfer chamber modules disposed side by side and communicably coupled to each other and a third transfer chamber module extending alongside the first and second transfer chamber modules, the third transfer chamber module being communicably coupled to both the first and second transfer chamber modules. At least one substrate holding station is communicably coupled to each of the first, second and third transfer chamber modules. Each of the first, second and third transfer chamber modules having at least one transfer arm disposed therein for transporting substrates between the at least one substrate holding station and the first second and third transfer chamber modules.

In accordance with one or more aspects of the disclosed embodiment the third transfer chamber module includes a drive section and at least one base arm fixed at one end with respect to the third transfer chamber and including at least one arm link rotatably coupled to the drive section. The at least one transfer arm of the third transfer chamber module being rotatably coupled to a common end of the base arm where the at least one transfer arm has two end effectors. The drive section has motors with three independent axes of rotation defining three degrees of freedom. One degree of freedom of the drive section moves the at least one base arm horizontally for transporting the at least one transfer arm within the third transfer chamber module and two degrees of freedom of the drive section drives the at least one transfer arm to extend the at least one transfer arm, retract the at least one transfer arm and swap the two end effectors.

In accordance with one or more aspects of the disclosed embodiment, a substrate processing apparatus is provided. The substrate processing apparatus includes a transport tunnel and an automation module communicably coupled to the transport tunnel. The automation module includes a first end and a second end and two sides extending between the ends, each side having at least two connection ports and at least one of the ends being coupled to the transport tunnel where the at least two connection ports of at least one side of the automation module is configured for connection to a cluster tool module. The automation module further includes a transfer apparatus having a drive section, at least one base arm fixed at one end with respect to the transfer chamber and including at least one arm link rotatably coupled to the drive section and at least one transfer arm rotatably coupled to a common end of the base arm where the at least one transfer arm has at least one end effector.

In accordance with one or more aspects of the disclosed embodiment, the at least one transfer arm includes two end effectors and the drive section has motors with three independent axes of rotation defining three degrees of freedom. One degree of freedom of the drive section moves the at least one base arm horizontally for transporting the at least one transfer arm within the transfer chamber and two degrees of freedom of the drive section drives the at least one transfer arm to extend the at least one transfer arm, retract the at least one transfer arm and swap the two end effectors.

In accordance with one or more aspects of the disclosed embodiment a substrate processing apparatus is provided. The substrate processing apparatus includes a transport tunnel and at least one module coupled to the transport tunnel. The transport tunnel includes at least one transport cart configured to travel between longitudinal ends of the transport tunnel where the at least one transport cart includes a substantially rigid substrate holder stationarilly mounted to the transport cart. The substantially rigid substrate holder is configured to extend beyond at least one of the longitudinal ends of the transport tunnel when the transport cart is disposed adjacent to the at least one of the longitudinal ends for transferring substrates between the transport cart and the at least one module.

In accordance with one or more aspects of the disclosed embodiment the substrate processing apparatus further includes an automation module having a first end and a second end and two sides extending between the ends, each side having at least two connection ports and at least one of the ends being coupled to the transport tunnel. The automation module further includes a transfer apparatus having a drive section, at least one base arm fixed at one end with respect to the transfer chamber and including at least one arm link rotatably coupled to the drive section and at least one transfer arm rotatably coupled to a common end of the base arm where the at least one transfer arm has at least one end effector. The transfer apparatus being configured to extend through the at least two connection ports on each side and beyond at least one of the first and second end. The automation module being communicably connected to the transport tunnel at one of the first and second end.

In accordance with one or more aspects of the disclosed embodiment the substrate processing apparatus includes a processing tool module coupled to the two connection ports on at least one of the sides of the automation module.

In accordance with one or more aspects of the disclosed embodiment the substrate processing apparatus includes an equipment front end module (EFEM) where the transport tunnel communicably connects the equipment front end module and the automation module.

In accordance with one or more aspects of the disclosed embodiment the substrate processing apparatus incudes a second transport tunnel communicably connected to the other one of the first and second end of the automation module and connecting the automation module with another automation module.

In accordance with one or more aspects of the disclosed embodiment the transport tunnel includes one or more tunnel modules.

In accordance with one or more aspects of the disclosed embodiment at least one of the one or more tunnel modules is sealable from other ones of the one or more tunnel modules.

In accordance with one or more aspects of the disclosed embodiment a substrate processing apparatus is provided. The substrate processing apparatus includes an automation module and a connecting module communicably connected to the automation module where the automation module includes a first end and a second end and two sides extending between the ends, each side having at least two connection ports and at least one of the ends being coupled to the connecting module. The automation module further includes a transfer apparatus having a drive section, at least one base arm fixed at one end with respect to the transfer chamber and including at least one arm link rotatably coupled to the drive section and at least one transfer arm rotatably coupled to a common end of the base arm where the at least one transfer arm has at least one end effector. The transfer apparatus being configured to extend through the at least two connection ports on each side and beyond at least one of the first and second end.

In accordance with one or more aspects of the disclosed embodiment the at least two connection ports of at least one side of the automation module are configured for connection to a cluster tool module.

In accordance with one or more aspects of the disclosed embodiment the substrate processing apparatus includes an equipment front end module where the connecting module communicably connects the equipment front end module to the automation module.

In accordance with one or more aspects of the disclosed embodiment the connecting module comprises one or more of a vacuum module and a transport tunnel.

In accordance with one or more aspects of the disclosed embodiment the connecting module comprises a transport tunnel having at least one transport cart disposed therein and configured to travel between longitudinal ends of the transport tunnel.

In accordance with one or more aspects of the disclosed embodiment the substrate processing apparatus includes a processing tool module coupled to the two connection ports on at least one of the sides of the automation module.

In accordance with one or more aspects of the disclosed embodiment the transfer apparatus of the automation module is configured to transport a substrate from the connecting module through every one of the ports located on the sides of the automation module with substantially a single touching of the substrate.

In accordance with one or more aspects of the disclosed embodiment a substrate processing apparatus is provided. The substrate processing apparatus includes a housing forming a chamber capable of holding a sealed environment therein and having substrate port openings through which substrates are transported in and out of the chamber. The housing having sides that define a mating interface for mating with a side of a process tool assembly. At least one side of the housing having more than one of the substrate transport openings in common with substrate transport openings in a side of the process tool assembly mated to the mating interface at the substrate transport openings and defining an equipment boundary between the housing and the process tool assembly, wherein different processing tool assemblies having different predetermined characteristics are interchangeably mateable to the mating interface of the housing.

In accordance with one or more aspects of the disclosed embodiment the substrate processing apparatus includes a transport apparatus disposed at least partly within the housing. The transport apparatus includes a base link and at least one transport arm mounted on the base link operable to transport substrates through the substrate port openings into the process tool assembly for transfer of the substrate to a transfer apparatus of the process tool assembly.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances. Further, the mere fact that different features are recited in the mutually different dependent or independent claims does not indicate that a combination of these features cannot be advantageously used, such a combination remaining within the scope of the aspects of the invention.

What is claimed is:

1. A substrate processing apparatus comprising:
    at least one linearly elongated transfer chamber; and
    a transfer apparatus disposed at least partly within the at least one linearly elongated transfer chamber, the transfer apparatus including:
        a three axis drive section having motors with three independent axes of rotation defining but three degrees of freedom of drive section motion,
        a base arm section is rotatably coupled to the three axis drive section, and
        a transfer arm section is rotatably coupled to the base arm section, the transfer arm section having two end effectors,
        wherein, but one degree of freedom of drive section motion of the three axis drive section moves the base arm section horizontally for transporting the transfer arm section and two degrees of freedom of drive section motion drive the transfer arm section to extend the transfer arm section, retract the transfer arm section, and swap p the two end effectors so that the transfer arm section transports substrates to and from two or more substrate holding stations of at least two linearly arranged substrate holding stations of the at least one linearly elongated transfer chamber, the extension into and the retraction from a respective substrate holding station by the transfer arm section positioned at the respective substrate holding station is independent of movement of the base arm section, wherein the base arm section is alternatively configured as a two link articulated base arm, or a one unarticulated link base arm, each link of the base arm being different and distinct from each link of the transfer arm section, and the three independent axes of rotation defining the but three degrees of freedom of drive section motion is common to both alternative base arm configurations.

2. The substrate processing apparatus of claim 1, wherein the substrate processing apparatus is configured to handle 450 mm diameter wafers.

3. The substrate processing apparatus of claim 1, wherein the substrate processing apparatus is configured to handle 200 mm diameter wafers, 300 mm diameter wafers, or flat panels for flat panel displays, light emitting diodes, organic light emitting diodes or solar arrays.

4. A transfer apparatus for transporting substrates in a transfer chamber having a first end and a second end and two sides extending between the ends, each side having at least two linearly arranged substrate holding stations and each end having at least one substrate holding station, the transfer apparatus comprising:
    a three axis drive section;
    a base arm fixed at one end with respect to the transfer chamber and including at least one arm link rotatably coupled to the three axis drive section; and
    at least one transfer arm rotatably coupled to a second opposite end of the base arm, and the at least one transfer arm has two end effectors;
    wherein the three axis drive section has motors with three independent axes of rotation defining but three degrees of freedom of drive section motion, but one degree of freedom of drive section motion of the three axis drive section moves the base arm horizontally for transporting the at least one transfer arm within the transfer chamber and two degrees of freedom of drive section motion of the three axis drive section drives the at least one transfer arm to extend the at least one transfer arm, retract the at least one transfer arm, and swap the two end effectors so that the at least one transfer arm transports substrates to and from two or more substrate holding stations of the two sides, each having at least two linearly arranged substrate holding stations, and to and from the at least one substrate holding station, where the extension into and the retraction from a respective substrate holding station by the at least one transfer arm positioned at the respective substrate holding station is independent of movement of the base arm, and where the base arm is alternatively configured as a two link articulated base arm, or a one unarticulated link base arm, each link of the base arm being different and distinct from each link of the at least one transfer arm, and the three independent axes of rotation defining the but three degrees of freedom of drive section motion is common to both alternative base arm configurations.

5. The transfer apparatus of claim 4, wherein the at least one substrate holding station located between one or more of the first and second ends of the transfer chamber includes three load locks that are inline with each other on a same side of the transfer chamber or four load locks that are inline with each other on the same side of the transfer chamber.

6. The transfer apparatus of claim 4, wherein the transfer apparatus is configured to handle 450 mm diameter wafers.

7. The transfer apparatus of claim 4, wherein the transfer apparatus is configured to handle 200 mm diameter wafers, 300 mm diameter wafers, or flat panels for flat panel displays, light emitting diodes, organic light emitting diodes or solar arrays.

8. The transfer apparatus of claim 4, wherein the three axis drive section includes a coaxial drive shaft arrangement.

9. The transfer apparatus of claim 4, further comprising a z-axis drive configured to linearly move the at least one transfer arm in a direction substantially perpendicular to an axis of extension and retraction of the at least one transfer arm.

10. The transfer apparatus of claim 4, wherein the at least one arm link is rotatably mounted at the one end to the three axis drive section at a drive axis and the at least one transfer arm is rotatably mounted to the second opposite end of the at least one arm link at a shoulder axis.

11. The transfer apparatus of claim 10, wherein the three axis drive section includes a one degree of freedom drive disposed at the drive axis and a two degree of freedom drive disposed at the shoulder axis.

12. The transfer apparatus of claim 9, wherein the one degree of freedom drive comprises a harmonic drive.

13. The transfer apparatus of claim 11, wherein the two degree of freedom drive comprises a coaxial drive having an inner and outer drive shaft, wherein the outer drive shaft is rotatable independent of the inner drive shaft and supported by support bearings of the inner drive shaft.

14. The transfer apparatus of claim 4, wherein the at least one arm link includes an upper arm link having first and second ends, and a forearm link having first and second ends, the upper arm link being rotatably mounted to the three axis drive section at the first end about a drive axis and the forearm link being rotatably mounted at a first end to the second end of the upper arm link.

15. The transfer apparatus of claim 14, wherein the at least one transfer arm is rotatably mounted to the second end of the forearm link at a shoulder axis of rotation.

16. The transfer apparatus of claim 15, wherein the forearm link is slaved to the three axis drive section so that the shoulder axis of rotation is substantially constrained to follow a substantially linear path.

17. A substrate processing apparatus comprising:
at least one transfer chamber forming a substantially sealed environment; and
at least one transfer apparatus disposed at least partly within each of the at least one transfer chamber, the at least one transfer apparatus includes:
a three axis drive section,
a base arm fixed at one end with respect to the transfer chamber and including at least one arm link, the base arm having one end rotatably coupled to the three axis drive section, and
at least one transfer arm rotatably coupled to a second opposite end of the base arm, and the at least one transfer arm has two end effectors,
wherein, the three axis drive section has motors with three independent axes of rotation defining but three degrees of freedom of drive section motion, but one degree of freedom of drive section motion of the three axis drive section moves the base arm for transporting the at least one transfer arm horizontally within a respective transfer chamber and two degrees of freedom of drive section motion of the three axis drive section drives the at least one transfer arm to extend the at least one transfer arm, retract the at least one transfer arm, and swap the two end effectors so that the at least one transfer arm transports substrates to and from two or more substrate holding stations of at least two linearly arranged substrate holding stations of the respective transfer chamber, where the extension into and the retraction from a respective substrate holding station by the at least one transfer positioned at the respective substrate holding station is independent of movement of the base arm, and where the base arm is alternatively configured as a two link articulated base arm, or a one unarticulated link base arm, each link of the base arm being different and distinct from each link of the at least one transfer arm, and the three independent axes of rotation defining the but three degrees of freedom of drive section motion is common to both alternative base arm configurations.

18. The substrate processing apparatus of claim 17, wherein each of the at least one transfer chamber has a first end and a second end and two sides extending between the ends, each side having at least two linearly arranged substrate holding stations and each end having at least one substrate holding station and the transfer apparatus is configured to transfer substrates between the at least two linearly arranged substrate holding stations on each side of the transfer chamber and to the at least one substrate holding station located on each of the first and second ends of the transfer chamber.

19. The substrate processing apparatus of claim 18, wherein the at least one substrate holding station located one or more of the first and second ends of the transfer chamber includes three inline load locks or four inline load locks.

20. The substrate processing apparatus of claim 17, wherein the substrate processing apparatus is configured to handle 450 mm diameter wafers.

21. The substrate processing apparatus of claim 17, wherein the substrate processing apparatus is configured to handle 200 mm diameter wafers, 300 mm diameter wafers, or flat panels for flat panel displays, light emitting diodes, organic light emitting diodes or solar arrays.

22. The substrate processing apparatus of claim 17, wherein the at least one transfer chamber has a clustered configuration.

23. The substrate processing apparatus of claim 22, wherein the clustered configuration is a dual cluster transfer chamber configuration or a triple cluster transfer chamber configuration.

24. The substrate processing apparatus of claim 17, wherein at least one end of the at least one transfer chamber includes an equipment front end module for inserting or removing substrates from the substrate processing apparatus.

25. The substrate processing apparatus of claim 17, wherein the at least one transfer chamber includes at least two linearly elongated transfer chambers communicably coupled to each other to form a combined linearly elongated transfer chamber.

26. The substrate processing apparatus of claim 25, wherein at least one end of the combined linearly elongated transfer chamber includes an equipment front end module for inserting or removing substrates from the substrate processing apparatus.

27. The substrate processing apparatus of claim 17, wherein the three axis drive section includes a coaxial drive shaft arrangement.

28. The substrate processing apparatus of claim 17, wherein the at least one arm link of the base arm is rotatably mounted at the one end to the three axis drive section at a drive axis and the at least one transfer arm is rotatably mounted to the second opposite end of the at least one arm link at a shoulder axis of rotation.

29. The substrate processing apparatus of claim 17, wherein the three axis drive section includes a one degree of freedom drive disposed at the drive axis and a two degree of freedom drive disposed at a shoulder axis of rotation of the at least one transfer arm.

30. The substrate processing apparatus of claim 29, wherein the one degree of freedom drive comprises a harmonic drive.

31. The substrate processing apparatus of claim 29, wherein the two degree of freedom drive comprises a coaxial drive having an inner and outer drive shaft, wherein the outer drive shaft is rotatable independent of the inner drive shaft and supported by support bearings of the inner drive shaft.

32. The substrate processing apparatus of claim 17, wherein the at least one arm link of the base arm includes an upper arm link having a first and second ends, and a forearm link having a first and second end, the upper arm link being rotatably mounted to the three axis drive section at the first end about the drive axis and the forearm link being rotatably mounted at a first end to the second end of the upper arm link.

33. The substrate processing apparatus of claim 32, wherein the at least one transfer arm is rotatably mounted to the second end of the forearm link at a shoulder axis of rotation.

34. The substrate processing apparatus of claim 32, wherein the forearm link is slaved to the three axis drive section so that a shoulder axis of rotation of the at least one transfer arm is substantially constrained to follow a substantially linear path along a length of the at least one linearly elongated transfer chamber.

\* \* \* \* \*